(12) United States Patent
Saida et al.

(10) Patent No.: US 9,935,260 B2
(45) Date of Patent: Apr. 3, 2018

(54) MAGNETIC MEMORY DEVICE AND NONVOLATILE MEMORY APPARATUS

(71) Applicant: Kabushiki Kaisha Toshiba, Minato-ku (JP)

(72) Inventors: Daisuke Saida, Shinagawa (JP); Shogo Itai, Kawasaki (JP); Chikayoshi Kamata, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/265,080

(22) Filed: Sep. 14, 2016

(65) Prior Publication Data

US 2017/0279037 A1  Sep. 28, 2017

(30) Foreign Application Priority Data

Mar. 22, 2016 (JP) .................................. 2016-057563

(51) Int. Cl.
| | |
|---|---|
| *H01L 29/82* | (2006.01) |
| *H01L 43/08* | (2006.01) |
| *H01L 43/02* | (2006.01) |
| *G11C 11/16* | (2006.01) |
| *H01L 27/22* | (2006.01) |
| *H01L 43/10* | (2006.01) |

(52) U.S. Cl.
CPC ............ *H01L 43/08* (2013.01); *G11C 11/161* (2013.01); *G11C 11/1673* (2013.01); *G11C 11/1675* (2013.01); *H01L 27/228* (2013.01); *H01L 43/02* (2013.01); *H01L 43/10* (2013.01)

(58) Field of Classification Search
CPC ........ H01L 27/228; H01L 43/02; H01L 43/10
USPC ......................................... 257/421, 422, 427
See application file for complete search history.

(56) References Cited

U.S. PATENT DOCUMENTS

| | | | | |
|---|---|---|---|---|
| 6,927,468 | B2 * | 8/2005 | Yoda ...................... | G11C 11/16 257/295 |
| 7,298,596 | B2 * | 11/2007 | Hayashi ................. | B82Y 10/00 360/324.12 |
| 2009/0194832 | A1 | 8/2009 | Li | |
| 2010/0032777 | A1 | 2/2010 | Gao et al. | |
| 2013/0069185 | A1 | 3/2013 | Saida et al. | |
| 2014/0084402 | A1 | 3/2014 | Shimomura et al. | |
| 2014/0284736 | A1 | 9/2014 | Toko et al. | |

(Continued)

FOREIGN PATENT DOCUMENTS

| | | |
|---|---|---|
| JP | 2013-69820 A | 4/2013 |
| JP | 2014-67810 | 4/2014 |

(Continued)

*Primary Examiner* — Tan N Tran
(74) *Attorney, Agent, or Firm* — Oblon, McClelland, Maier & Neustadt, L.L.P.

(57) ABSTRACT

According to one embodiment, a magnetic memory device includes a first magnetic layer, a second magnetic layer, a third magnetic layer, and a first non-magnetic layer. The third magnetic layer is provided between a first part of the first magnetic layer and the second magnetic layer. The first non-magnetic layer is provided between the second magnetic layer and the third magnetic layer. The first magnetic layer further includes a second part. At least a portion of the second part overlaps at least a portion of the third magnetic layer in a second direction orthogonal to a first direction from the first part toward the second magnetic layer.

11 Claims, 29 Drawing Sheets

(56) References Cited

U.S. PATENT DOCUMENTS

| | | | |
|---|---|---|---|
| 2014/0339504 A1* | 11/2014 | Kim | ........................ H01L 43/12 257/16 |
| 2016/0197268 A1 | 7/2016 | Yakabe et al. | |
| 2016/0365508 A1 | 12/2016 | Saida et al. | |

FOREIGN PATENT DOCUMENTS

| | | |
|---|---|---|
| JP | 2014-179639 | 9/2014 |
| JP | 2014-179639 A | 9/2014 |
| JP | 2014-187169 | 10/2014 |
| JP | 2015-179694 A | 10/2015 |
| JP | 2015-185580 A | 10/2015 |

* cited by examiner

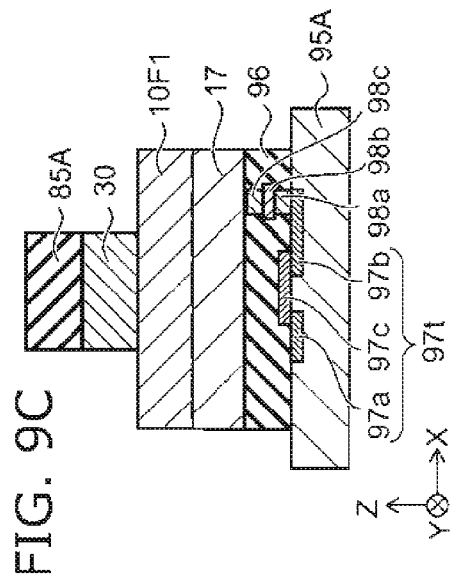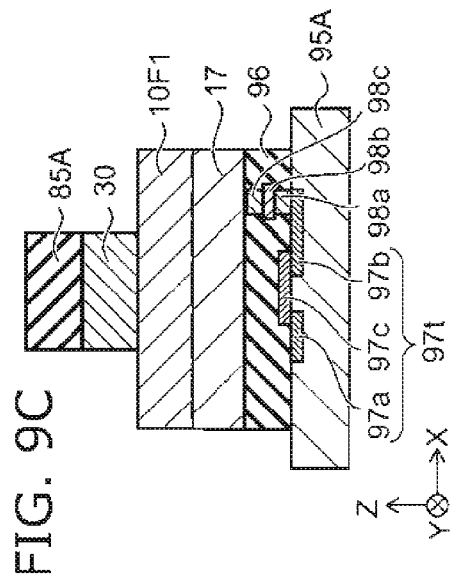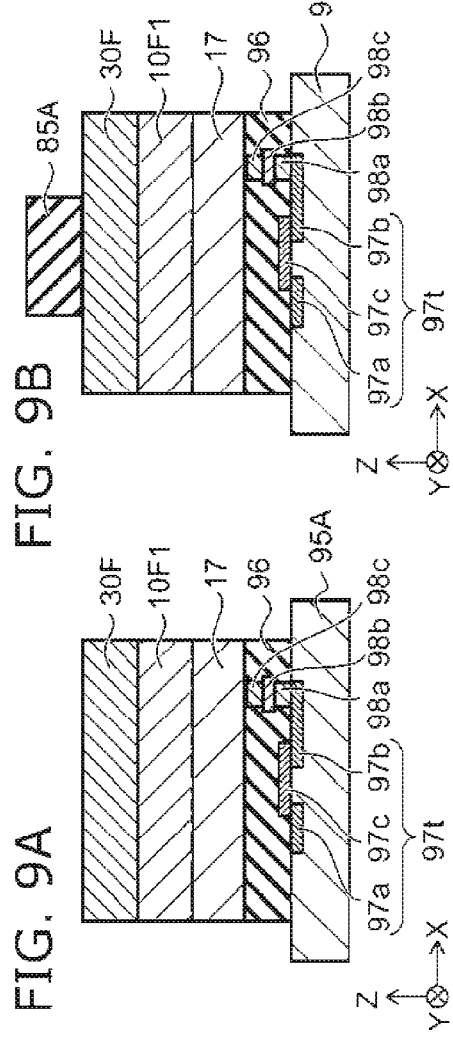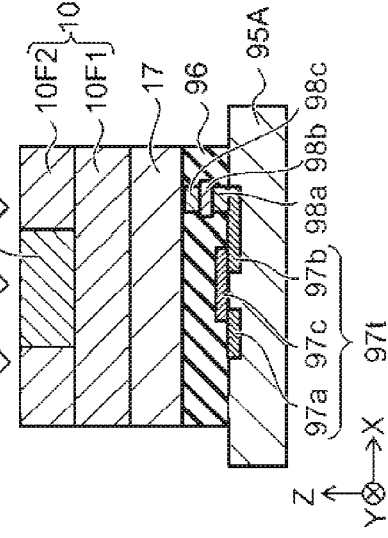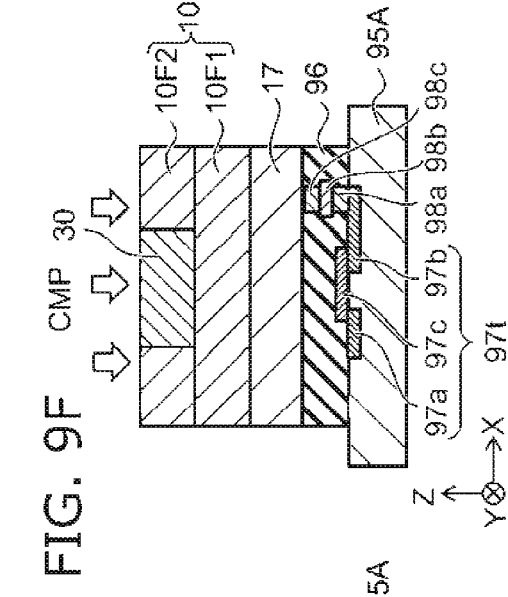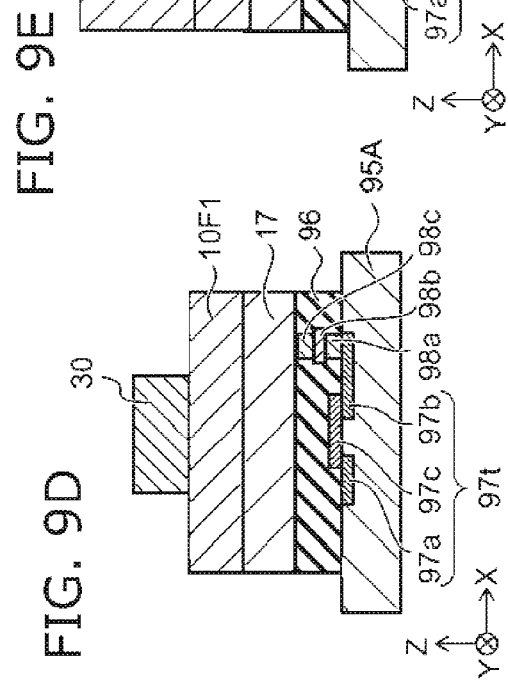

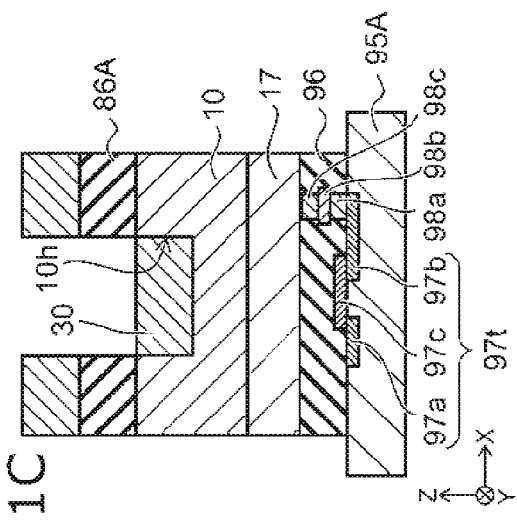
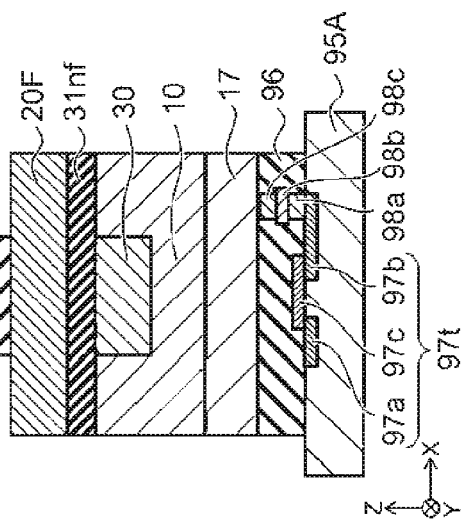
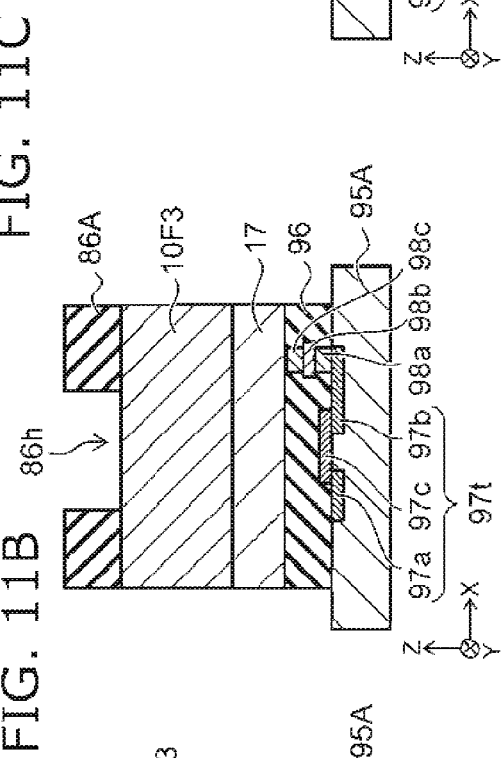
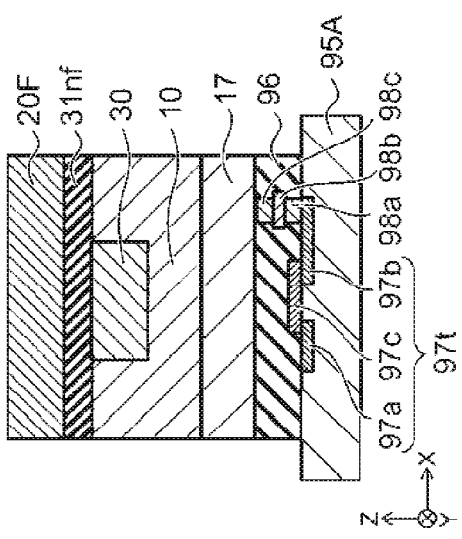
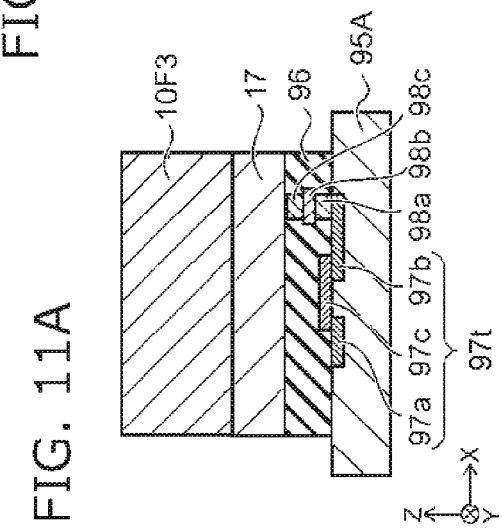
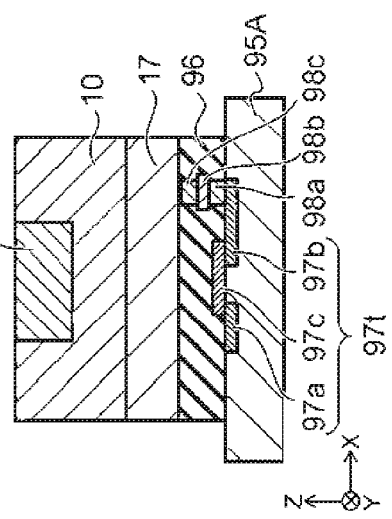

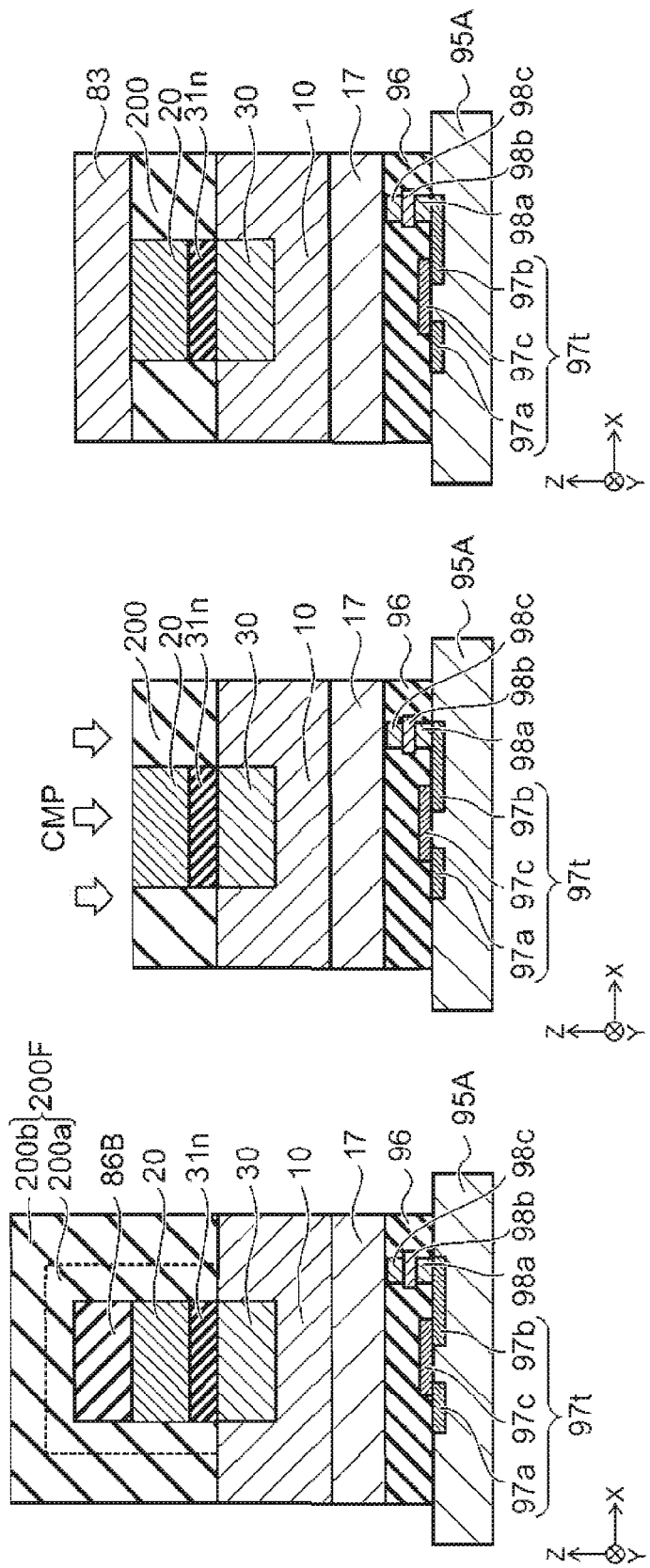

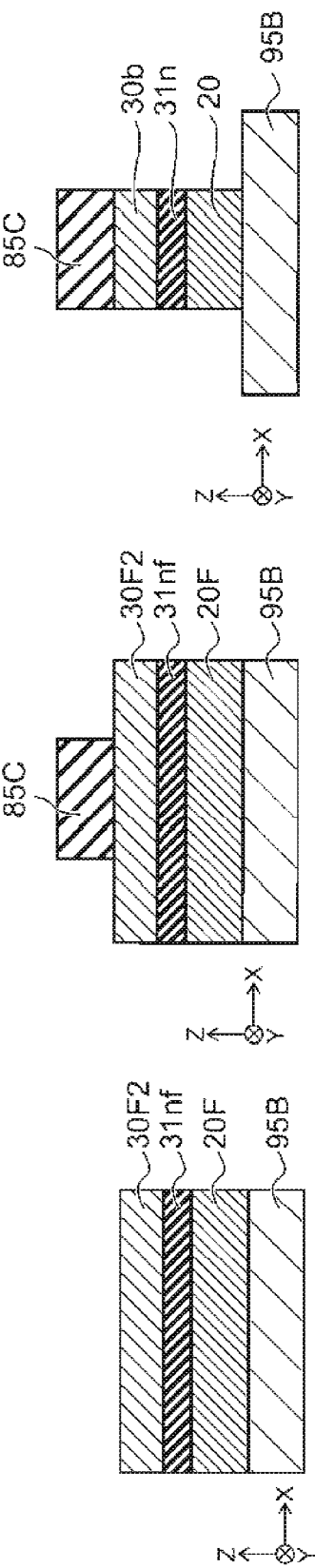
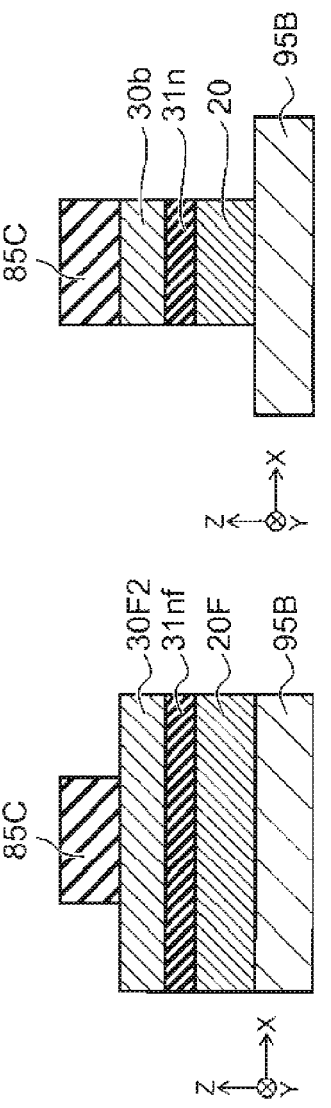
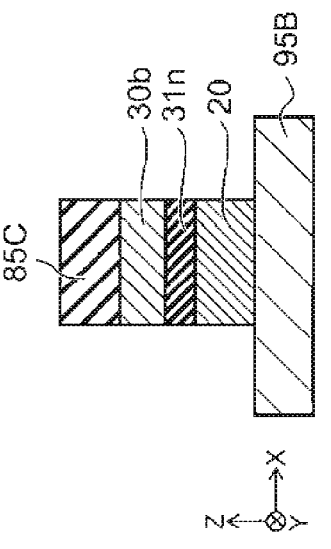
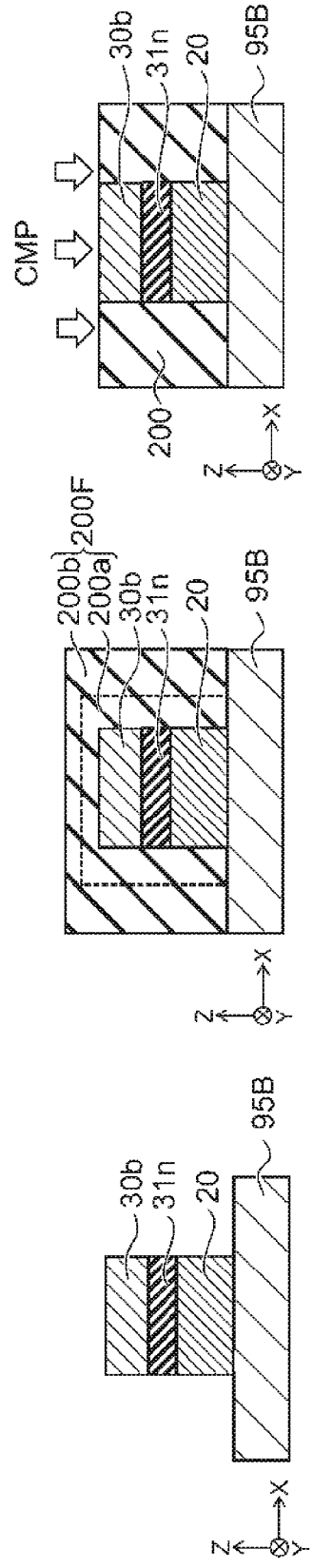
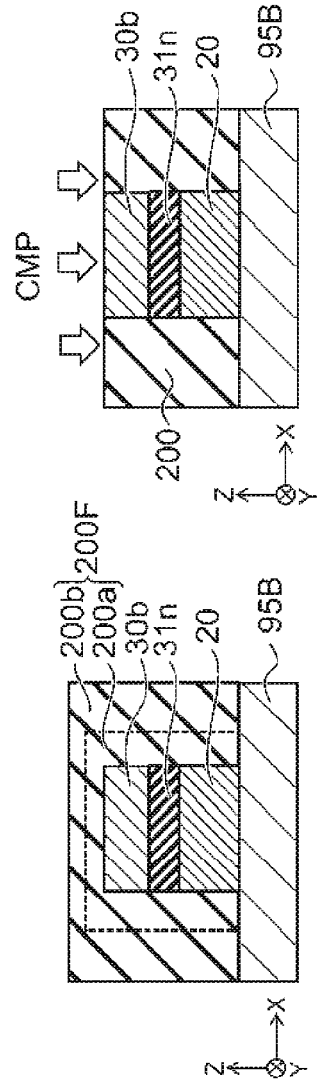
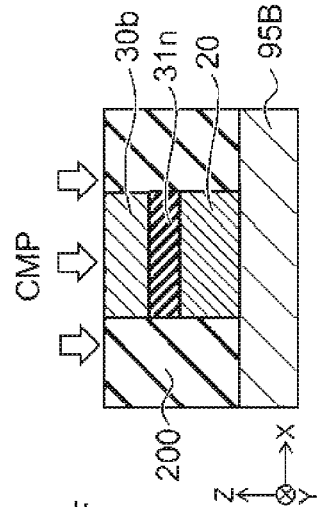

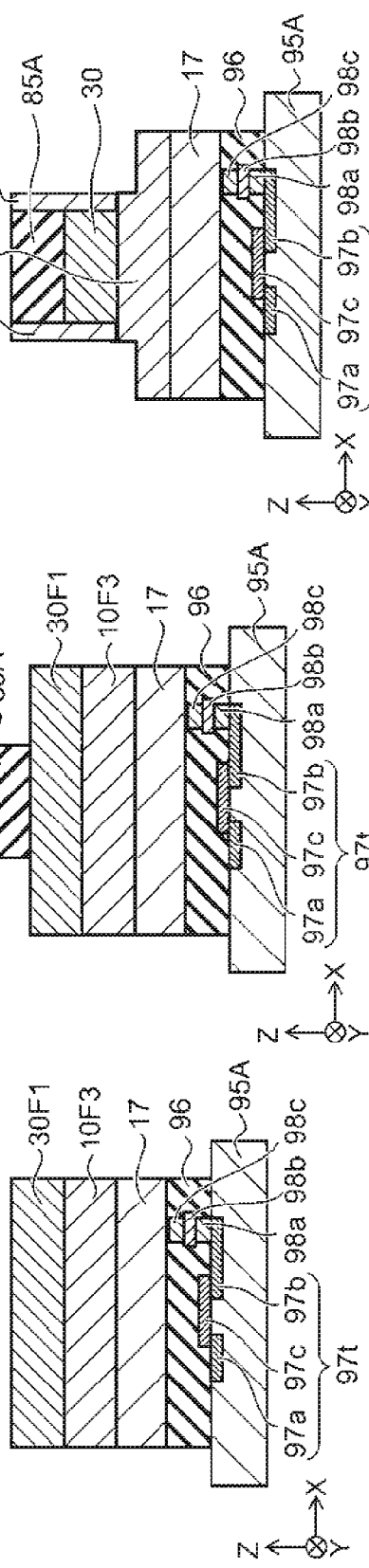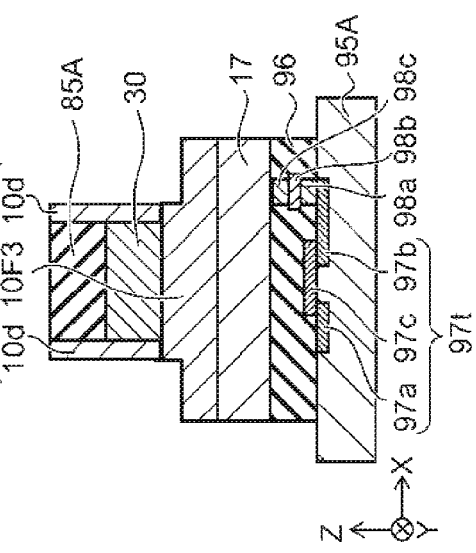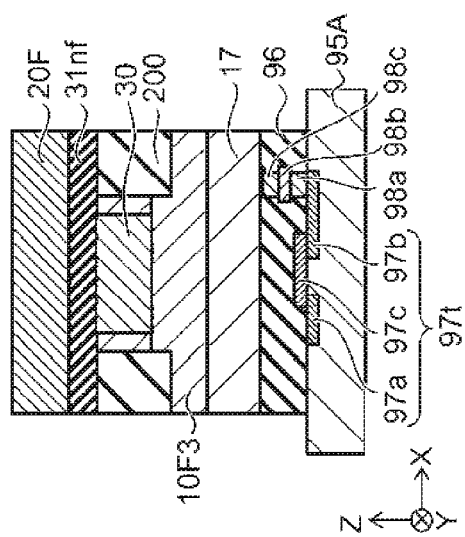

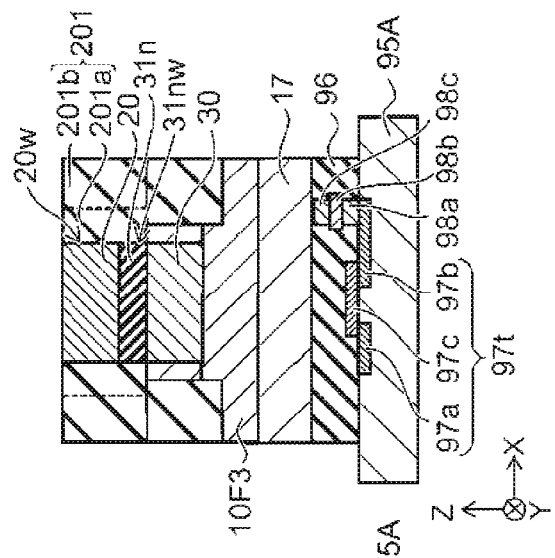
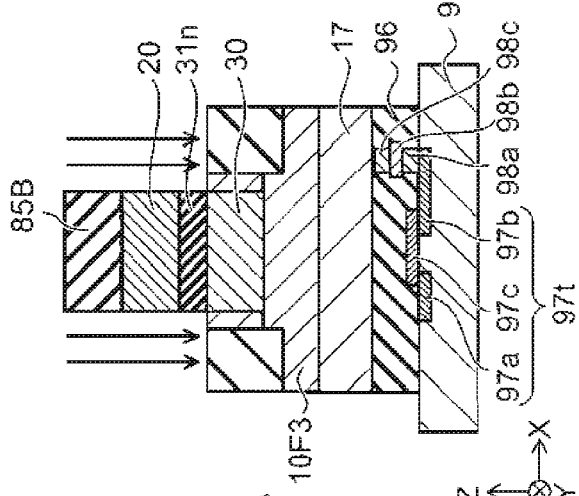
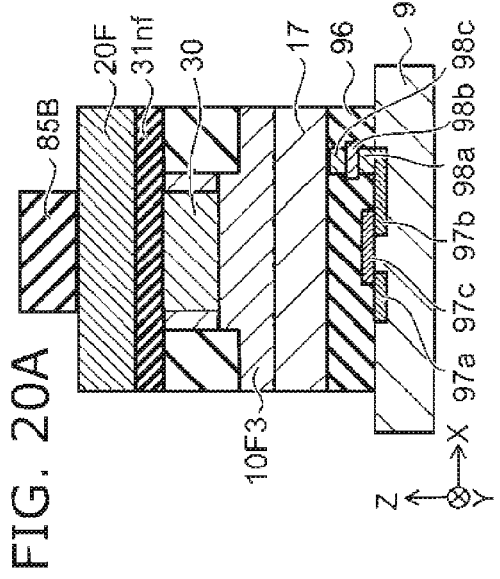
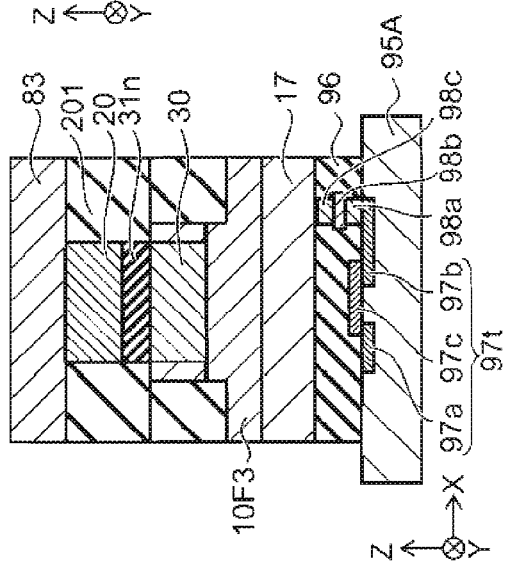

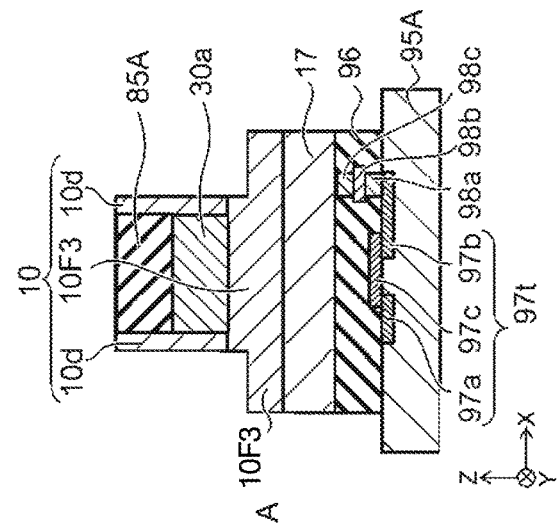
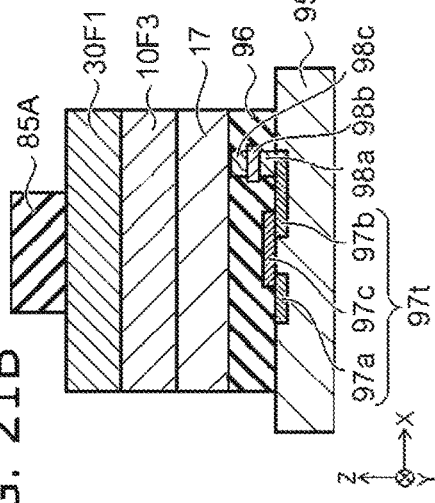
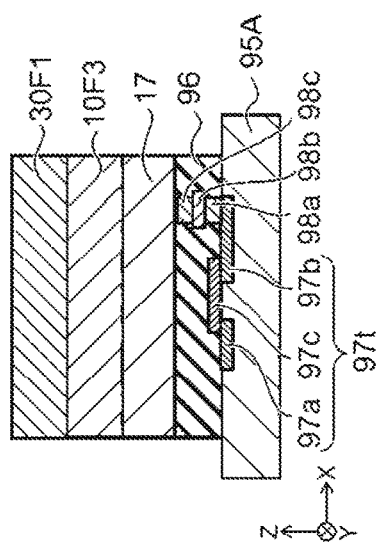
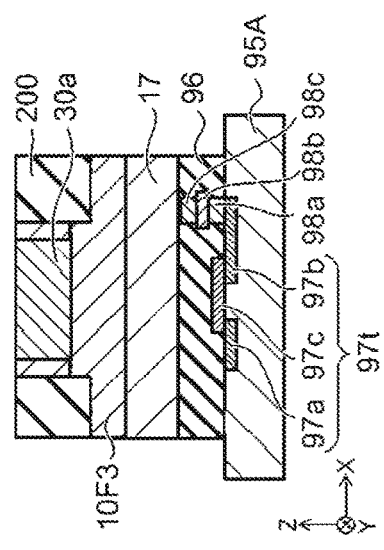
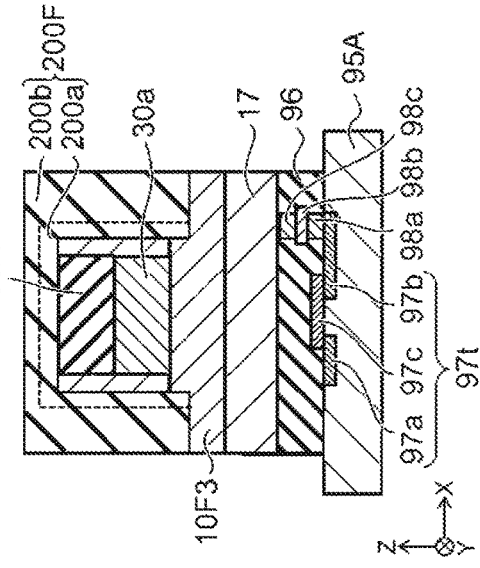

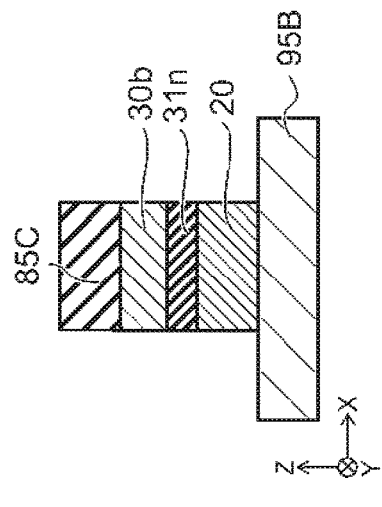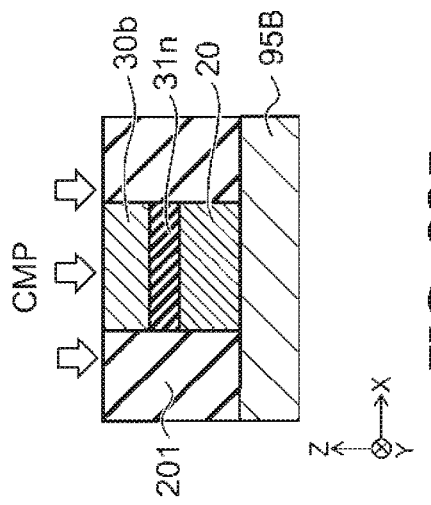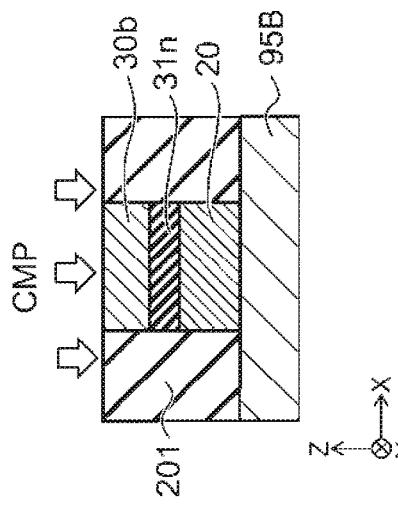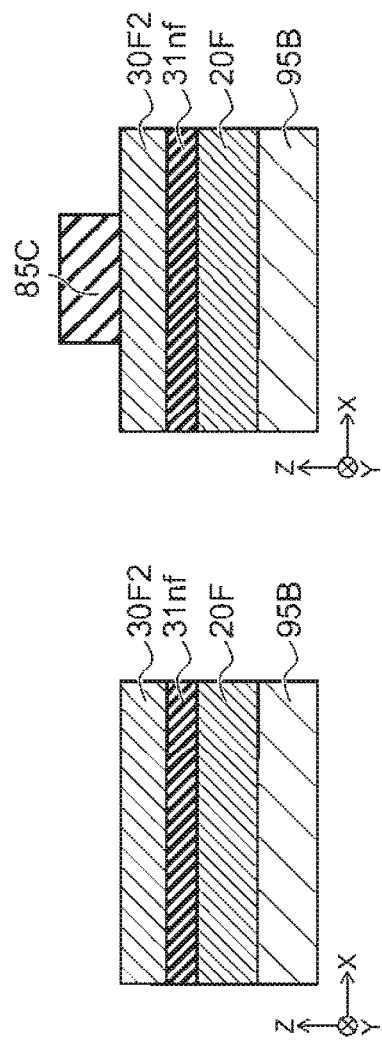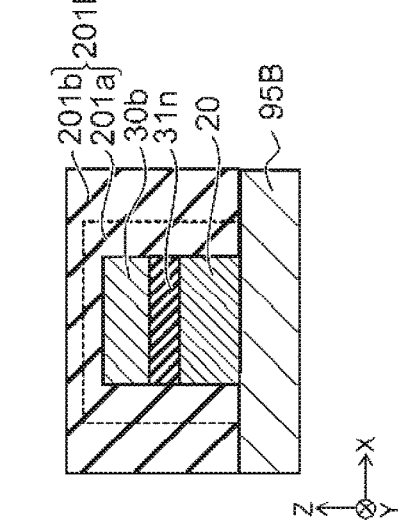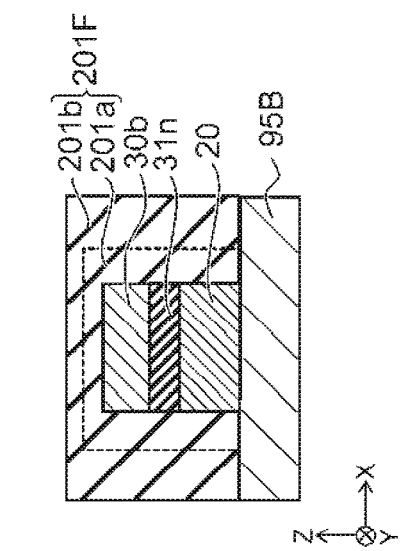

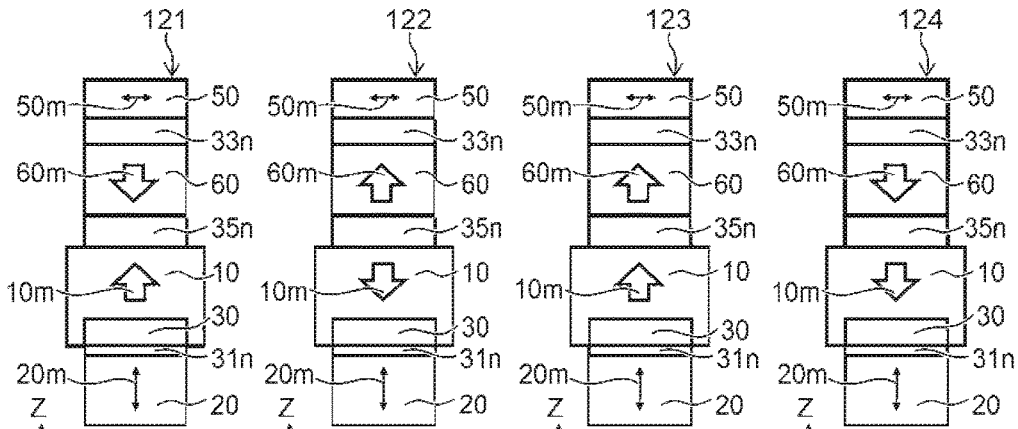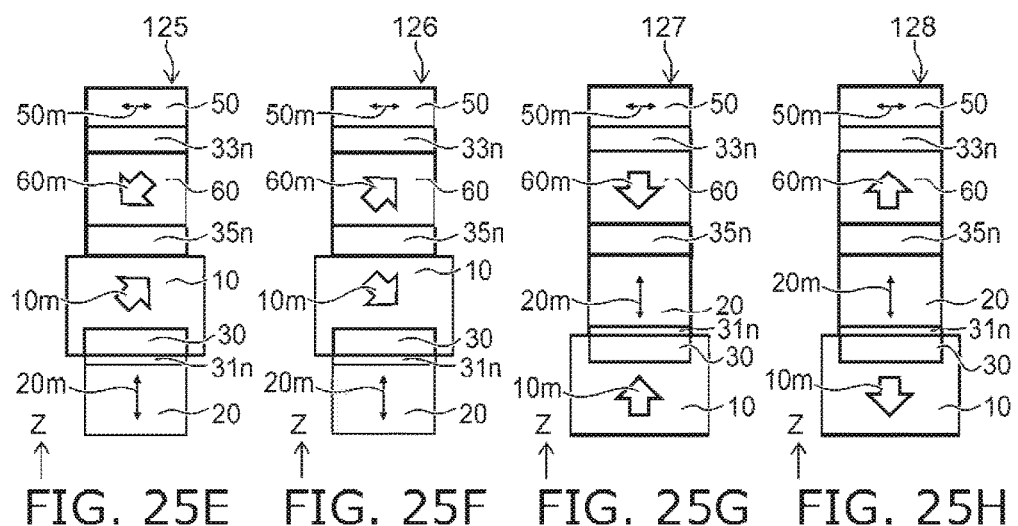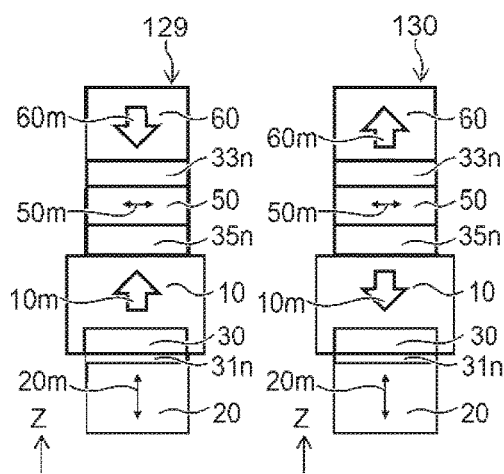

MAGNETIC MEMORY DEVICE AND NONVOLATILE MEMORY APPARATUS

CROSS-REFERENCE TO RELATED APPLICATIONS

This application is based upon and claims the benefit of priority from Japanese Patent Application No. 2016-057563, filed on Mar. 22, 2016; the entire contents of which are incorporated herein by reference.

FIELD

Embodiments described herein relate generally to a magnetic memory devices and a nonvolatile memory apparatus.

BACKGROUND

In a magnetic random access memory (MRAM), for example, a magnetic tunnel junction (MTJ) device is used as a data memory unit. In a magnetic memory device and a nonvolatile memory apparatus, improvement of reliability is desired.

BRIEF DESCRIPTION OF THE DRAWINGS

FIG. 9A to FIG. 9F are schematic sectional views illustrating the method of manufacturing the magnetic memory device according to the first embodiment;

FIG. 11A to FIG. 11F are schematic sectional views illustrating another method of manufacturing the magnetic memory device according to the first embodiment;

FIG. 12A to FIG. 12C are schematic sectional views illustrating another method of manufacturing the magnetic memory device according to the first embodiment;

FIG. 14A to FIG. 14F are schematic sectional views illustrating another method of manufacturing the magnetic memory device according to the first embodiment;

FIG. 19A to FIG. 19F are schematic sectional views illustrating another method of manufacturing the magnetic memory device according to the first embodiment;

FIG. 20A to FIG. 20D are schematic sectional views illustrating another method of manufacturing the magnetic memory device according to the first embodiment;

FIG. 21A to FIG. 21E are schematic sectional views illustrating another method of manufacturing the magnetic memory device according to the first embodiment;

FIG. 22A to FIG. 22F are schematic sectional views illustrating another method of manufacturing the magnetic memory device according to the first embodiment;

FIG. 25A to FIG. 25J are sectional views schematically illustrating the magnetic memory device according to the first embodiment;

DETAILED DESCRIPTION

Figure 1A:
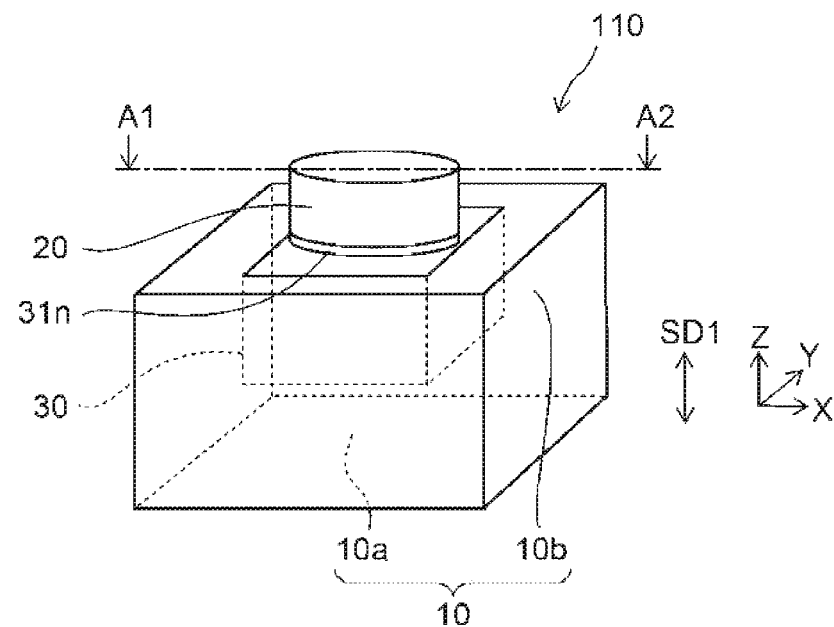
FIG. 1A and FIG. 1B are schematic views illustrating a magnetic memory device according to a first embodiment.

According to one embodiment, a magnetic memory device includes a first magnetic layer, a second magnetic layer, a third magnetic layer, and a first non-magnetic layer. The first magnetic layer includes a first part and a second part. The third magnetic layer is provided between the first part and the second magnetic layer. The first non-magnetic layer is provided between the second magnetic layer and the third magnetic layer. At least a portion of the second part overlaps at least a portion of the third magnetic layer in a second direction orthogonal to a first direction from the first part toward the second magnetic layer.

According to one embodiment, a magnetic memory device includes a first magnetic layer, a second magnetic layer, a third magnetic layer, and a first non-magnetic layer. The first magnetic layer includes a first part and a second part. The third magnetic layer is provided between the first part and the second magnetic layer. The first non-magnetic layer is provided between the second magnetic layer and the third magnetic layer. The second part faces the third magnetic layer in a second direction orthogonal to a first direction from the first part toward the second magnetic layer.

According to one embodiment, a nonvolatile memory apparatus includes a magnetic memory device and a control unit. The magnetic memory device includes a first magnetic layer including a first part and a second part, a second magnetic layer, a third magnetic layer provided between the first part and the second magnetic layer, and a first non-magnetic layer provided between the second magnetic layer and the third magnetic layer. At least a portion of the second part overlaps at least a portion of the third magnetic layer in a second direction orthogonal to a first direction from the first part toward the second magnetic layer. The control unit is electrically connected with the magnetic memory device.

Various embodiments will be described hereinafter with reference to the accompanying drawings.

The drawings are schematic or conceptual. The relationship between the thickness and the width of each portion, and the size ratio between the portions are not necessarily identical to those in reality. Furthermore, the same portion may be shown with different dimensions or ratios in different figures.

In the present specification and drawings, the same elements as those described previously with reference to earlier figures are labeled with like reference numerals, and the detailed description thereof is omitted as appropriate.

First Embodiment

Figure 1B:
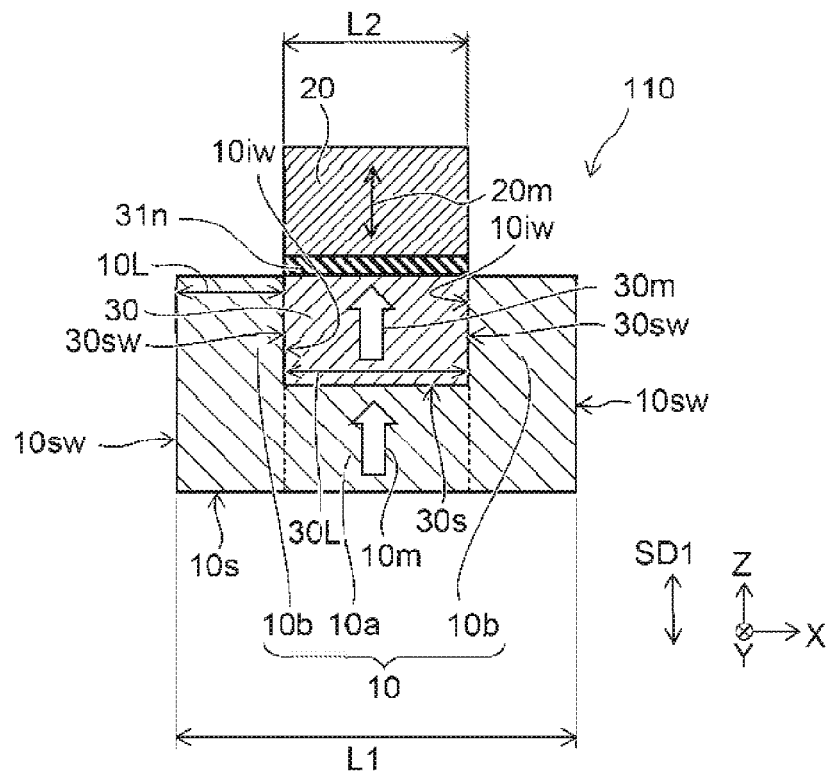

FIG. 1A and FIG. 1B are schematic views illustrating a magnetic memory device according to a first embodiment.

FIG. 1A is a perspective view. FIG. 1B is a sectional view taken along line IB-IB in FIG. 1A.

As illustrated in FIG. 1A, a magnetic memory device 110 includes a first magnetic layer 10, a second magnetic layer 20, a third magnetic layer 30, and a first non-magnetic layer 31n.

The third magnetic layer 30 is provided between a first part (a first part 10a) of the first magnetic layer 10 and the second magnetic layer 20. The first non-magnetic layer 31n is provided between the second magnetic layer 20 and the third magnetic layer 30. The first part 10a of the first magnetic layer 10 is positioned under the third magnetic layer 30, for example.

A direction toward the second magnetic layer 20 from the first part 10a of the first magnetic layer 10 is set as a first direction. The first direction corresponds to a stacking direction SD1 of the second magnetic layer 20, the third magnetic layer 30, and the first non-magnetic layer 31n.

In the specification of this application, the magnetic layers may be overlapped with each other in direct contact, or may be overlapped with each other by interposing other devices therebetween.

The first direction is set as a Z-axis direction. One direction perpendicular to the Z-axis direction is set as an X-axis direction. A direction perpendicular to the Z-axis direction and the X-axis direction is set as a Y-axis direction.

The first magnetic layer 10 further includes a second part 10b in addition to the first part 10a. At least a portion of the second part 10b overlaps at least a portion of the third magnetic layer 30 in a second direction orthogonal to the first direction. The second direction is one direction (any direction) on an X-Y plane. The above-described second part 10b may be overlapped at least a portion of the third magnetic layer 30 in a plurality of directions in the X-Y plane. In the example, the second part 10b of the first magnetic layer 10 is provided around the third magnetic layer 30. The second direction is, for example, an X-axis direction.

For example, in the example illustrated in FIG. 1A, at least a portion of the third magnetic layer 30 is embedded in the first magnetic layer 10. In the example in FIG. 1A, in the X-Y plane, the third magnetic layer 30 is surrounded by the second part 10b of the first magnetic layer 10.

As illustrated in FIG. 1B, the third magnetic layer 30 includes, for example, a side surface 30sw (external side surface). The side surface 30sw crosses the direction (the direction in the X-Y plane) perpendicular to the first direction (the Z-axis direction). The second part 10b of the first magnetic layer 10 includes an internal side surface (surface) 10iw. The internal side surface 10iw crosses the direction (the direction in the X-Y plane) perpendicular to the first direction (the Z-axis direction). The internal side surface 10iw of the first magnetic layer 10 faces a side surface 30sw of the third magnetic layer 30. Here, a phrase "the internal side surface 10iw faces the side surface 30sw" implies a state where the internal side surface 10iw and the side surface 30sw face each other without a member therebetween, and a state where a magnetic action is maintained between the first magnetic layer 10 and the third magnetic layer 30 even when a member is provided between the internal side surface 10iw and the side surface 30sw.

In the second direction, at least a portion of the internal side surface 10iw of the second part 10b overlaps at least a portion of the side surface 30sw. For example, in the second direction, the internal side surface 10iw of the second part 10b faces the side surface 30sw. The internal side surface 10iw of the second part 10b may be in contact with the side surface 30sw. The second part 10b is provided around at least a portion of the third magnetic layer 30 in the X-Y plane. For example, in the X-Y plane, a portion of the first magnetic layer 10 may be divided (described below).

The third magnetic layer 30 includes, for example, a surface 30s (for example, a major surface). The surface 30s crosses the first direction (the Z-axis direction). The first part 10a of the first magnetic layer 10 faces the surface 30s, for example. The first part 10a may be in contact with the surface 30s.

A vertical magnetization component of magnetization 10m of the first magnetic layer 10 in the first direction is larger than an in-plane magnetization component of the magnetization 10m of the first magnetic layer 10 in the direction crossing the first direction.

For example, the direction of the magnetization 10m of the first magnetic layer 10 is substantially perpendicular to, for example, a surface 10s (for example, a major surface) of the first magnetic layer 10. For example, the direction of the magnetization 10m of the first magnetic layer 10 includes a component which is perpendicular to the surface 10s of the first magnetic layer 10, for example. The direction of the magnetization 10m of the first magnetic layer 10 is not parallel with respect to the surface 10s. The first magnetic layer 10 is, for example, a reference layer.

A material of the first part 10a of the first magnetic layer 10 is the same as that of the second part 10b of the first magnetic layer 10, for example. The second part 10b may be formed in continuous to the first part 10a, for example. A joint between the first part 10a and the second part 10b may be seamless. The material of the first part 10a of the first magnetic layer 10 may be different from the material of the second part 10b of the first magnetic layer 10.

A direction of magnetization 20m of the second magnetic layer 20 is variable. The second part 10b of the first magnetic layer 10 does not overlap the second magnetic layer 20 in one direction of the X-Y plane (for example, the X-axis direction or the like). A length L2 of the second magnetic layer 20 in one direction (for example, the X-axis direction or the like) in the X-Y plane is not more than a length L3 of the third magnetic layer 30 in the one direction. For example, the length L2 is smaller than the length L3. The length L2 is a diameter or a width of the second magnetic layer 20, for example. The length L2 of the second magnetic layer 20 in one direction (for example, the X-axis direction or the like) in the X-Y plane is smaller than a length L1 of the first magnetic layer 10 in one direction thereof. The second magnetic layer 20 may include, for example, an alloy. The second magnetic layer 20 may include, for example, a memory layer.

The direction of the magnetization 20m of the second magnetic layer 20 easily moves as compared with the direction of the magnetization 10m of the first magnetic layer 10. The direction of the magnetization 20m of the second magnetic layer 20 is changed in accordance with information to be stored. That is, the direction of the magnetization 20m corresponds to the Information to be stored. On the other hand, the direction of the magnetization 10m of the first magnetic layer 10 is relatively difficult to move as compared with the direction of the magnetization 20m of the second magnetic layer 20. The direction of the magnetization 10m of the first magnetic layer 10 is substantially fixed at the time of a normal operation (for example, at the time of writing), for example. As compared with the direction of the magnetization of the memory layer, in a case where the direction of the magnetization is difficult to move, it is assumed that "the direction of the magnetization is substantially fixed".

In the first magnetic layer 10, a side surface 10sw (the outer side surface) crosses the X-axis direction, for example. A distance 10L between the side surface 10sw of the second part 10b of the first magnetic layer 10 and the side surface 30sw of the third magnetic layer 30 in the X-axis direction may be half or less than a length 30L of the third magnetic layer 30.

For example, in the X-axis direction, a distance between the side surface 10sw of the second part 10b of the first magnetic layer 10 and the side surface 30sw of the third magnetic layer 30 is in a range of 0.5 nm to 5 nm.

A vertical magnetization component of magnetization 30m of the third magnetic layer 30 in the first direction is larger than the in-plane magnetization component of the magnetization 30m of the third magnetic layer 30 in the first direction. The direction of the magnetization 30m of the third magnetic layer 30 includes a component perpendicular to the surface 30s of the third magnetic layer 30, for example. The direction of the magnetization 30m of the third magnetic layer 30 is not parallel with the surface 30s. The third magnetic layer 30 is an interface layer, for example. The direction of the magnetization 30m of the third magnetic layer 30 is relatively difficult to move as compared with the direction of the magnetization 20m of the second magnetic layer 20. The direction of the magnetization 30m of the third magnetic layer 30 is substantially fixed, for example.

The first non-magnetic layer 31n is in contact with, for example, the third magnetic layer 30 and the second magnetic layer 20. The first part 10a of the first magnetic layer 10, the third magnetic layer 30, the first non-magnetic layer 31n, and the second magnetic layer 20 are stacked in the stacking direction SD1.

Figure 2A:
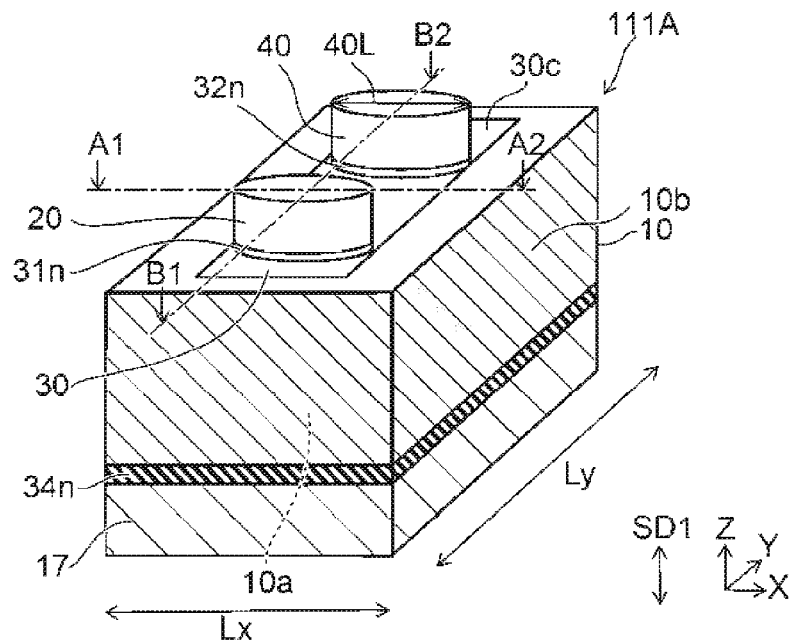
FIG. 2A to FIG. 2C are schematic views illustrating a magnetic memory device according to the first embodiment.
Figures 2B, 2C:
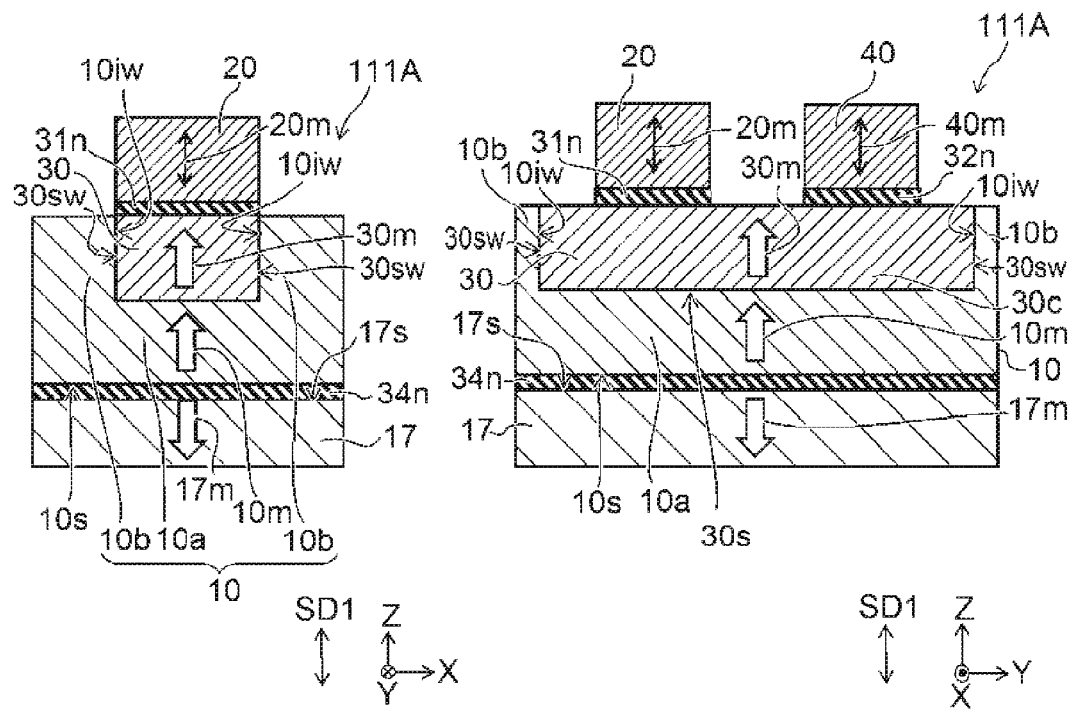

FIG. 2A to FIG. 2C are schematic views illustrating a magnetic memory device according to the first embodiment.

FIG. 2A is a perspective view. FIG. 2B is a sectional view taken along line IIB-IIB in FIG. 2A. FIG. 2C is a sectional view taken along line IIC-IIC FIG. 2A.

As illustrated in FIG. 2A, a magnetic memory device 111A further includes a fourth magnetic layer 40, a second non-magnetic layer 32n, a seventh magnetic layer 17, and a fourth non-magnetic layer 34n. It is not necessary to provide the fourth non-magnetic layer 34n.

In the magnetic memory device 111A, the first magnetic layer 10 and the third magnetic layer 30 extend in the third direction. The third direction crosses the first direction (for example, the Z-axis direction) and the second direction (for example, the X-axis direction). For example, the third direction is a Y-axis direction. Length Ly of the first magnetic layer 10 in the third direction (the Y-axis direction) is larger than length Lx of the first magnetic layer 10 in the second direction (the X-axis direction). The first part 10a of the first magnetic layer 10 extends in the third direction (for example, the Y-axis direction). The second part 10b of the first magnetic layer 10 extends in the third direction (for example, the Y-axis direction).

The fourth magnetic layer 40 is provided in a state of being separated from the second magnetic layer 20 in the third direction (for example, the Y-axis direction). The fourth magnetic layer 40 is adjacent to the second magnetic layer 20 in the Y-axis direction. The fourth magnetic layer 40 is provided in a state of being separated from the third magnetic layer 30 in the Z-axis direction. The fourth magnetic layer 40 overlaps the third magnetic layer 30 in the Z-axis direction. The direction of magnetization 40m of the fourth magnetic layer 40 is variable. The second part 10b of the first magnetic layer 10 does not overlap the fourth magnetic layer 40 in the X-axis direction. In the X-axis direction, a length 40L of the fourth magnetic layer 40 is smaller than the length Lx of the first magnetic layer 10. For example, an alloy is used as the fourth magnetic layer 40.

The fourth magnetic layer 40 is, for example, a memory layer. The number of the memory layers (magnetic layer) which are adjacent to the second magnetic layer 20 in the third direction (for example, the Y-axis direction) is not limited to the number illustrated in the drawings.

The second part 10b is provided around at least a portion of the third magnetic layer 30 in the X-Y plane. For example, the third magnetic layer 30 is surrounded by the second part 10b in the X-Y plane.

As illustrated in FIG. 2B, the third magnetic layer 30 overlaps the first magnetic layer 10 and the second magnetic layer 20 in the Z-axis direction. For example, the third magnetic layer 30 is provided between the first magnetic layer 10 and the second magnetic layer 20 in the Z-axis direction. For example, the third magnetic layer 30 is provided between the first part 10a of the first magnetic layer 10 and the second magnetic layer 20 in the Z-axis direction.

At least a portion of the third magnetic layer 30 overlaps the first magnetic layer 10 in the X-axis direction. For example, at least a portion of the side surface 30sw of the third magnetic layer 30 overlaps the internal side surface 10iw of the first magnetic layer 10 in the X-axis direction. In the X-axis direction, the side surface 30sw may be in contact with the internal side surface 10iw.

As illustrated in FIG. 2C, the third magnetic layer 30 overlaps the first magnetic layer 10 in the third direction (for example, the Y-axis direction). For example, the side surface 30sw of the third magnetic layer 30 overlaps the internal side surface 10iw of the first magnetic layer 10 in the third direction (for example, the Y-axis direction). In the Y-axis direction, the side surface 30sw may be in contact with the internal side surface 10iw.

The third magnetic layer 30 extends in the third direction (for example, the Y-axis direction). The third magnetic layer 30 has a region 30c between the first magnetic layer 10 and the fourth magnetic layer 40 (FIG. 2A and FIG. 2C). The first magnetic layer 10 overlaps at least a portion of the region 30c of the third magnetic layer 30 in the X-axis direction (FIG. 2A). The first magnetic layer 10 overlaps at least a portion of the region 30c of the third magnetic layer 30 in the Y-axis direction (FIG. 2C).

As illustrated in FIG. 2C, the second non-magnetic layer 32n is provided between the fourth magnetic layer 40 and the third magnetic layer 30 in the Z-axis direction. The second non-magnetic layer 32n is in contact with the third magnetic layer 30 and the fourth magnetic layer 40, for example.

A seventh magnetic layer 17 overlaps the first magnetic layer 10 and the fourth non-magnetic layer 34n in the Z-axis direction. The seventh magnetic layer 17 and the fourth non-magnetic layer 34n extend in the third direction (for example, the Y-axis direction). The seventh magnetic layer 17 is, for example, a shift correction layer. A vertical magnetization component of magnetization 17m of the seventh magnetic layer 17 in the Z-axis direction is larger than an in-plane magnetization component of the magnetization 17m of the seventh magnetic layer 17 in the direction crossing the Z-axis direction. The direction of the magnetization of the seventh magnetic layer 17 is opposite to the direction of the magnetization of the first magnetic layer 10, for example. With this, in a position of the second magnetic layer 20 (memory layer), a magnetic field of the first magnetic layer 10 in the Z-axis direction is canceled by a magnetic field of the seventh magnetic layer 17 in the Z-axis direction. The fourth non-magnetic layer 34n is provided between the first magnetic layer 10 and the seventh magnetic layer 17 in the Z-axis direction.

The region 30c of the third magnetic layer 30 is provided between the seventh magnetic layer 17 and the fourth magnetic layer 40. The first part 10a of the first magnetic layer 10 is provided between the region 30c of the third magnetic layer 30 and the seventh magnetic layer 17.

A direction of magnetization 17m of the seventh magnetic layer 17 includes a component which is perpendicular to a surface 17s of the seventh magnetic layer 17, for example. The direction of the magnetization 17m of the seventh magnetic layer 17 is not parallel with the surface 17s. The direction of the magnetization 17m of the seventh magnetic layer 17 is relatively difficult to move with respect to the direction of the magnetization 20m of the second magnetic layer 20. The direction of the magnetization 17m of the seventh magnetic layer 17 is substantially fixed at the time of a normal operation, for example.

The fourth non-magnetic layer 34n extends in the third direction (for example, the Y-axis direction). The fourth non-magnetic layer 34n is provided between the seventh magnetic layer 17 and the first magnetic layer 10. The fourth non-magnetic layer 34n is in contact with, for example, the seventh magnetic layer 17 and the first magnetic layer 10. The region 30c of the third magnetic layer 30 is provided between the fourth non-magnetic layer 34n and the fourth magnetic layer 40. The first part 10a of the first magnetic layer 10 is provided between the region 30c of the third magnetic layer 30 and the fourth non-magnetic layer 34n.

Figure 3A:
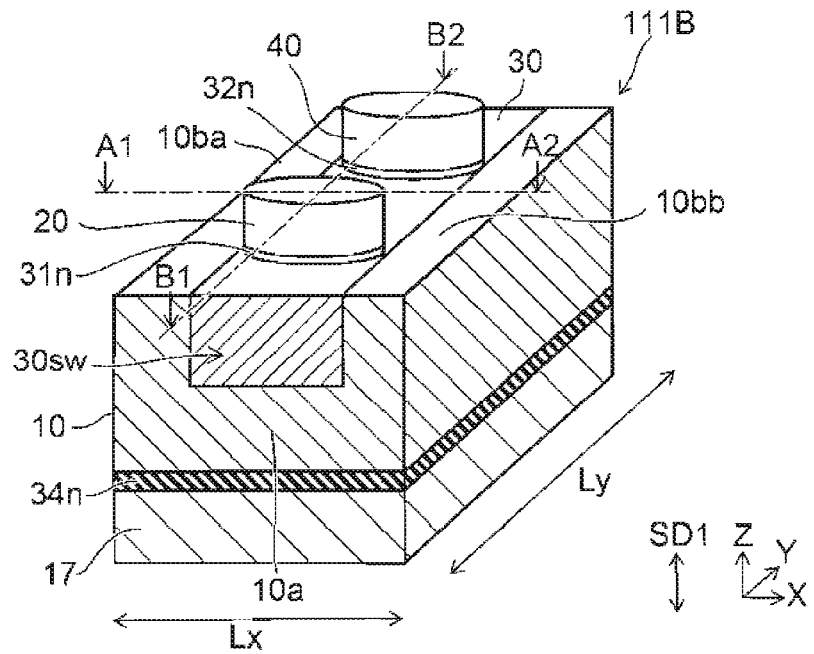
FIG. 3A to FIG. 3C are schematic views illustrating the magnetic memory device according to the first embodiment.
Figures 3B, 3C:
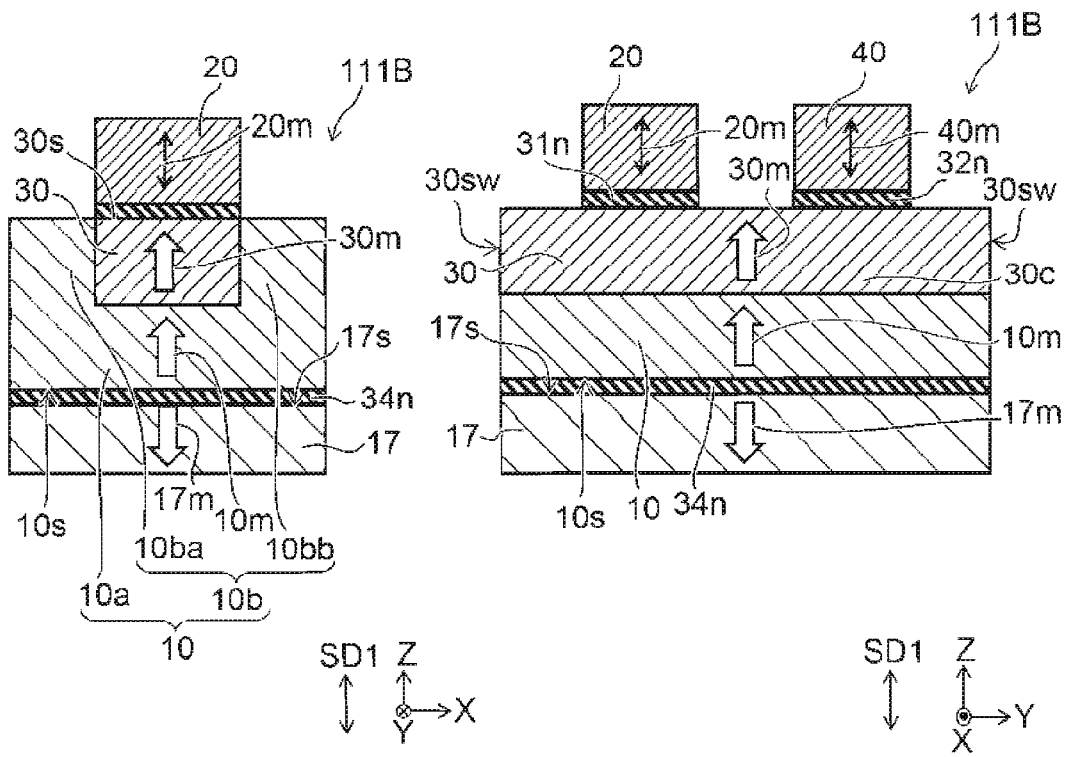

FIG. 3A to FIG. 3C are schematic views illustrating the magnetic memory device according to the first embodiment.

FIG. 3A is a perspective view. FIG. 3B is a sectional view taken along line IIIB-IIIB in FIG. 3A. FIG. 3C is a sectional view taken along line IIIC-IIIC in FIG. 3A.

In a magnetic memory device 111B illustrated in FIG. 3A, the second part 10b of the first magnetic layer 10 includes a first region 10ba and a second region 10bb. In the direction (for example, one direction of the X-Y plane) crossing the first direction, at least a portion of the third magnetic layer 30 is provided between the first region 10ba and the second region 10bb. For example, in the X-axis direction, at least a portion of the third magnetic layer 30 is provided between the first region 10ba and the second region 10bb.

The first region 10ba of the first magnetic layer 10 extends in the third direction (for example, the Y-axis direction). The second region 10bb of the first magnetic layer 10 extends in the third direction (for example, the Y-axis direction).

In the magnetic memory device 111B, the first magnetic layer 10 is not continuous in the X-Y plane. For example, a portion of the side surface 30sw of the third magnetic layer 30 is exposed in the Y-axis direction.

As illustrated in FIG. 3B, in the magnetic memory device 111B, the third magnetic layer 30 is provided between the first region 10ba and the second region 10bb in the X-axis direction.

As illustrated in FIG. 3C, in the magnetic memory device 111B, for example, the side surface 30sw of the third magnetic layer 30 is exposed in the Y-axis direction.

In the magnetic memory devices 110, 111A, and 111B, the first magnetic layer 10 overlaps at least a portion of the third magnetic layer 30 in the second direction (FIG. 1A to FIG. 3C). In a case where the second part 10b of the first magnetic layer 10 does not exist, and the second part 10b of the first magnetic layer 10 does not overlap the third magnetic layer 30 in the second direction, an area in which the first magnetic layer 10 and the third magnetic layer 30 are overlapped with each other (a total area in which the first magnetic layer 10 and the third magnetic layer 30 are overlapped with each other) becomes smaller than a case where the second part 10b of the first magnetic layer 10 exists.

When the first magnetic layer 10 does not overlap the third magnetic layer 30 in the second direction, if a current in which the magnetization state of the second magnetic layer 20 is changed flows into the third magnetic layer 30, it is likely that the magnetization of the third magnetic layer 30 fluctuates depending on the size of the current.

For example, in the magnetic memory devices 111A and 111B (FIG. 2A to FIG. 3C), any one of the first magnetic layer 10, the third magnetic layer 30, and the seventh magnetic layer 17 extends in the third direction (for example, the Y-axis direction). Any one of the first magnetic layer 10, the third magnetic layer 30, and the seventh magnetic layer 17 is used as, for example, a wire in some cases. In a case where any one of the first magnetic layer 10, the third magnetic layer 30, and the seventh magnetic layer 17 is used as the wire, a writing current flows in the Y-axis direction in addition to the Z-axis direction. When the first magnetic layer 10 in the second direction does not overlap the third magnetic layer 30, the magnetization of the third magnetic layer 30 easily fluctuates.

The inventors have searched a condition that the magnetization of the third magnetic layer 30 and the first magnetic layer 10 does not move at the time of writing, and thus the writing current flowing into the second magnetic layer 20 is not easily increased in a case where the first magnetic layer 10 (a reference layer) is not surrounded by the second part 10b of the first magnetic layer 10, based on Landau Liftshitz Gilbert (LLG) simulation. The inventors have found that a range of selection of the material for the third magnetic layer 30 becomes narrower by searching the condition that the magnetization of the third magnetic layer 30 and the first magnetic layer 10 does not easily move. For example, a range of combination of a saturation magnetization Ms of the third magnetic layer 30 and the thickness (the length in the stacking direction SD1) of the third magnetic layer 30 becomes smaller. Under the condition that the magnetization of the third magnetic layer 30 and the magnetization of the first magnetic layer 10 move, the writing current is increased. Under the condition that the magnetization of the third magnetic layer 30 and the magnetization of the first magnetic layer 10 move, an operation obstruction occurs, for example, the magnetization of the first magnetic layer 10 is inverted. Here, when an exchange coupling force between the third magnetic layer 30 and the first magnetic layer 10 is enhanced, the operation obstruction is suppressed. However, selection of the material of which the exchange coupling force is enhanced renders the range of the material selection become smaller.

In contrast, in the magnetic memory devices 110, 111A, and 111B (FIG. 1A to FIG. 3C), the first magnetic layer 10 overlaps the third magnetic layer 30 in the second direction. With this, for example, an area in which the first magnetic layer 10 and the third magnetic layer 30 overlap with each other is increased. For example, in the magnetic memory devices 110, 111A, and 111B, the first magnetic layer 10 is in contact with the third magnetic layer 30 in the second direction (for example, the X-axis direction or the Y-axis direction). With this, for example, an area in which the first magnetic layer 10 and the third magnetic layer 30 are in contact with each other is increased. Accordingly, in the magnetic memory devices 110, 111A, and 111B, the exchange coupling between the first magnetic layer 10 and the third magnetic layer 30 becomes more enhanced.

For example, in a case where there is a part in which the first magnetic layer 10 is in contact with the third magnetic layer 30 in the second direction, the exchange coupling is increased about 1.5 times that in the second direction as compared with a case where the first magnetic layer 10 is not in contact with the third magnetic layer 30. With this, the magnetic memory devices 110, 111A, and 111B, the magnetization of the third magnetic layer 30 does not easily fluctuate at the time of the writing, and thus the writing operation is stabilized.

Hereinafter, an example of a nonvolatile memory apparatus including the magnetic memory device (magnetic memory devices 110, 111A, and 111B) will be described.

Figure 4:
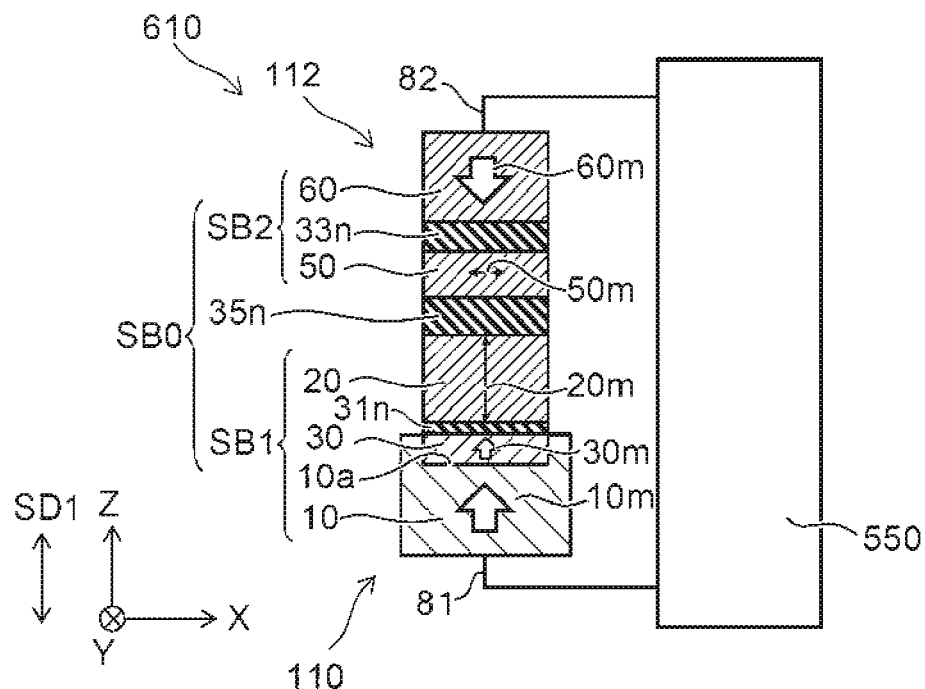
FIG. 4 is a schematic view illustrating a nonvolatile memory apparatus according to the first embodiment.

FIG. 4 is a schematic view illustrating a nonvolatile memory apparatus according to the first embodiment.

As illustrated in FIG. 4, a nonvolatile memory apparatus 610 includes a magnetic memory device 112 and a control unit 550. The magnetic memory device 112 includes a stacked body SB0. The stacked body SB0 includes a first stacking layer portion SB1 and a second stacking layer portion SB2. The control unit 550 is electrically connected to the stacked body SB0. The control unit 550 applies a voltage and supplies current with respect to the stacked body SB0. With this, the operation of the stacked body SB0 is controlled. The first stacking layer portion SB1 includes the magnetic memory device 110. The first stacking layer portion SB1 includes, for example, the first magnetic layer 10, the second magnetic layer 20, the third magnetic layer 30, and the first non-magnetic layer 31n. The magnetic memory device 112 includes a configuration of the above-described magnetic memory device 110.

The second stacking layer portion SB2 overlaps the first stacking layer portion SB1 in the stacking direction SD1. For example, the second stacking layer portion SB2 is stacked on the first stacking layer portion SB1 in the stacking direction SD1. The second stacking layer portion SB2 includes a fifth magnetic layer 50. The fifth magnetic layer 50 overlaps the first stacking layer portion SB1 in the stacking direction SD1. For example, the fifth magnetic layer 50 is stacked on the first stacking layer portion SB1 in the stacking direction SD1. A direction of magnetization of the fifth magnetic layer 50 is variable. The width of the fifth magnetic layer 50 (the length of the direction perpendicular to the stacking direction SD1) is 35 nanometers (nm) or less, for example. For example, in a case where the shape of the fifth magnetic layer 50 is a circular shape when being projected on the X-Y plane, the diameter of the circle is 35 nm or less. For example, the maximum length of the in-plane direction (the direction perpendicular to the stacking direction SD1) of the fifth magnetic layer 50 is 35 nm or less. The thickness of the fifth magnetic layer 50 (the length of the stacking direction SD1) is in a range of 0.5 nm to 3.5 nm.

In the example, the second stacking layer portion SB2 further includes a sixth magnetic layer 60 and a third non-magnetic layer 33n. The sixth magnetic layer 60 overlaps the fifth magnetic layer 50 in the stacking direction SD1. For example, the sixth magnetic layer 60 is stacked on the fifth magnetic layer 50 in the stacking direction SD1. A vertical magnetization component of magnetization 60m of the sixth magnetic layer 60 in the Z-axis direction is larger than an in-plane magnetization component of the magnetization 60m of the sixth magnetic layer 60 in the direction crossing the Z-axis direction. The direction of the magnetization 60m of the sixth magnetic layer 60 is opposite to the direction of the magnetization 10m of the first magnetic layer 10. The direction of the magnetization 60m of the sixth magnetic layer 60 is relatively difficult to move as compared with the direction of the magnetization 20m of the second magnetic layer 20. The direction of magnetization 60m of the sixth magnetic layer 60 is substantially fixed at the time of a normal operation, for example. The third non-magnetic layer 33n is provided between the fifth magnetic layer 50 and the sixth magnetic layer 60. The third non-magnetic layer 33n overlaps the fifth magnetic layer 50 and the sixth magnetic layer 60 in the stacking direction SD1. The third non-magnetic layer 33n is in contact with, for example, the fifth magnetic layer 50 and the sixth magnetic layer 60.

In the example, the stacked body SB0 further includes a fifth non-magnetic layer 35n. The fifth non-magnetic layer 35n is provided between the first stacking layer portion SB1 and the second stacking layer portion SB2. In the example, the first magnetic layer 10, the third magnetic layer 30, the first non-magnetic layer 31n, the second magnetic layer 20, the fifth non-magnetic layer 35n, the fifth magnetic layer 50, the third non-magnetic layer 33n, and the sixth magnetic layer 60 are stacked in this order. The fifth non-magnetic layer 35n is, for example, a spin disappearance layer. With this, spin polarization of electrons flowing into the fifth non-magnetic layer 35n easily disappears. The fifth non-magnetic layer 35n overlaps the first stacking layer portion SB1 and the second stacking layer portion SB2 in the stacking direction SD1. The fifth non-magnetic layer 35n is in contact with, for example, the first stacking layer portion SB1 and the second stacking layer portion SB2. In the example, the fifth non-magnetic layer 35n is in contact with the second magnetic layer 20 and the fifth magnetic layer 50.

For example, the first stacking layer portion SB1 further includes a first conductive layer 81, and the second stacking layer portion SB1 includes a second conductive layer 82. The first stacking layer portion SB1 is disposed between the first conductive layer 81 and the second conductive layer 82. The second stacking layer portion SB2 is disposed between the first stacking layer portion SB1 and the second conductive layer 82. The first conductive layer 81 is electrically connected to the first stacking layer portion SB1. In the example, the first conductive layer 81 is electrically connected to the first magnetic layer 10. The second conductive layer 82 is electrically connected to the second stacking layer portion SB2. In the example, the second conductive layer 82 is electrically connected to the sixth magnetic layer 60.

The first conductive layer 81 and the second conductive layer 82 are electrically connected to the control unit 550. The stacked body SB0 is directly or indirectly connected to the control unit 550 via the first conductive layer 81 and the second conductive layer 82. The first conductive layer 81 may be regarded as a layer different from the first stacking layer portion SB1. The second conductive layer 82 may be regarded as a layer different from the second stacked body SB2.

Figure 31:
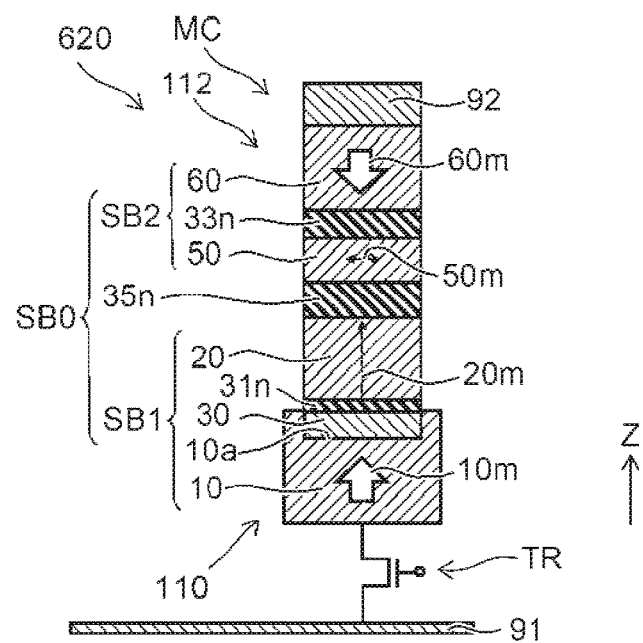
FIG. 31 is a schematic view illustrating the nonvolatile memory apparatus according to the second embodiment.

The nonvolatile memory apparatus 610 may further include, for example, a first wire 91 and a second wire 92 (refer to FIG. 31). The first wire 91 is electrically connected to the first conductive layer 81, for example. The second wire 92 is electrically connected to the second conductive layer 82, for example. The control unit 550 is electrically connected to the stacked body SB0 via the first wire 91 and the second wire 92, for example.

Hereinafter, examples of a configuration and an operation of the stacked body SB0 (magnetic memory device 112) will be described. The following description can be applied to the following other magnetic memory devices according to the embodiment in addition to the magnetic memory device 112.

In the stacked body SB0, the current (writing current) flows into the first stacking layer portion SB1 and the second stacking layer portion SB2 in the stacking direction SD1. With this, the spin-polarized electron acts on the second magnetic layer 20. In the stacked body SB0, a rotating magnetic field which is generated by performing precession of the magnetization of the fifth magnetic layer 50 acts on the second magnetic layer 20. With this, the direction of magnetization 20m of the second magnetic layer 20 is determined in the direction in accordance with the direction of the current.

The first magnetic layer 10 functions as a first magnetization fixing layer, for example. In the first magnetic layer 10, the magnetization 10m is directed to the direction which is substantially perpendicular to the film surface, for example. The magnetization 10m is directed to the first direction having the component of the stacking direction SD1 in which the first magnetic layer 10 and the second magnetic layer 20 are coupled to each other. The direction of the magnetization 10m of the first magnetic layer 10 is substantially parallel with the stacking direction SD1, for example.

In the second magnetic layer 20, for example, a magnetization easy axis is in the direction which is substantially perpendicular to the film surface. For example, the direction of the magnetization of the second magnetic layer 20 is in the direction which is substantially perpendicular to the film surface. The magnetization of the second magnetic layer 20 can be relatively easily inverted, and is variable in the stacking direction SD1. The second magnetic layer 20 has a function of storing data. The second magnetic layer 20 serves as a magnetic memory layer, for example.

In the third magnetic layer 30, the magnetization 30m is directed to the direction which is substantially perpendicular to the film surface, for example. The magnetization 30m is directed to the first direction having the component of the stacking direction SD1 in which the first magnetic layer 10 and the second magnetic layer 20 are coupled to each other. The direction of the magnetization 30m of the third magnetic layer 30 is substantially parallel with the stacking direction SD1, for example.

The first non-magnetic layer 31n functions as a first spacer layer. In a case where the first non-magnetic layer 31n is a tunnel barrier layer based on an insulating material, the first stacking layer portion SB1 including the first magnetic layer 10, the first non-magnetic layer 31n, the second magnetic layer 20, and the third magnetic layer 30 has a magnetic tunnel junction (MTJ) structure, for example.

In the fifth magnetic layer 50, for example, the magnetization component which is projected to the stacking direction SD1 is smaller than the magnetization component which is projected to the direction perpendicular to the stacking direction SD1. The magnetization easy axis of the fifth magnetic layer 50 is substantially parallel with the film surface. The magnetization of the fifth magnetic layer 50 is variable in the direction perpendicular to the stacking direction SD1. The fifth magnetic layer 50 has a function of generating a high-frequency magnetic field at the time of the writing. The fifth magnetic layer 50 serves as a magnetization rotating layer (an oscillation layer), for example.

The sixth magnetic layer 60 serves as a second magnetization fixing layer, for example. The direction of the magnetization 60m of the sixth magnetic layer 60 is fixed in the direction which is substantially perpendicular to the film surface, for example. The magnetization 60m of the sixth magnetic layer 60 is fixed in the first direction having the component of the stacking direction. The direction of the magnetization 60m of the sixth magnetic layer 60 is the direction which is substantially perpendicular to the film surface. The third non-magnetic layer 33n functions as a second spacer layer.

The vertical magnetization film is used to the first magnetic layer 10, the second magnetic layer 20, the third magnetic layer 30, and the sixth magnetic layer 60, for example. An in-plane magnetization film is used as the fifth magnetic layer 50, for example.

A magnetic resonance frequency of the second magnetic layer 20 can be measured by using, for example, a dumping measurement method. For example, the measurement is performed by applying a probe to an end of the first stacking layer portion SB1 and an end of the second stacking layer portion SB2. In this case, there is a possibility that a plurality of magnetic resonance frequencies are measured. For example, it is possible to obtain a material and composition of the second magnetic layer 20 by using mass spectrometry and X-ray diffraction. The resonance frequency of the second magnetic layer 20 can be identified from the frequency matching with a resonance frequency band which can be estimated from the aforementioned material. With this, it is possible to measure properties If1 of the first stacking layer portion SB1.

The magnetic resonance frequency also can be obtained by measuring a ferromagnetic resonance (FMR) spectrum.

The oscillation properties of the fifth magnetic layer 50 are measured by applying the probe to one end of the first stacking layer portion SB1 and one end of the second stacking layer portion SB2. The oscillation properties can be obtained by measuring the magnetic field which is generated in the current flowing into the second stacking layer portion SB2.

For example, it is possible to obtain a material and composition of the fifth magnetic layer 50 by using mass spectrometry and X-ray diffraction. With this, it is possible to obtain the oscillation properties of the fifth magnetic layer 50, for example.

Figures 5A, 5B:
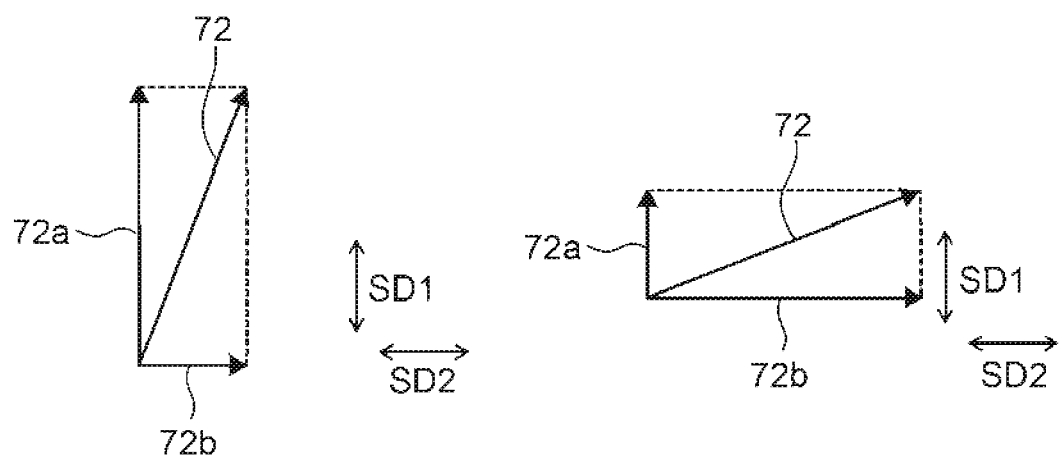
FIG. 5A and FIG. 5B are schematic views illustrating the magnetization.

FIG. 5A and FIG. 5B are schematic views illustrating the magnetization.

FIG. 5A illustrates the magnetization in the vertical magnetization film. FIG. 5B illustrates the magnetization in the in-plane magnetization film.

As illustrated in FIG. 5A and FIG. 5B, one direction which crosses (for example, perpendicular to) the stacking direction SD1 is set to be an in-plane direction SD2. The in-plane direction SD2 is a direction of the X-Y plane. An in-plane magnetization component 72b of the magnetization 72 is a component which is obtained by projecting the magnetization 72 to the X-Y plane. The in-plane magnetization component 72b is along the in-plane direction SD2. The in-plane magnetization component 72b is parallel with the in-plane direction SD2. A vertical magnetization component 72a of the magnetization 72 is a component obtained by projecting the magnetization 72 to the Z-axis direction. The vertical magnetization component 72a is parallel with the stacking direction SD1.

As illustrated in FIG. 5A, in the vertical magnetization film, the vertical magnetization component 72a has a magnetization state which is greater than the in-plane magnetization component 72b. It is preferable that in the vertical magnetization film, the direction of the magnetization is substantially perpendicular to the film surface in terms of the operation properties.

As illustrated in FIG. 5B, in the in-plane magnetization film, the in-plane magnetization component 72b has a magnetization state which is greater than the vertical magnetization component 72a. It is desirable that in the in-plane magnetization film, the direction of magnetization is substantially parallel with the film surface in terms of the operation properties.

For example, the vertical magnetization component along the stacking direction SD1 of the magnetization 10m of the first magnetic layer 10 is larger than the in-plane magnetization component in the direction which crosses (for example, perpendicular to) the stacking direction SD1 of the magnetization 10m of the first magnetic layer 10. The vertical magnetization component of the magnetization 20m of the second magnetic layer 20 is larger than the in-plane magnetization component of the second magnetic layer 20. The vertical magnetization component of the fifth magnetic layer 50 is smaller than the in-plane magnetization component of the fifth magnetic layer 50.

For convenience of explanation, the direction toward the second stacking layer portion SB2 from the first stacking layer portion SB1 is referred to as "up" or "upward". The direction toward the first stacking layer portion SB1 from the second stacking layer portion SB2 is referred to as "low" or "downward".

As described above, the direction of the magnetization 10m of the first magnetic layer 10 is substantially fixed. The direction of the magnetization 30m of the third magnetic layer 30 is substantially fixed. The direction of the magnetization 60m of the sixth magnetic layer 60 is substantially fixed at the time of a normal operation, for example.

As illustrated in FIG. 4, in the stacked body SB0, the direction of the magnetization 10m of the first magnetic layer 10 is upward, the direction of the magnetization 30m of the third magnetic layer 30 is upward, and the direction of the magnetization 60m of the sixth magnetic layer 60 is downward. The direction of the component of the stacking direction SD1 of the magnetization 10m of the first magnetic layer 10 is opposite to the direction of the component of the stacking direction SD1 of the magnetization 60m of the sixth magnetic layer 60, for example. The direction of the component of the stacking direction SD1 of the magnetization 30m of the third magnetic layer 30 is opposite to the direction of the component of the stacking direction SD1 of the magnetization 60m of the sixth magnetic layer 60, for example. Here, the direction of the magnetization 10m of the first magnetic layer 10, the direction of the magnetization 10m of the third magnetic layer 30, and the direction of the magnetization 60m of the sixth magnetic layer 60 can be variously changed. For example, both of the direction of the magnetization 10m of the first magnetic layer 10 and the direction of the magnetization 60m of the sixth magnetic layer 60 may be upward or downward, or one direction may be upward and the other direction may be downward.

In the stacked body SB0, the electronic current can flow into the first stacking layer portion SB1 and the second stacking layer portion SB2 via the first conductive layer 81 and the second conductive layer 82, for example. The electronic current is the flow of electrons. When the current flows upward, the electronic current flows downward.

When the electronic current flows in the direction perpendicular to the film surface, the magnetization 50m in the fifth magnetic layer 50 of a magnetic field generation source performs the precession. With this, the rotating magnetic field (the high-frequency magnetic field) is generated. The frequency of the high-frequency magnetic field is, for example, about 1 GHz to 60 GHz. The high-frequency magnetic field has the component of the direction (the component of the direction of the magnetization hard axis of the second magnetic layer 20) which is perpendicular to the magnetization 20m of the second magnetic layer 20. At least a portion of the high-frequency magnetic field generated from the fifth magnetic layer 50 is applied to the direction of the magnetization hard axis of the second magnetic layer 20. When the high-frequency magnetic field generated from the fifth magnetic layer 50 is applied to the direction of the magnetization hard axis of the second magnetic layer 20, it is easy to invert the magnetization 20m of the second magnetic layer 20.

In the stacked body SB0, when the electronic current flows into the first stacking layer portion SB1 and the second stacking layer portion SB2, it is possible to control the direction of the magnetization 20m of the second magnetic layer 20. Specifically, it is possible to invert the direction of the magnetization 20m of the second magnetic layer 20 by changing the direction (polarity) in which the electronic current flows. In a case where information is stored, for example, "0" and "1" are assigned respectively in accordance with the direction of the magnetization 20m of the second magnetic layer 20. The stacked body SB0 has a first state or a second state which is different from the first state. Each of the first state and the second state corresponds to two directions, which are different from each other, of the magnetization 20m of the second magnetic layer 20.

As described above, a width (a diameter) of the fifth magnetic layer 50 is favorably 35 nm or smaller. When the width of the fifth magnetic layer 50 is greater than 35 nm, for example, vortex (a closure domain) is generated in accordance with the precession of the magnetization 50*m* of the fifth magnetic layer 50. When a circle-equivalent diameter having a sectional shape of the fifth magnetic layer 50 is set to 35 nm or smaller, and the thickness of the fifth magnetic layer 50 is set to be in a range of 0.5 nm to 3.5 nm, it is possible to prevent the vortex from being generated, for example. With this, the high-frequency magnetic field generated from the fifth magnetic layer 50 properly acts by magnetization inversion of the second magnetic layer 20, and thus it is possible to assist for the magnetization Inversion of the second magnetic layer 20. For example, in the position of the second magnetic layer 20, it is possible to obtain sufficient magnetic field intensity for inverting the magnetization 20*m*.

When the circle-equivalent diameter having a cross-sectional shape (sectional shape of the layer when being cut at a plane perpendicular to the stacking direction SD1) of the fifth magnetic layer 50 is set as R (nm), a half value of "R" is set as r (=R/2) (nm), and a layer thickness is set as t (nm), it is preferable that the size satisfies the relationship of $r < 0.419 t^2 - 2.86 t + 19.8$.

In the specification of this application, when a target circle having the same area as the area of the planar shape is assumed, and the diameter thereof is the "circle-equivalent diameter". For example, in a case where the cross-sectional shape of the fifth magnetic layer 50 is a circle, "R" represents a diameter. In a case where the cross-sectional shape of the fifth magnetic layer 50 is an ellipse, "R" represents a diameter of the circle having the same area as the area of the ellipse. In a case where the cross-sectional shape of the fifth magnetic layer 50 is a polygon, "R" represents a diameter of the circle having the same area as the area of the area of the polygon.

According to the magnetic memory device 112 and the nonvolatile memory apparatus 610 of the embodiment, it is possible to provide the magnetic memory device and the nonvolatile memory apparatus in which a malfunction is suppressed. For example, even in a case where a width (a width in the X-axis direction or a width in the Y-axis direction) of the magnetic memory device 112 is set to be 35 nm or smaller, it is possible to assist for the magnetization inversion of the second magnetic layer 20 in the writing of both directions. With this, the malfunction in the writing is suppressed, for example. It is possible to reduce the size of the current (writing current) at the time of writing.

In the stacked body SB0, the magnetization of the second magnetic layer 20 and the magnetization of the fifth magnetic layer 50 are magnetostatically coupled to each other. With this, it is possible to reduce the size of the current at the time of writing, for example.

First, an example of an operation of the "writing" will be described as a specific example of an operation in the stacked body SB0.

FIG. 6A to FIG. 6D and FIG. 7A to FIG. 7D are schematic views illustrating an example of an operation of the magnetic memory device according to the first embodiment.

The aforementioned diagrams illustrate a state of the first stacking layer portion SB1 and the second stacking layer portion SB2 at the time of operating the "writing" in the stacked body SB0. In the writing operation of the second magnetic layer 20, electronic currents e1 and e2 (writing currents) flow so as to cut across the film surface of the first magnetic layer 10, and the film surfaces of the third magnetic layer 30 and the second magnetic layer 20. Here, a case where a magnetoresistive effect through the first non-magnetic layer 31*n* is a normal type will be described.

In the magnetoresistive effect of the "normal type", the electrical resistance when magnetizations of the magnetic layers on both sides of the non-magnetic layers are parallel with each other is lower than the electrical resistance when the magnetizations thereof are anti-parallel with each other. In the case of the normal type, the electrical resistance between the first magnetic layer 10 and the second magnetic layer 20 through the first non-magnetic layer 31*n* when the magnetization 10*m* of the first magnetic layer 10 is parallel with the magnetization 20*m* of the second magnetic layer 20 is lower than that when the magnetizations thereof are anti-parallel with each other.

FIG. 6A to FIG. 6D illustrate a case where the direction of the magnetization 20*m* of the second magnetic layer 20 is inverted from upward to downward.

Figure 6A:
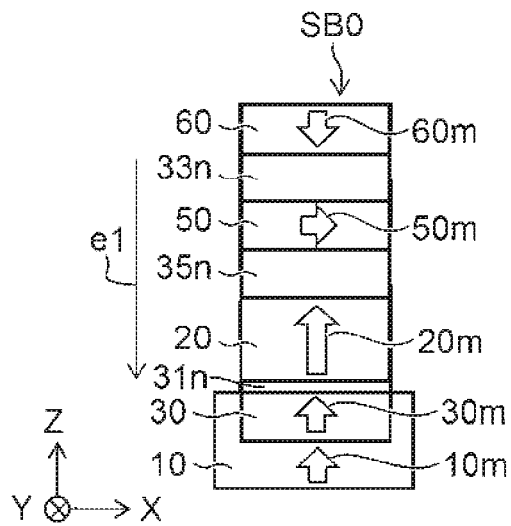
FIG. 6A to FIG. 6D are schematic views illustrating an example of an operation of the magnetic memory device according to the first embodiment.
Figure 6B:
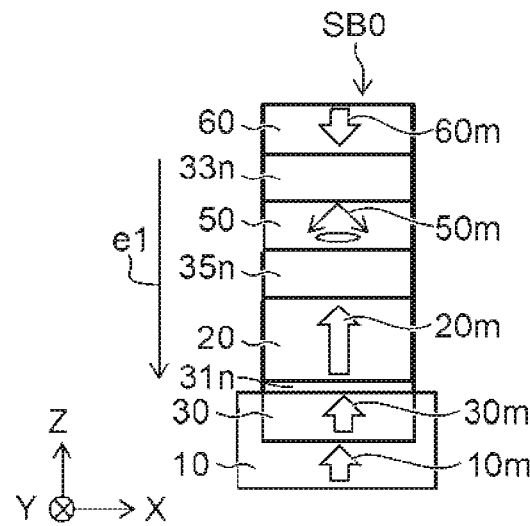
Figure 6C:
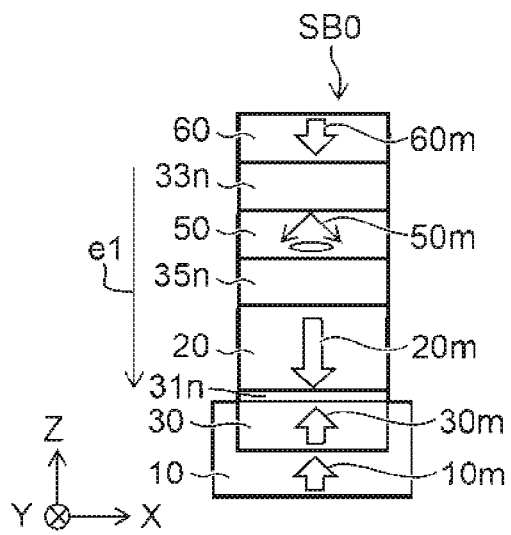
Figure 6D:
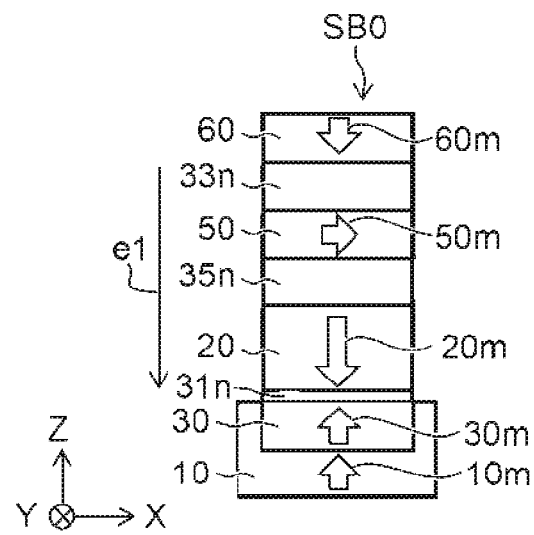

FIG. 6A illustrates a state when the electronic current e1 starts to flow. FIG. 6D illustrates a state when the electronic current e1 finishes flowing (a state where the magnetization 20*m* is inverted). FIG. 6B and FIG. 6C illustrate a state of the electronic current e1 in the middle of flowing.

As illustrated in FIG. 6A, in a case where the direction of the magnetization 20*m* is inverted from upward to downward, the electronic current e1 flows to the first stacking layer portion SB1 from the second stacking layer portion SB2. For example, the electronic current e1 flows downward.

When the electronic current e1 flows downward, among the electrons passing through the first non-magnetic layer 31*n*, an electron having a spin in direction (upward in the example) as same as that of the magnetization 10*m* of the first magnetic layer 10 and the magnetization 30*m* of the third magnetic layer 30 passes through the first magnetic layer 10 and the third magnetic layer 30. On the other hand, the electron having the spin (downward in the example) in the direction opposite to the direction of the magnetization 10*m* of the first magnetic layer 10 and the magnetization 30*m* of the third magnetic layer 30 is reflected on an interface between the third magnetic layer 30 and the first non-magnetic layer 31*n*. The angular momentum of the spin of the reflected electron is transferred to the second magnetic layer 20 so as to act on the magnetization 20*m* of the second magnetic layer 20.

As illustrated in FIG. 6B, when the electronic current e1 flows into the second stacking layer portion SB2, the precession of the magnetization 50*m* of the fifth magnetic layer 50 is performed such that the rotating magnetic field is generated. The electron passing through the sixth magnetic layer 60 having the magnetization 60*m* in the direction which is substantially perpendicular to the film surface has a spin in the same direction as that of the magnetization 60*m* of the sixth magnetic layer 60. When the aforementioned electron flows into the fifth magnetic layer 50, the angular momentum having the spin is transferred to the fifth magnetic layer 50. With this, the electron acts on the magnetization 50*m* of the fifth magnetic layer 50. A so-called spin transfer torque works on the fifth magnetic layer 50. The precession of the magnetization 50*m* is performed by supplying the electronic current e1. The spin polarization of the electron passing through the fifth magnetic layer 50 disappears by passing through the fifth non-magnetic layer 35*n*.

As illustrated in FIG. 6C, when the precession of the magnetization 50*m* of the fifth magnetic layer 50 is performed, the direction of the magnetization 20*m* is inverted from upward to downward. In this operation, the action of the rotating magnetic field from the fifth magnetic layer 50 and the spin-polarized electron reflected on the interface of the first magnetic layer 10 are used. The magnetization 10*m* of the first magnetic layer 10 and the magnetization 30*m* of the third magnetic layer 30 do not invert.

As illustrated in FIG. 6D, when the supply of the electronic current e1 is stopped, the precession of the magnetization 50*m* is stopped. With this, the direction of the magnetization 20*m* is held in a state where the direction is inverted from upward to downward. In a state of the second magnetic layer 20 having the magnetization 20*m* in the inverted direction, for example, "1" is assigned. In the stacked body SB0, for example, a state where the direction of the magnetization 20*m* of the second magnetic layer 20 is downward corresponds to the first state.

FIG. 7A to FIG. 7D illustrate a case where the direction of the magnetization 20*m* is inverted from downward to upward.

Figure 7A:
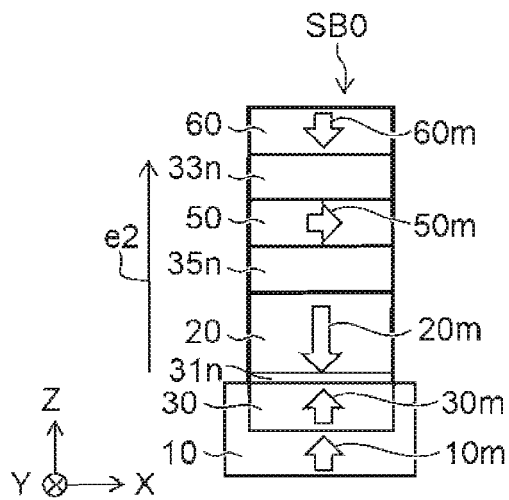
FIG. 7A to FIG. 7D are schematic views illustrating an example of an operation of the magnetic memory device according to the first embodiment.
Figure 7B:
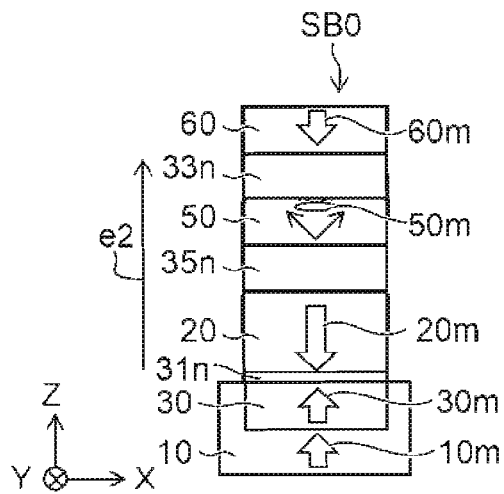
Figure 7C:
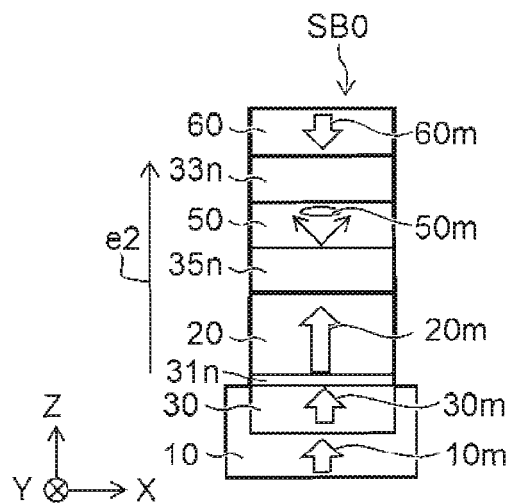
Figure 7D:
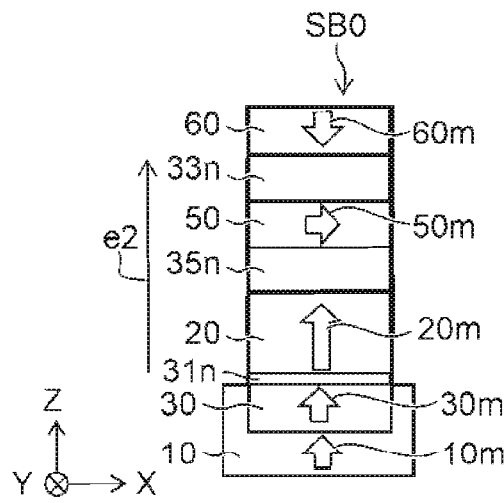

FIG. 7A illustrates a state when an electronic current e2 starts to flow. FIG. 7D illustrates a state when the electronic current e2 finishes flowing (a state where the magnetization 20*m* is inverted). FIG. 7B and FIG. 7C illustrate a state of the electronic current e2 in the middle of flowing.

As illustrated in FIG. 7A, in a case where the direction of the magnetization 20*m* is inverted from downward to upward, the electronic current e2 flows to the second stacking layer portion SB2 from the first stacking layer portion SB1. For example, the electronic current e2 flows upward.

As illustrated in FIG. 7B, when the electronic current e2 flows, the precession of the magnetization 50*m* of the fifth magnetic layer 50 is performed such that the rotating magnetic field is generated. The angular momentum of the spin of the electron is transferred to the fifth magnetic layer 50, and acts on the magnetization 50*m* of the fifth magnetic layer 50. With this, the precession of the magnetization 50*m* is performed.

When the electronic current e2 flows upward, an electron having a spin in direction (upward in the example) as same as that of the magnetization 10*m* of the first magnetic layer 10 and the magnetization 30*m* of the third magnetic layer 30 passes through the first magnetic layer 10 and the third magnetic layer 30, and is transferred to the second magnetic layer 20. With this, the action of the electron having the upward spin, and the action of the rotating magnetic field from the fifth magnetic layer 50 work on the magnetization 20*m*.

As illustrated in FIG. 7C, the direction of the magnetization 20*m* of the second magnetic layer 20 is inverted from downward to upward. In this operation, the action of the spin-polarized electrons and the rotating magnetic field from the fifth magnetic layer 50 are used. The magnetization 10*m* of the first magnetic layer 10 and the magnetization 30*m* of the third magnetic layer 30 are not invented.

As illustrated in FIG. 7D, when the supply of the electronic current e2 is stopped, the precession of the magnetization 50*m* is stopped. With this, the direction of the magnetization 20*m* is held in a state where the direction is inverted from downward to upward. In a state of the second magnetic layer 20 having the magnetization 20*m* in the inverted direction, for example, "1" is assigned. In the stacked body SB0, for example, a state where the direction of the magnetization 20*m* of the second magnetic layer 20 is upward corresponds to the second state.

On the basis of the aforementioned action, "0" or "1" is properly assigned to each of a plurality of different states of the second magnetic layer 20. With this, the "writing" is performed in the stacked body SB0.

In a case where the magnetoresistive effect is a "reverse type", the electrical resistance between the first magnetic layer 10 and the second magnetic layer 20 through the first non-magnetic layer 31*n* when the magnetization 10*m* of the first magnetic layer 10 is parallel with the magnetization 20*m* of the second magnetic layer 20, is higher than that when the magnetizations thereof are anti-parallel with each other. The operation of the "writing" in the reverse type is the same as that in the case of the normal type.

In this example, the first state is "0", and the second state is "1", for example. The first state may be set to be "1", and the second state may be set to be "0". The first state and the second state may be other states without being limited to "0" or "1". The number of states provided in the stacked body SB0 may be 3 or greater. The stacked body SB0 may be a multibit memory device.

The setting of the first state or the second state is performed by the control unit 550. For example, the setting of the first state corresponds to the "writing", and the setting of the second state corresponds to "deleting". The setting of the second state may correspond to the "writing", and the setting of the first state may correspond to "deleting".

The supply of the electronic currents e1 and e2 are performed by, for example, the control unit 550. At the time of the writing operation, the control unit 550 supplies the electronic currents e1 and e2 to the stacked body SB0 for 10 nanoseconds or longer, for example. With this, for example, the direction of the magnetization 20*m* can be properly inverted by supplying the electronic currents e1 and e2. In the case of memory application that operates at high speed, the speed is set to be 1 nanosecond or longer. With this, it is possible to reduce the time for the writing operation while inverting the magnetization, for example.

Next, an example of a "reading" operation will be described.

Detecting of the direction of the magnetization 20*m* of the second magnetic layer 20 in the stacked body SB0 is performed by using, for example, magnetoresistive effect. In the magnetoresistive effect, the electric resistance is changed by the relative direction of the magnetization in each layer. In a case of using the magnetoresistive effect, for example, the magnetic resistance is measured by causing a sense current to flow between the first magnetic layer 10 and the second magnetic layer 20. A current value of the sense current is smaller than a current value corresponding to the electronic currents e1 and e2 which flow at the time of the writing (storing).

Figure 8A:
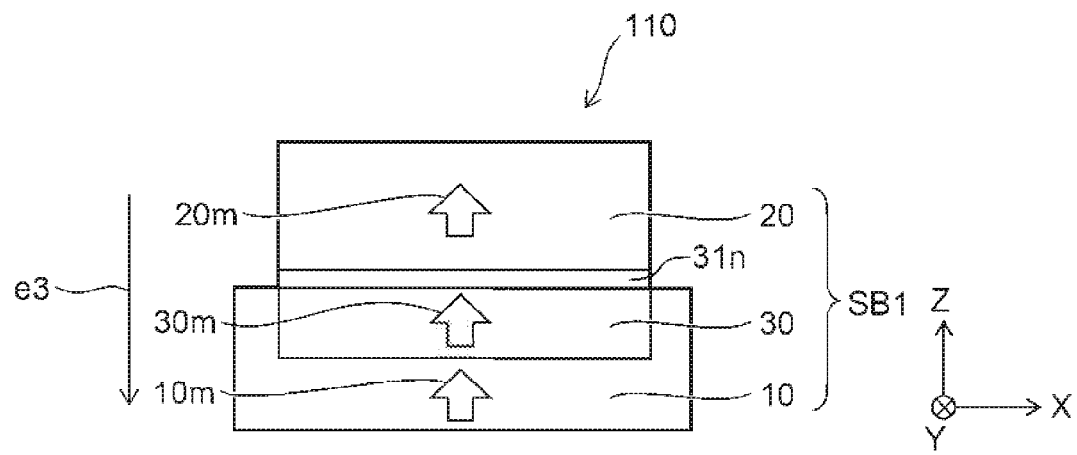
FIG. 8A and FIG. 8B are schematic diagrams illustrating an operation of the magnetic memory device according to the first embodiment.
Figure 8B:
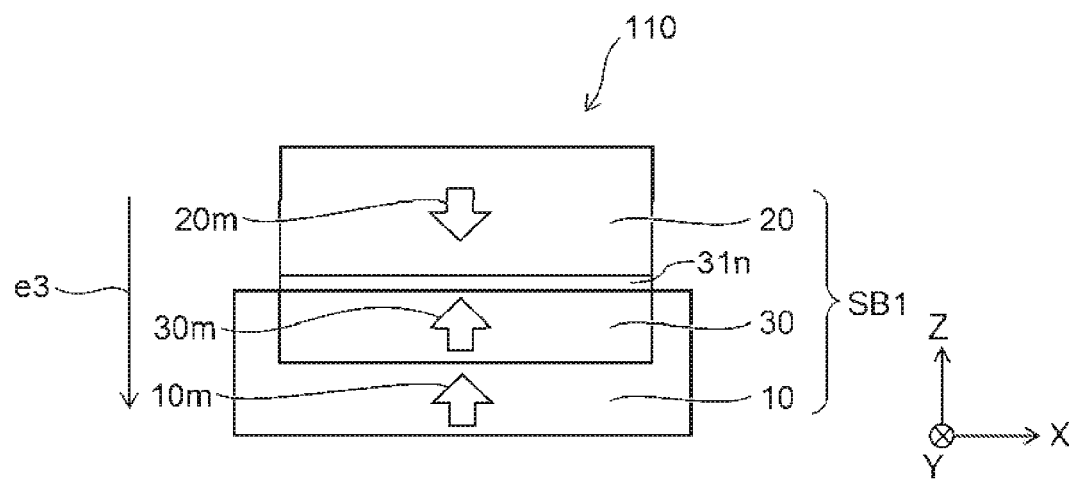

FIG. 8A and FIG. 8B are schematic diagrams illustrating an operation of the magnetic memory device according to the first embodiment.

The aforementioned diagrams illustrate a state of the first stacking layer portion SB1 at the time of operating the "reading" in the stacked body SB0. In the diagrams, the second stacking layer portion SB2, the first conductive layer 81, the second conductive layer 82, and the fifth non-magnetic layer 35*n* are not illustrated.

FIG. 8A illustrates a case where the direction of the magnetization 10*m* of the first magnetic layer 10 and the direction of the magnetization 30*m* of the third magnetic layer 30 are the same as the direction of the magnetization 20*m* of the second magnetic layer 20. FIG. 8B illustrates a case where the direction of the magnetization 10*m* of the first magnetic layer 10 and the direction of the magnetization 30*m* of the third magnetic layer 30 are anti-parallel with (opposite to) the direction of the magnetization 20*m* of the second magnetic layer 20.

As illustrated in FIG. 8A and FIG. 8B, a sense current e3 flows into the first stacking layer portion SB1 so as to detect the electrical resistance.

In the normal type magnetoresistive effect, the resistance of the state in FIG. 8A is lower than the resistance of the state in FIG. 8B. In the reverse type magnetoresistive effect, the resistance of the state in FIG. 8A is higher than the resistance of the state in FIG. 8B.

It is possible to read the memory of binary data by assigning "0" and "1" to each of a plurality of states having different resistances from each other. The direction of the sense current e3 may be opposite to the direction illustrated in FIG. 8A and FIG. 8B.

The supply of the sense current e3 is performed by, for example, the control unit 550. At the time of a reading operation, the control unit 550 supplies the sense current e3 less than for 10 nanoseconds to the stacked body SB0, for example. With this, for example, it is possible to suppress the inversion of the direction of the magnetization 20*m* by supplying the sense current e3. The sense current e3 is more preferably 5 nanoseconds or less. With this, it is possible to properly suppress the inversion of the magnetization by supplying the sense current e3.

In this way, the control unit 550 controls the time for supplying the current to the stacked body SB0 at the time of "writing" to be longer than the time for supplying the current to the stacked body SB0 at the time of the "reading". The control unit 550 supplies the current of a first time to the stacked body SB0 at the time of "writing", and supplies the current of a second time to the stacked body SB0 at the time of the "reading", for example. At this time, the first time is longer than the second time. With this, it is possible to obtain an operation of stable "writing" and an operation of stable "reading", for example.

As for a memory operation equivalent to DRAM, the writing current for 10 nanoseconds to 30 nanoseconds is assumed. On the other hand, as for the usage equivalent to a cache memory, the writing current for 1 nanosecond to 3 nanoseconds is assumed.

The writing time (the first time) is, for example, 10 nanoseconds or longer, and the reading time (the second time) is shorter than 10 nanoseconds. In the magnetization inversion for 3 nanoseconds or less, the magnetization is not easily affected by heat (an assist effect by phonon), and thus the current for inversion starts to be increased. The vicinity of 1 nanosecond is referred to as a dynamic region, and the magnetization is not affected by the phonon, and thus the current required to be inverted becomes further increased.

For example, the writing is performed for 10 nanoseconds or more, and the reading is performed for 3 nanoseconds or less. In a case where the writing is performed for in a range of 1 nanosecond to 3 nanoseconds, the reading is performed for 3 nanoseconds or less with the current value which is smaller than that in the writing, and thereby it is possible to further reduce the erroneous write rate.

As described above, in the stacked body SB0, the second stacking layer portion SB2 serves as the magnetic field generation source. The first stacking layer portion SB1 serves as a magnetic memory unit. Hereinafter, the second stacking layer portion SB2 is referred to as a magnetic field generation source or a spin torque oscillator (STO) in some cases. On the other hand, the first stacking layer portion SB1 is referred to as a magnetic memory unit or a MTJ in some cases.

As described above, the writing is performed on the second magnetic layer 20 which is a memory layer of the MTJ device by using, for example, a spin torque writing method. In such a stacked body SB0, a width of the stacked body SB0 is desirably set to be 35 nm or smaller from the request of the high recording density, for example. The width of the stacked body SB0 means a length of, for example, the X-axis direction or the Y-axis direction of the stacked body SB0. In a case where the shape in which the magnetic memory device 110 is projected on the X-Y plane is a circle or an ellipse, the width of the stacked body SB0 is a diameter (a long hole) of the stacked body SB0.

In the stacked body SB0, the first magnetic layer 10 overlaps the third magnetic layer 30 in the direction crossing the stacking direction SD1. With this, an area where the first magnetic layer 10 and the third magnetic layer 30 overlap with each other is increased. Therefore, in the stacked body SB0, the exchange coupling between the first magnetic layer 10 and the third magnetic layer 30 is further enhanced. Accordingly, in the stacked body SB0, at the time of writing, the magnetization of the third magnetic layer 30 does not easily fluctuate, and thus the writing operation is stabilized.

Hereinafter, an example of a configuration of a layer included in the magnetic memory devices 110, 111A, 111B, and 112 will be described. The following description can be applied to any magnetic memory device according to the embodiment.

As the first magnetic layer 10, the sixth magnetic layer 60, and the seventh magnetic layer 17, for example, it is favorable to use a metallic material containing at least any one of elements selected from the group consisting of iron (Fe), cobalt (Co), nickel (Ni), manganese (Mn), and chromium (Cr). Further, it is possible to use an alloy containing at least any one of metal selected from the group consisting of at least any one of selected from the above-described group, platinum (Pt), palladium (Pd), iridium (Ir), ruthenium (Ru), and rhodium (Rh).

Regarding the first magnetic layer 10, the sixth magnetic layer 60, and the seventh magnetic layer 17, the composition of magnetic materials contained in the aforementioned magnetic layers, conditions for a heat treatment thereof, and the like are adjusted. With this, it is possible to adjust the properties such as an amount of the magnetization and magnetic anisotropy. As the first magnetic layer 10, the sixth magnetic layer 60, and the seventh magnetic layer 17, it is possible to use such an amorphous alloy of rare earth—transition metal such as TbFeCo and GdFeCo. As the first magnetic layer 10, the sixth magnetic layer 60, and the seventh magnetic layer 17, a stacking structure such as Co/Pt, Co/Pd, and Co/Ni may be used. As the first magnetic layer 10, the sixth magnetic layer 60, and the seventh magnetic layer 17, an alloy such as Fe/Pt and Fe/Pd, or a stacking structure may be used. Co/Ru, Fe/Au, Ni/Cu, and the like are combined with a foundation layer so as to form a vertical magnetization film. In the first magnetic layer 10, the sixth magnetic layer 60, and the seventh magnetic layer 17, it is possible to use Co/Ru, Fe/Au, Ni/Cu, or the like by controlling the crystalline orientation of the film. In addition, an additive such as gallium (Ga), aluminum (Al), germanium (Ge), nitrogen (N), phosphorus (P), arsenic (As), boron B, and silicon (Si) may be added to the first magnetic layer 10, the sixth magnetic layer 60, and the seventh magnetic layer 17. $Mn_xGa_y$, $Mn_xGe_y$, and the like may be used for the first magnetic layer 10, the sixth magnetic layer 60, and the seventh magnetic layer 17. The composition rate of x and y may be changed.

As the third magnetic layer 30, it is possible to use a metallic material containing at least any one of elements selected from the group consisting of iron (Fe), cobalt (Co), nickel (Ni), manganese (Mn), and chromium (Cr). As the third magnetic layer 30, it is also possible to use an alloy containing at least any one of metal selected from the group consisting of at least any one of selected from the above-described group, platinum (Pt), palladium (Pd), iridium (Ir), ruthenium (Ru), and rhodium (Rh).

Regarding the third magnetic layer 30, the composition of a magnetic material contained in the third magnetic layer 30, conditions for a heat treatment thereof, and the like are adjusted. It is possible to adjust the properties such as an amount of the magnetization and magnetic anisotropy. As the third magnetic layer 30, it is possible to use such an amorphous alloy of rare earth—transition metal such as TbFeCo and GdFeCo. As the third magnetic layer 30, a stacking structure such as Co/Pt, Co/Pd, and Co/Ni may be used. As the third magnetic layer 30, an alloy such as Fe/Pt and Fe/Pd, or a stacking structure may be used. Co/Ru, Fe/Au, Ni/Cu, and the like are combined with a foundation layer so as to form a vertical magnetization film. In the third magnetic layer 30, it is possible to use Co/Ru, Fe/Au, Ni/Cu, or the like by controlling the crystalline orientation of the film. In addition, an additive such as gallium (Ga), aluminum (Al), germanium (Ge), nitrogen (N), phosphorus (P), arsenic (As), boron B, and silicon (Si) may be added to the third magnetic layer 30. CoFe, CoFeB, MnGa, MnGe, and the like may be used for the third magnetic layer 30. The composition rates of the aforementioned materials may be properly changed.

As the third magnetic layer 30, for example, Heusler alloy may be used. The Heusler alloy is an alloy having, for example, $L2_1$ structure and a composition such as $X_2YZ$. For example, the third magnetic layer 30 includes the Heusler alloy containing at least any one of Co, Mn, Fe, Ni, Cu, Rh, Ru, and Pd.

For example, the third magnetic layer 30 includes a first Heusler alloy. The first Heusler alloy contains at least one of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

When the aforementioned first Heusler alloy is used as the third magnetic layer 30, it is possible to increase saturation magnetization Ms of the third magnetic layer 30, for example.

For example, the third magnetic layer 30 may include a second Heusler alloy. The second Heusler alloy contains at least any one of $Co_2HfSn$, $Co_2ZrSn$, $Co_2HfAl$, $Co_2ZrAl$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$.

The aforementioned second Heusler alloy has relatively small saturation magnetization Ms. In the second Heusler alloy, it is possible to satisfy the expression of Ms<400 (emu/cc), for example. With this, it is possible to reduce the occurrence of leakage magnetic field in the adjacent magnetic memory device, for example.

In the fifth magnetic layer 50, for example, it is possible to use a metallic material containing at least any one of elements selected from the group consisting of Iron (Fe), cobalt (Co), nickel (Ni), manganese, (Mn) and chromium (Cr). In the fifth magnetic layer 50, it is also possible to use an alloy containing at least any one of metal selected from the group consisting of at least any one of selected from the above-described group, platinum (Pt), palladium (Pd), iridium (Ir), ruthenium (Ru), and rhodium (Rh). An additive such as gallium (Ga), aluminum (Al), germanium (Ge), nitrogen (N), phosphorus (P), arsenic (As), boron B, and silicon (Si) may be added to the fifth magnetic layer 50. For example, in the fifth magnetic layer 50, CoFe, CoFeB, CoFeSiB, NiFe, MnGa, MnGe, CoFeAl, CoFeSi, CoFeGe, CoFeSn, CoMnAl, CoMnSi, CoMnGe, CoMnSn, and the like may be used. The composition rates of the aforementioned materials may be properly changed.

For example, the fifth magnetic layer 50 includes Heusler alloy. For example, as the fifth magnetic layer 50, the Heusler alloy which contains at least any one of Co, Mn, Fe, Ni, Cu, Rh, Ru, and Pd is used. The Heusler alloy has high spin injection efficiency g (θ), for example. With this, it is possible to increase an inclination f/J in the Expression (1) described below, for example. That is, it is possible to increase the oscillating frequency with respect to the current.

For example, as the Heusler alloy, at least any one of $Co_2MnGa$, $Co_2MnAl$, $Ni_2MnIn$, $Ni_2MnGa$, $Ni_2MnSn$, $Pd_2MnSb$, $Pd_2MnSn$, $Cu_2MnAl$, $Cu_2MnSn$, $Cu_2MnIn$, $Rh_2MnGe$, and $Rh_2MnPb$ may be used.

The aforementioned Heusler alloy has relatively small magnetization Ms. For example, the magnetization Ms is 800 (emu/cc) or less. With such a Heusler alloy, it is possible to further increase an inclination f/J in the Expression (1) described below For example, as the Heusler alloy, at least any one of $Co_2FeSi$, $Co_2FeAl$, $Co_2FeGa$, $Co_2MnGe$, $Co_2MnSn$, and $Co_2MnSi$ may be used.

The Heusler alloy has relatively small magnetization Ms. For example, the magnetization Ms is in a range of 800 (emu/cc) to 1000 (emu/cc). With this, for example, it is possible to increase the magnetic field which is generated by oscillating the magnetization of the fifth magnetic layer 50. With the magnetization of the fifth magnetic layer 50, the magnetization of the fifth magnetic layer 50 is easily inverted. That is, it is possible to reduce an inversion current.

The fifth magnetic layer 50 contains at least one of $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $CU_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

It is possible to increase the saturation magnetization Ms of the fifth magnetic layer 50 by using the Heusler alloy as the fifth magnetic layer 50, for example. With this, when the second magnetic layer 20 and the fifth magnetic layer 50 are ferromagnetically coupled, antiferromagnetically coupled, or magnetostatically coupled to each other, the magnetic resonance effect is easily obtained. When the fourth magnetic layer 40 and the fifth magnetic layer 50 are ferromagnetically coupled, antiferromagnetically coupled, or magnetostatically coupled to each other, the magnetic resonance effect is easily obtained.

In a case where the fifth magnetic layer 50 is any one of the aforementioned Heusler alloy, CoFeSiB, CoFe, and CoFeB, or is an alloy of CoFe and another metal, Ms becomes increased. With this, it is possible to enhance the coupling force of the ferromagnetic coupling, the antiferromagnetic coupling, or the magnetostatic coupling which is performed between the second magnetic layer 20 and the fifth magnetic layer 50. It is possible to enhance the coupling force of the ferromagnetic coupling, the antiferromagnetic coupling, or the magnetostatic coupling which is performed between the fourth magnetic layer 40 and the fifth magnetic layer 50. The intensity of the magnetization of the fifth magnetic layer 50 is preferably in a range of 1000 to 1600 (emu/cc). On the bias of the LLG calculation, the intensity is more preferably in a range of 1000 to 1400 (emu/cc).

For example, the spin injection efficiency g (θ) is increased by using the Heusler alloy as the fifth magnetic layer 50.

For example, in the fifth magnetic layer 50 (oscillation layer), the relationship between oscillating frequency f and current density J is expressed in the following Expression (1).

$$f=\gamma/(2\pi\alpha)(h(\text{bar})/2e)(g(\theta)/Mst)J \quad (1)$$

γ represents a gyro time constant. α represents a damping constant. h (bar) represents a value obtained by dividing Planck constant by 2π. g (θ) represents the spin injection efficiency. Ms represents the magnetization of the oscillation layer (the fifth magnetic layer 50). t is the thickness (the length along the stacking direction D1) of the oscillation layer. The inclination of the oscillating properties of the fifth magnetic layer 50 is expressed by f/J in the above expression.

For example, it is possible to increase the inclination f/J in the above expression by using the Heusler alloy as the fifth magnetic layer 50. The value of oscillating frequency (f) becomes higher than that of the current density (J).

In the embodiment, in the fifth magnetic layer 50, it is desire to use such a Heusler alloy. With this, in the oscillation layer, it is possible to increase the oscillating frequency with respect to the current. It is possible to reduce the inversion current by magnetostatically coupling the oscillation layer with the memory layer.

For example, in a case where the Heusler alloy is used as the fifth magnetic layer 50, due to the magnetization of the fifth magnetic layer 50, the leakage magnetic field occurs in the vicinity in some cases. The leakage magnetic field affects an adjacent memory cell (refer to FIG. 30) in some cases, for example. In the embodiment, it is desired to use a magnetic shield 51 (refer to FIG. 28) which is described below. With this, it is possible to suppress the occurrence of the leakage magnetic field.

In the second magnetic layer 20 and the fourth magnetic layer 40, for example, it is possible to use a metallic material containing at least any one of elements selected from the group consisting of iron (Fe), cobalt (Co), nickel (Ni), manganese (Mn), and chromium (Cr). Further, in the second magnetic layer 20 and the fourth magnetic layer 40, it is also possible to use an alloy containing at least any one of metal selected from the group consisting of at least any one of selected from the above-described group, platinum (Pt), palladium (Pd), iridium (Ir), ruthenium (Ru), and rhodium (Rh).

Regarding the second magnetic layer 20 and the fourth magnetic layer 40, the composition of magnetic materials contained in the aforementioned magnetic layers, conditions for a heat treatment thereof, and the like are adjusted. For example, in the second magnetic layer 20 and the fourth magnetic layer 40, it is possible to adjust the properties such as an amount of the magnetization and magnetic anisotropy. In the second magnetic layer 20 and the fourth magnetic layer 40, it is possible to use such an amorphous alloy of rare earth—transition metal such as TbFeCo and GdFeCo. In the second magnetic layer 20 and the fourth magnetic layer 40, a stacking structure such as Co/Pt, Co/Pd, and Co/Ni may be used. In the second magnetic layer 20 and the fourth magnetic layer 40, an alloy such as Fe/Pt and Fe/Pd, or a stacking structure may be used. Co/Ru, Fe/Au, Ni/Cu, and the like are combined with a foundation layer so as to form a vertical magnetization film. In the second magnetic layer 20 and the fourth magnetic layer 40, it is possible to use Co/Ru, Fe/Au, Ni/Cu, or the like by controlling the crystalline orientation of the film. In addition, an additive such as gallium (Ga), aluminum (Al), germanium (Ge), nitrogen (N), phosphorus (P), arsenic (As), boron (B), and silicon (Si) may be added to the second magnetic layer 20 and the fourth magnetic layer 40. For example, CoFe, CoFeB, MnGa, MnGe, and the like may be used in the second magnetic layer 20 and the fourth magnetic layer 40. The composition rate of x and y may be changed.

As the second magnetic layer 20 and the fourth magnetic layer 40, for example, Heusler alloy may be used. The Heusler alloy is an alloy having, for example, $L2_1$ structure and a composition such as $X_2YZ$. For example, the second magnetic layer 20 and the fourth magnetic layer 40 include the Heusler alloy containing at least any one of Co, Mn, Fe, Ni, Cu, Rh, Ru, and Pd.

For example, the second magnetic layer 20 and the fourth magnetic layer 40 include a first Heusler alloy. The first Heusler alloy contains at least one of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

When the aforementioned first Heusler alloy is used as the second magnetic layer 20 and the fourth magnetic layer 40, it is possible to increase saturation magnetization Ms of the second magnetic layer 20 and the fourth magnetic layer 40, for example. With this, for example, it is possible to reduce the magnetic resonance frequency in the second magnetic layer 20 and the third magnetic layer 30, and thus it is possible to easily obtain the magnetic resonance effect.

For example, the second magnetic layer 20 and the fourth magnetic layer 40 may contain a second Heusler alloy. The second Heusler alloy contains at least any one of $Co_2HfSn$, $Co_2ZrSn$, $Co_2HfAl$, $Co_2ZrAl$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$.

The aforementioned second Heusler alloy has relatively small saturation magnetization Ms. For example, it is possible to satisfy the expression of Ms<400 (emu/cc). With this, it is possible to reduce the occurrence of leakage magnetic field in the adjacent magnetic memory device, for example.

In the first non-magnetic layer 31n, the second non-magnetic layer 32n, and the third non-magnetic layer 33n, for example, an insulating material can be used as a non-magnetic tunnel barrier layer. For example, as the first non-magnetic layer 31n, the second non-magnetic layer 32n, and the third non-magnetic layer 33n, it is possible to use an oxide, a nitride, or a fluoride containing at least any one of elements selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe). The non-magnetic tunnel barrier layer is, for example, a non-magnetic layer which includes an insulator, and into which the current (tunnel current) flows due to the tunnel effect when the voltage is applied. The thickness of the non-magnetic tunnel barrier layer is 2 nm or smaller, for example. With this, when the voltage is applied, the tunnel current flows into the non-magnetic tunnel barrier layer.

For example, in the first non-magnetic layer 31n, the second non-magnetic layer 32n, and the third non-magnetic layer 33n, it is possible to use $Al_2O_3$, $SiO_2$, MgO, AlN, Ta—O, Al—Zr—O, $Bi_2O_3$, $MgF_2$, $CaF_2$, $SrTiO_3$, AlLaO$_3$, Al—N—O, MgAlO, MgZnO, MgGaO, MgGaO, ZnGaO, ZnAlO, SiZnO, BaO, SrO, Vo, TiO, Mg—Li—O, Mg-V-O, Mg—Ti—O, Mg—Fe—O, Mg—Co—O, Mg—Mn—O, CaO, CaS, BaS, SrS, MgS, or Si—N—O.

As the first non-magnetic layer 31n, the second non-magnetic layer 32n, and the third non-magnetic layer 33n, it is possible to use a non-magnetic semiconductor (ZnOx, InMn, GaN, GaAs, TiOx, Zn, Te, or any one of them which is doped with the transition metal), for example. The composition rates of the aforementioned materials may be properly changed.

The thickness of each of the first non-magnetic layer 31n, the second non-magnetic layer 32n, and the third non-magnetic layer 33n is desirably in a range of approximately 0.2 nanometers (nm) to 2.0 nm. With this, for example, the uniformity of the insulating film is ensured and the resistance is suppressed to become excessively high.

In the first non-magnetic layer 31n, the second non-magnetic layer 32n, and the third non-magnetic layer 33n, it is possible to use any one of the non-magnetic tunnel barrier layer and a non-magnetic metal layer, for example.

In a case where the non-magnetic tunnel barrier layer is used, the thickness thereof is desirably in a range of approximately 0.2 nm to 2.0 nm.

Examples of the non-magnetic metal layer include any non-magnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (pd), hafnium (Hf), tantalum (Ta), tungsten (W), platinum (Pt), and bismuth (Bi), or an alloy containing two or more elements selected from the above-described group. In a case where the non-magnetic metal layer is used as the first non-magnetic layer 31n, the second non-magnetic layer 32n, and the third non-magnetic layer 33n, the thickness thereof is desirably in a range of 1.5 nm to 20 nm. With this, the magnetic layers are not coupled to each other, and it is possible to prevent a spin-polarized state of conductive electrons from releasing when passing through the non-magnetic metal layer.

As the fourth non-magnetic layer 34n and the fifth non-magnetic layer 35n, for example, the non-magnetic metal layer is used. Examples of the non-magnetic metal used as the fourth non-magnetic layer 34n and the fifth non-magnetic layer 35n include any non-magnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), titanium (Ti), tungsten (W), platinum (Pt), bismuth (Bi), iridium (Ir), and osmium (Os), or an alloy containing two or more elements selected from the above-described group.

The non-magnetic metal layer which is used as the fourth non-magnetic layer 34n and the fifth non-magnetic layer 35n may be at least any one of a conductive nitride, a conductive oxide, and a conductive fluoride which contains at least any one of elements selected from the above-described group. For example, it is possible to use TiN and TaN as the fifth non-magnetic layer 35n, for example. Further, a stacked film obtained by stacking the aforementioned materials may be used as the fifth non-magnetic layer 35n. As the fifth non-magnetic layer 35n, it is possible to use a stacked film of a Ti film, a Ru film, and a Ti film.

As the fourth non-magnetic layer 34n and the fifth non-magnetic layer 35n, it is possible to use a material having a long spin diffusion length such as copper (Cu). As the fifth non-magnetic layer 35n, it is desired to use a film (a material having a function of spin disappearance) having a short spin diffusion length such as ruthenium (Ru), or a layer which has a structure having a short spin diffusion length.

With this, it is possible to prevent control properties of the magnetization rotation of the fifth magnetic layer 50 from being deteriorated. That is, the size of the spin transfer torque for performing the precession of the fifth magnetic layer 50 is determined by the spin polarization in the sixth magnetic layer 60. With such a configuration, it is possible to independently control the magnetization of the fifth magnetic layer 50 without being affected by the spin of another electron (spin transfer torque).

Examples of the material which can obtain such a spin disappearance effect for the fourth non-magnetic layer 34n, and the fifth non-magnetic layer 35n include metal selected from the group consisting of ruthenium (Ru), tantalum (Ta), tungsten (W), platinum (pt), palladium (Pd), molybdenum (Mo), niobium (Nb), zirconium (Zr), titanium (Ti) and vanadium (V), or an alloy containing two or more elements selected from the above-described group.

The thickness of each of the fourth non-magnetic layer 34n and the fifth non-magnetic layer 35n is desirably set to be 1.4 nm or greater.

When the thickness of each of the fourth non-magnetic layer 34n and the fifth non-magnetic layer 35n is 1.4 nm or greater, in the fourth non-magnetic layer 34n and the fifth non-magnetic layer 35n, it is possible to cause the spin polarization to disappear when the conductive electrons pass through an Internal portion and an Interface of the fourth non-magnetic layer 34n, and an internal portion and an interface of the fifth non-magnetic layer 35n. In the fourth non-magnetic layer 34n and the fifth non-magnetic layer 35n, it is possible to prevent the precession of the fifth magnetic layer 50 from being changed due to the direction of the magnetization of the second magnetic layer 20.

On the other hand, when the thickness of each of the fourth non-magnetic layer 34n and the fifth non-magnetic layer 35n is greater than 20 nm, it is difficult to form a pillar of a multilayer film. Further, the intensity of the rotating magnetic field generated from the fifth magnetic layer 50 is deteriorated in the position of the second magnetic layer 20. For this reason, the thickness of each of the fourth non-magnetic layer 34n and the thickness of the fifth non-magnetic layer 35n is desirably set to be 20 nm or smaller.

As the first conductive layer 81 and the second conductive layer 82, it is possible to use, for example, a conductive magnetic material or a conductive non-magnetic material. Examples of the conductive magnetic material include materials which are substantially the same as the materials used as the fifth magnetic layer 50 and the sixth magnetic layer 60.

Examples of the conductive non-magnetic material used as the first conductive layer 81 and the second conductive layer 82 include any metal selected from the group consisting of gold (Au), copper (cu), chromium (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (pt), bismuth (Bi), and aluminum (Al), or an alloy containing two or more metals selected from the above-described group.

Further, the conductive non-magnetic material used as the first conductive layer 81 and the second conductive layer 82 may be at least any one of a conductive nitride, a conductive oxide, and a conductive fluoride which contain at least any one of elements selected from the above-described group. The conductive non-magnetic material used as the first conductive layer 81 and the second conductive layer 82 may be a carbon nanotube, a carbon nanowire and graphene.

A conductive protective film may be provided on the first conductive layer 81 and the second conductive layer 82. In this case, as the protective film, it is possible to use a material such as an alloy containing at least any one element selected from the group consisting of tantalum (Ta), ruthenium (Ru), copper (cu), gold (Au), silver (Ag), aluminum (Al), copper (Cu), gold (Au), silver (Ag), and aluminum (Al), or graphene. In consideration of an electromigration resistance and a low resistance, any one of element selected from the group consisting of copper (Cu) and aluminum (Al), or an alloy thereof is desirably used as the protective film.

A transistor is directly or indirectly connected to at least any one of the first conductive layer 81 and the second conductive layer 82 in some cases. In this case, a source portion or a drain portion of the transistor may be used as at least any one of the first conductive layer 81 and the second conductive layer 82, for example. In this case, a contact portion which is connected to the source portion or the drain portion of the transistor may be used as at least any one of the first conductive layer 81 and the second conductive layer 82, for example.

The shapes of the first stacking layer portion SB1 and the second stacking layer portion SB2 when being projected on the X-Y plane are optionally determined. The shapes of the first stacking layer portion SB1 and the second stacking layer portion SB2 when being projected on the X-Y plane are for example, a circle, an ellipse, a flat circle, a polygon, and the like. In a case where of the polygon, it is favorable to use a square or a hexagon which has three or more corners. The polygon may have rounded corners.

The shapes of the first stacking layer portion SB1 and the second stacking layer portion SB2 when being projected on the plane (for example, Z-X plane or Z-Y plane) which is parallel with the Z-axis direction are optionally determined. The shapes (shapes obtained by cutting the surface perpendicular to the film surface) of the first stacking layer portion SB1 and the second stacking layer portion SB2 when being projected on the plane which is parallel with the Z-axis direction can include a taper shape or reversed taper shape.

Next, an example of a method of manufacturing the magnetic memory device according to the first embodiment will be described. The following methods can be applied to other magnetic memory devices according to the embodiment, which are described below, by changing the manufacturing order of the layer. In the following description, a phrase "material A/material B" means that the material B is stacked on the material A.

FIG. 9A to FIG. 9F are schematic sectional views illustrating the method of manufacturing the magnetic memory device according to the first embodiment.

FIG. 10A to FIG. 10E are schematic sectional views illustrating the method of manufacturing the magnetic memory device according to the first embodiment.

As illustrated in FIG. 9A, a substrate 95A is prepared. The substrate 95A contains, for example, silicon (Si). A diameter of the substrate 95A in the X-Y plane is, for example, 300 mm. A transistor 97t is provided on the substrate 95A. The transistor 97t includes a first semiconductor region 97a, a second semiconductor region 97b, and a gate electrode 97c.

The substrate 95A overlaps the first semiconductor region 97a, the second semiconductor region 97b, the gate electrode 97c, a wire 98a, a wire 98b, and a wire 98c in the Z-axis direction. In the Z-axis direction, a portion of the first semiconductor region 97a overlaps the gate electrode 97c. In the Z-axis direction, a portion of the second semiconductor region 97b overlaps the gate electrode 97c. An insulating film (not shown) is provided between the gate electrode 97c and the substrate 95A.

In the Z-axis direction, a portion of the second semiconductor region 97b overlaps the wire 98a. The second semiconductor region 97b is electrically connected to the wire 98a. In the Z-axis direction, the wire 98a overlaps a portion of the wire 98b. The wire 98a is electrically connected to the wire 98b. In the Z-axis direction, a portion of the wire 98b overlaps the wire 98c. The wire 98b is electrically connected to the wire 98c. In the Z-axis direction, the wire 98c overlaps the seventh magnetic layer 17. The wire 98c is electrically connected to the seventh magnetic layer 17.

An insulating film 96 is provided between the substrate 95A and the seventh magnetic layer 17. The insulating film 96 contains at least any one of a silicon oxide ($SiO_2$) and a silicon nitride ($Si_3N_4$). In the Z-axis direction, a portion of the first semiconductor region 97a overlaps the insulating film 96. In the Z-axis direction, the gate electrode 97c overlaps the insulating film 96. The second semiconductor region 97b is electrically connected to the seventh magnetic layer 17 via the wire 98a, the wire 98b, and the wire 98c. The seventh magnetic layer 17 is formed on the insulating film 96 by a sputtering method or a molecular beam epitaxy (MBE) method in a reduced-pressure atmosphere.

A magnetic film 10F1 which is a portion of the first magnetic layer 10 is formed on the seventh magnetic layer 17. The magnetic film 10F1 is formed by the sputtering method or the MBE method in a vacuum. A third magnetic film 30F is formed on the magnetic film 10F1. The third magnetic film 30F is formed by the sputtering method or the MBE method in the reduced-pressure atmosphere.

As illustrated in FIG. 9B, a mask 85A is formed on the third magnetic film 30F. The mask 85A overlaps a portion of the third magnetic film 30F in the Z-axis direction. The mask 85A includes a resist. The mask 85A is patterned by an argon fluoride (ArF) immersion scanner method or an electron beam (EB) drawing method. The length of the mask 85A in the X-axis direction is in a range of 20 nm to 30 nm, for example.

As illustrated in FIG. 9C, the third magnetic film 30F which is exposed by the mask 85A is etched. The etching is used by an ion milling method or a reactive ion etching (RIE) method. With this, the third magnetic film 30F which is exposed by the mask 85A is removed. The third magnetic layer 30 is formed between the mask 85A and the magnetic film 10F1.

As illustrated in FIG. 9D, the mask 85A is removed by using an organic solvent or an oxygen ashing method.

As illustrated in FIG. 9E, in addition to the first magnetic layer 10, a magnetic film 10F2 is formed on the third magnetic layer 30 and the magnetic film 10F1, The magnetic film 10F2 overlaps the third magnetic layer 30 and the magnetic film 10F1 in the Z-axis direction. The magnetic film 10F2 is formed by the sputtering method or the MBE method in the reduced-pressure atmosphere.

As illustrated in FIG. 9F, the magnetic film 10F2 is polished by a chemical mechanical polishing (CMP) method. With this, the first magnetic layer 10 is formed on the seventh magnetic layer 17. A silica-based slurry is used to polish the magnetic film 10F2. In the polishing of the magnetic film 10F2, the third magnetic layer 30 serves as a stopper layer. The surface roughness (Ra) of the magnetic film 10F2 is controlled to be 0.1 nm, for example. The third magnetic layer 30 is provided on a portion of the first magnetic layer 10 in the Z-axis direction.

Figure 10A:
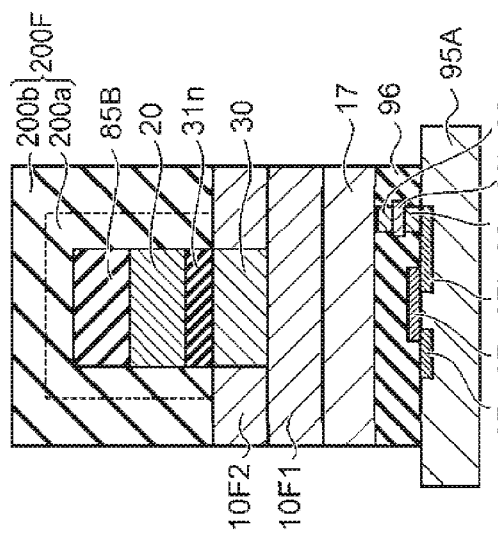
FIG. 10A to FIG. 10E are schematic sectional views illustrating the method of manufacturing the magnetic memory device according to the first embodiment.

As illustrated in FIG. 10A, a first non-magnetic film 31nf is formed on the first magnetic layer 10 and the third magnetic layer 30. The first non-magnetic film 31nf overlaps the first magnetic layer 10 and the third magnetic layer 30 in the Z-axis direction. The first non-magnetic film 31*nf* is formed by the sputtering method or the MBE method in the reduced-pressure atmosphere. The thickness of the first non-magnetic film 31*nf* is, for example, 0.1 nm. A second magnetic film 20F is formed on the first non-magnetic film 31*nf*. The second magnetic film 20F overlaps the first non-magnetic film 31*nf* in the Z-axis direction. The second magnetic film 20F is formed by the sputtering method or the MBE method in the reduced-pressure atmosphere.

Figure 10B:
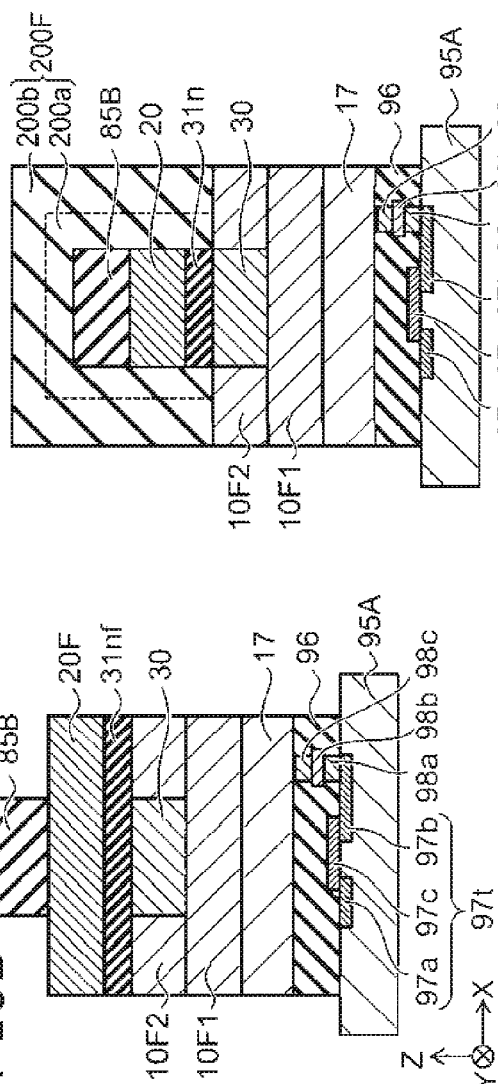

As illustrated in FIG. 10B, a mask 85B is formed on the second magnetic film 20F. The mask 85B overlaps a portion of the second magnetic film 20F in the Z-axis direction. The mask 85B contains the resist. The mask 85B is patterned by the ArF immersion scanner method or the EB drawing method. The mask 85B is positioned on the third magnetic layer 30. In the X-axis direction, the length of the mask 85B is, for example, in a range of 20 nm to 30 nm.

Figure 10C:
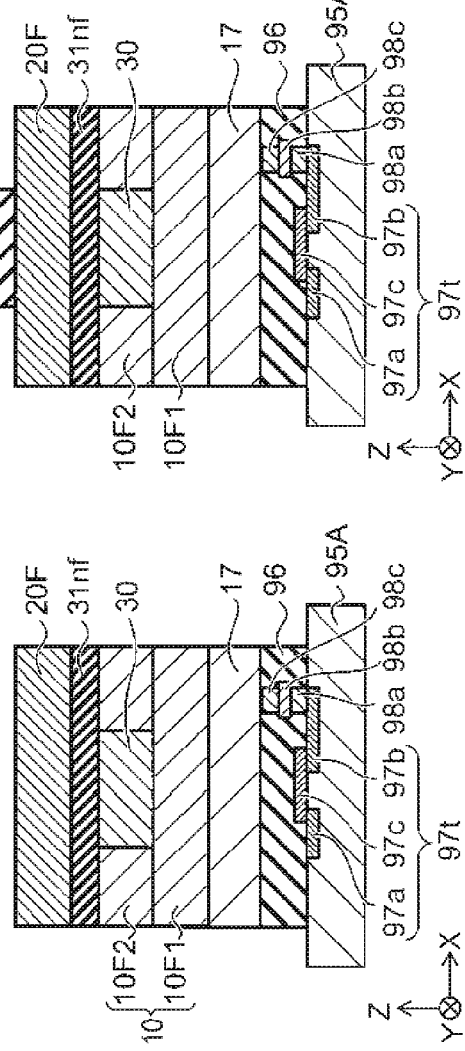

As illustrated in FIG. 10C, the second magnetic film 20F which is exposed by the mask 85B is etched. Next, the first non-magnetic film 31*nf* which is exposed by the mask 85B is etched. The etching is used by the ion milling method or the RIE method. With this, the third magnetic layer 30 and the first non-magnetic layer 31*n* are formed. The first non-magnetic layer 31*n* and the second magnetic layer 20 are formed between the mask 85B and the third magnetic layer 30. In the Z-axis direction, the second magnetic layer 20 is provided between the mask 85B and the first non-magnetic layer 31*n*.

An interlayer insulating film 200F is formed on the mask 85B and the first magnetic layer 10. The interlayer insulating film 200F is formed by the sputtering method or an atomic layer deposition (ALD) method in the reduced-pressure atmosphere. The interlayer insulating film 200F includes an insulating film 200*a* and an insulating film 200*b*. The insulating film 200*a* is a silicon nitride ($Si_3N_4$). The thickness (the length in the X-axis direction) of the insulating film 200*a* is, for example, 20 nm. The insulating film 200*b* contains a silicon oxide ($SiO_2$). The thickness (the length in the X-axis direction) of the insulating film 200*b* is, for example, 10 nm.

Figure 10D:
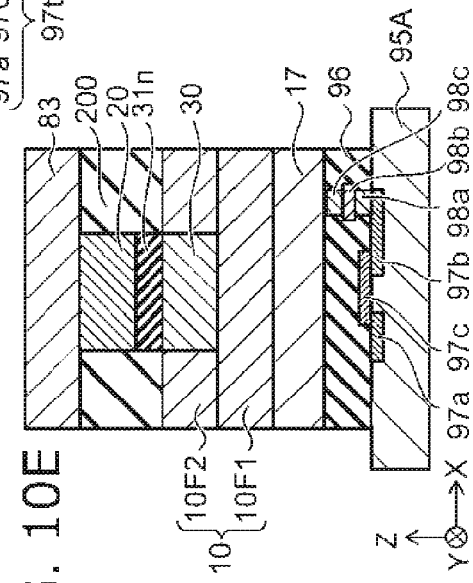

As illustrated in FIG. 10D, the interlayer insulating film 200F is polished by the CMP method. The silica-based slurry is used to polish the interlayer insulating film 200F. In the polishing of the interlayer insulating film 200F, the second magnetic layer 20 serves as a stopper layer. With this, the interlayer insulating film 200 is formed. The interlayer insulating film 200 overlaps the second magnetic layer 20 and the first non-magnetic layer 31*n* in the X-axis direction. The interlayer insulating film 200 overlaps a portion of the first magnetic layer 10 in the Z-axis direction. The interlayer insulating film 200 includes the insulating film 200*a* and the insulating film 200*b*. The insulating film 200*a* is provided between the second magnetic layer 20 and the insulating film 200*b*, and between the first non-magnetic layer 31*n* and the Insulating film 200*b*.

Figure 10E:
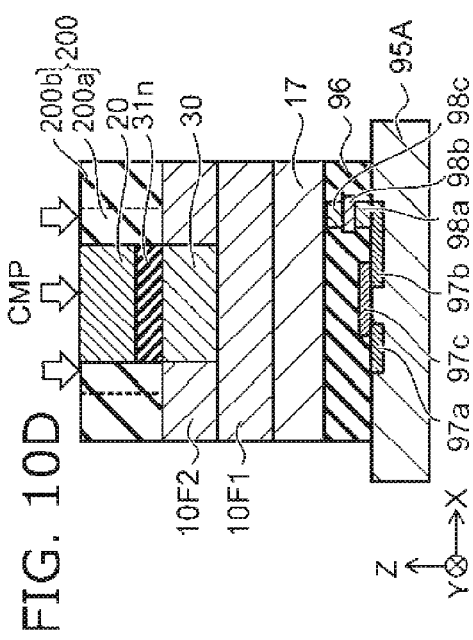

As illustrated in FIG. 10E, a third conductive layer 83 is formed on the interlayer insulating film 200 and the second magnetic layer 20. The third conductive layer 83 overlaps the interlayer insulating film 200 and the second magnetic layer 20 in the Z-axis direction. In the example, the third conductive layer 83 is connected to the second magnetic layer 20. the third conductive layer 83 is formed by the sputtering method in the reduced-pressure atmosphere.

FIG. 11A to FIG. 11F are schematic sectional views illustrating another method of manufacturing the magnetic memory device according to the first embodiment.

FIG. 12A to FIG. 12C are schematic sectional views illustrating another method of manufacturing the magnetic memory device according to the first embodiment.

As illustrated in FIG. 11A, a first magnetic film 10F3 is formed on the seventh magnetic layer 17. The first magnetic film 10F3 overlaps the seventh magnetic layer 17 in the Z-axis direction.

As illustrated in FIG. 11B, a mask 86A is formed on the first magnetic film 10F3. The mask 86A overlaps a portion of the first magnetic film 10F3 in the Z-axis direction. The mask 86A contains the resist. The mask 86A is patterned by the ArF immersion scanner method or the EB drawing method. The mask 86A includes an opening portion 86*h*. In the opening portion 86*h*, the first magnetic film 10F3 is exposed. The width of the opening portion 86*h* in the X-axis direction is, for example, in a range of 20 nm to 30 nm.

As illustrated in FIG. 11C, the first magnetic film 10F3 which is exposed by the mask 86A is etched. The etching is used by the ion milling method or the RIE method. With this, the first magnetic film 10F3 which is exposed by the mask 86A is removed. A concave portion 10*h* is formed on the first magnetic film 10F3. With this, the first magnetic layer 10 is formed on the seventh magnetic layer 17.

Next, the third magnetic layer 30 is formed in the concave portion 10*h*. The third magnetic layer 30 overlaps a portion of the first magnetic layer 10 in the Z-axis direction. The third magnetic layer 30 is formed by the sputtering method or the MBE method in the reduced-pressure atmosphere.

As illustrated in FIG. 11D, the mask 86A is removed by using the organic solvent or the oxygen ashing method.

As illustrated in FIG. 11E, the first non-magnetic film 31*nf* is formed on the first magnetic layer 10 and the third magnetic layer 30. The first non-magnetic film 31*nf* overlaps the first magnetic layer 10 and the third magnetic layer 30 in the Z-axis direction. The thickness of the first non-magnetic film 31*nf* is, for example, 0.1 nm. The second magnetic film 20F is formed on the first non-magnetic film 31*nf*. The second magnetic film 20F overlaps the first non-magnetic film 31*nf* in the Z-axis direction. The first non-magnetic film 31*nf* and the second magnetic film 20F are formed by a sputtering method or a MBE method in the reduced-pressure atmosphere.

As illustrated in FIG. 11F, a mask 86B is formed on the second magnetic film 20F. The mask 86B overlaps a portion of the second magnetic film 20F in the Z-axis direction. The mask 86B contains the resist. The mask 86B is patterned by the ArF immersion scanner method or the EB drawing method. The mask 86B is positioned on the third magnetic layer 30. In the X-axis direction, the length of the mask 86B is in a range of, for example, 20 nm to 30 nm.

As illustrated in FIG. 12A, the second magnetic film 20F which is exposed by the mask 86B is etched. Next, the first non-magnetic film 31*nf* which is exposed by the mask 86B is etched. The etching is used by the ion milling method or the RIE method. With this, the third magnetic layer 30 and the first non-magnetic layer 31*n* are formed. The first non-magnetic layer 31*n* and the second magnetic layer 20 are formed between the mask 86B and the third magnetic layer 30. In the Z-axis direction, the second magnetic layer 20 is provided between the mask 86B and the first non-magnetic layer 31*n*.

The interlayer insulating film 200F is formed on the mask 86B and the first magnetic layer 10. The interlayer insulating film 200F is formed by a sputtering method or an ALD method in the reduced-pressure atmosphere. The interlayer insulating film 200F includes the insulating film 200*a* and the insulating film 200*b*. The insulating film 200*a* contains a silicon nitride. The thickness of the insulating film 200a is, for example, 20 nm. The insulating film 200b contains a silicon oxide. The thickness of the insulating film 200b is, for example, 10 nm.

As illustrated in FIG. 12B, the interlayer insulating film 200F is polished by using the CMP method. The silica-based slurry is used to polish the interlayer insulating film 200F. In the polishing of the interlayer insulating film 200F, the second magnetic layer 20 serves as a stopper layer. With this, the interlayer insulating film 200 is formed. The interlayer insulating film 200 overlaps the second magnetic layer 20 and the first non-magnetic layer 31n in the X-axis direction. The interlayer insulating film 200 overlaps a portion of the first magnetic layer 10 in the Z-axis direction. The interlayer insulating film 200 includes the insulating film 200a and the insulating film 200b. The insulating film 200a is provided between the second magnetic layer 20 and the insulating film 200b, and between the first non-magnetic layer 31n and the insulating film 200b.

As illustrated in FIG. 12C, the third conductive layer 83 is formed on the interlayer insulating film 200 and the second magnetic layer 20. The third conductive layer 83 overlaps the interlayer insulating film 200 and the second magnetic layer 20 in the Z-axis direction. In the example, the third conductive layer 83 is connected to the second magnetic layer 20. The third conductive layer 83 is formed by a sputtering method in the reduced-pressure atmosphere.

FIG. 13A to FIG. 13F are schematic sectional views illustrating another method of manufacturing the magnetic memory device according to the first embodiment.

FIG. 14A to FIG. 14F are schematic sectional views illustrating another method of manufacturing the magnetic memory device according to the first embodiment.

FIG. 15A to FIG. 15D are schematic sectional views illustrating another method of manufacturing the magnetic memory device according to the first embodiment.

Figure 13A:
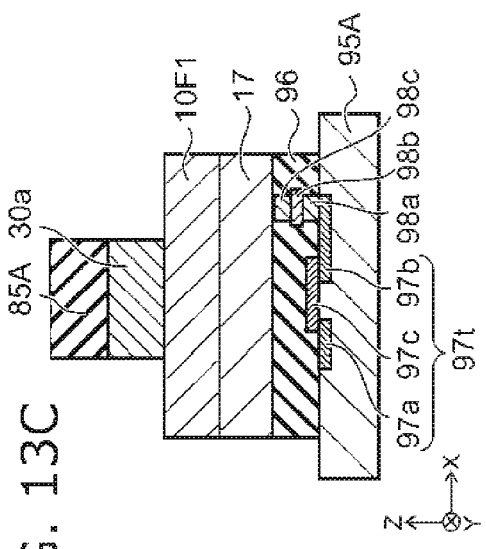
FIG. 13A to FIG. 13F are schematic sectional views illustrating another method of manufacturing the magnetic memory device according to the first embodiment.

As illustrated in FIG. 13A, the magnetic film 10F1 which is a portion of the first magnetic layer 10 is formed on the seventh magnetic layer 17. The magnetic film 10F1 is formed by the sputtering method or the MBE method in the reduced-pressure atmosphere. A third magnetic film 30F1 is formed on the magnetic film 10F1. The third magnetic film 30F1 is formed by the sputtering method or the MBE method in the reduced-pressure atmosphere.

Figure 13B:
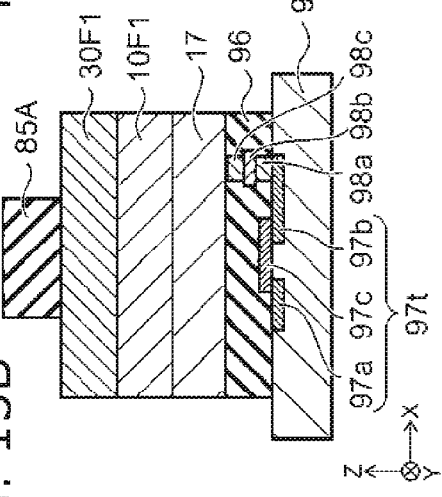

As illustrated in FIG. 13B, the mask 85A is formed on the third magnetic film 30F1. The mask 85A overlaps a portion of the third magnetic film 30F1 in the Z-axis direction. The mask 85A contains the resist. The mask 85A is patterned by the ArF immersion scanner method or the EB drawing method. The length of the mask 85A in the X-axis direction is in a range of, for example, 20 nm to 30 nm.

Figure 13C:
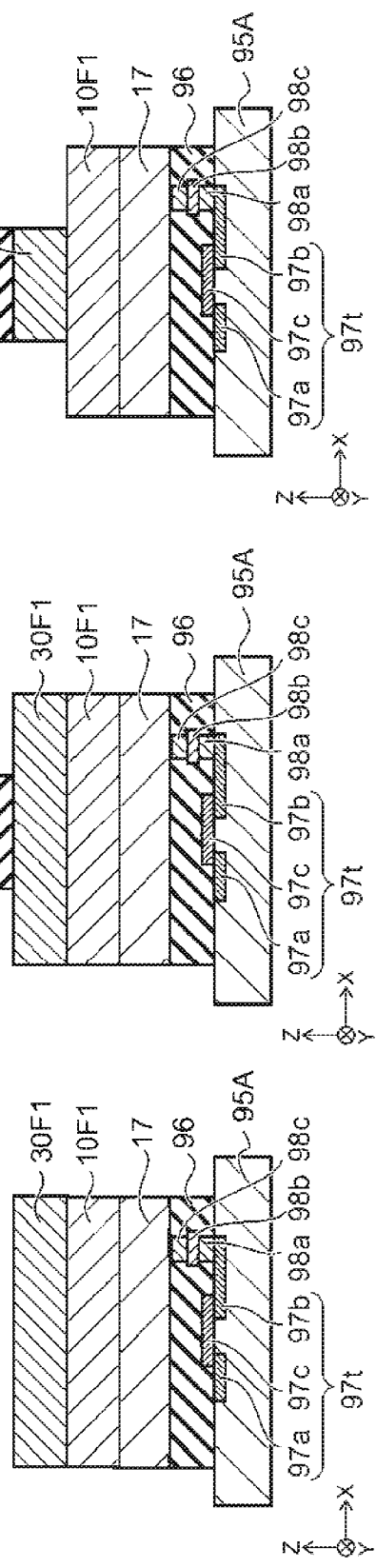

As illustrated in FIG. 13C, the third magnetic film 30F1 which is exposed by the mask 85A is etched. The etching is used by the ion milling method or the RIE method. With this, the third magnetic film 30F1 which is exposed by the mask 85A is removed. A third magnetic layer 30a is formed between the mask 85A and magnetic film 10F1.

Figure 13D:
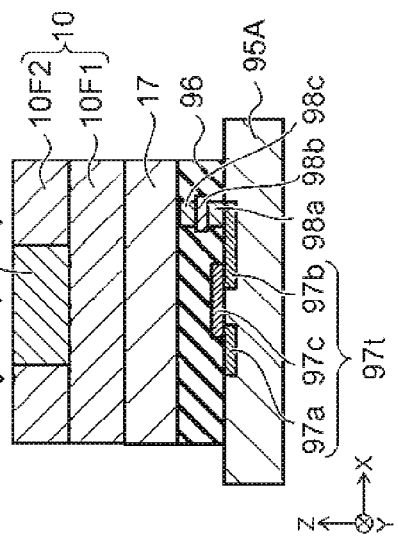

As illustrated in FIG. 13D, the mask 85A is removed by using the organic solvent or the oxygen ashing method.

Figure 13E:
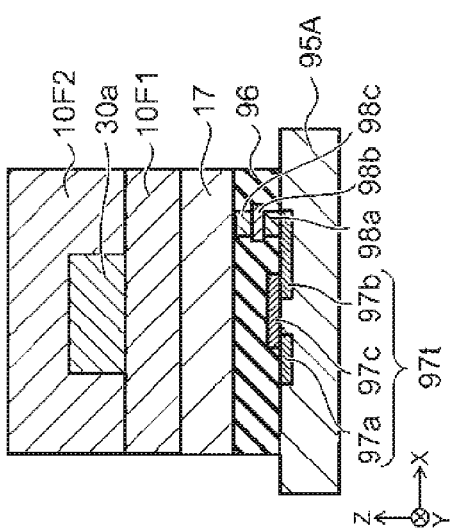

As illustrated in FIG. 13E, the magnetic film 10F2 which is another one portion of the first magnetic layer 10 is formed on the third magnetic layer 30a and the magnetic film 10F1 which is a portion of the first magnetic layer 10. The magnetic film 10F2 overlaps the third magnetic layer 30a and the magnetic film 10F1 in the Z-axis direction. The magnetic film 10F2 is formed by the sputtering method or the MBE method in the reduced-pressure atmosphere.

Figure 13F:
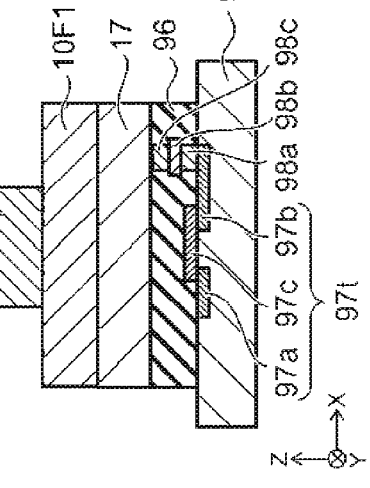

As illustrated in FIG. 13F, the magnetic film 10F2 is polished by using the CMP method. With this, the first magnetic layer 10 is formed on the seventh magnetic layer 17. The silica-based slurry is used to polish the magnetic film 10F2. In the polishing of the magnetic film 10F2, the third magnetic layer 30a serves as a stopper layer. The surface roughness (Ra) of the magnetic film 10F2 is controlled to be 0.1 nm, for example. The third magnetic layer 30a is provided on a portion of the first magnetic layer 10 in the Z-axis direction.

As illustrated in FIG. 14A, a substrate 95B is prepared. The substrate 95B contains silicon. A diameter of the substrate 95B in the X-Y plane is, for example, 300 mm. The second magnetic film 20F is formed on the substrate 95B. The second magnetic film 20F overlaps the substrate 95B in the Z-axis direction. The first non-magnetic film 31nf is formed on the second magnetic film 20F. The first non-magnetic film 31nf overlaps the second magnetic film 20F in the Z-axis direction. The thickness of the first non-magnetic film 31nf is, for example, 1 nm. A third magnetic film 30F2 is formed on a first non-magnetic film 31nf. The third magnetic film 30F2 overlaps the first non-magnetic film 31nf in the Z-axis direction. The second magnetic film 20F, the first non-magnetic film 31nf, and the third magnetic film 30F2 are formed by the sputtering method or the MBE method in the reduced-pressure atmosphere.

As illustrated in FIG. 14B, a mask 85C is formed on the third magnetic film 30F2. The mask 85C overlaps a portion of the third magnetic film 30F2 in the Z-axis direction. The mask 85C contains the resist. The mask 85C is patterned by the ArF immersion scanner method or the EB drawing method. In the X-axis direction, the length of the mask 85C is in a range of, for example, 20 nm to 30 nm.

As illustrated in FIG. 14C, the third magnetic film 30F2 which is exposed by the mask 85C is etched. Next, the first non-magnetic film 31nf which is exposed by the mask 85C is etched. Next, the second magnetic film 20F which is exposed by the mask 85C is etched. The etching is used by the ion milling method or the RIE method.

With this, the third magnetic layer 30b, the first non-magnetic layer 31n, and the second magnetic layer 20 are formed on the substrate 95B. The first non-magnetic layer 31n and the third magnetic layer 30b are formed between the mask 85C and the second magnetic layer 20. In the Z-axis direction, the third magnetic layer 30b is provided between the mask 85C and the first non-magnetic layer 31n. In the Z-axis direction, the first non-magnetic layer 31n is provided between the third magnetic layer 30b and the second magnetic layer 20.

As illustrated in FIG. 14D, the mask 85C is removed by using the organic solvent or the oxygen ashing method.

As illustrated in FIG. 14E, the interlayer insulating film 200F is formed on the substrate 95B and the third magnetic layer 30b. The interlayer insulating film 200F is formed by the sputtering method or the ALD method in the reduced-pressure atmosphere. The interlayer insulating film 200F includes the insulating film 200a and the insulating film 200b. The insulating film 200a contains a silicon nitride. The thickness of the insulating film 200a is, for example, 20 nm. The insulating film 200b contains a silicon oxide. The thickness of the insulating film 200b is, for example, 10 nm.

As illustrated in FIG. 14F, the interlayer insulating film 200F is polished by using the CMP method. The silica-based slurry is used to polish the interlayer insulating film 200F. In the polishing of the interlayer insulating film 200F, the third magnetic layer 30b serves as a stopper layer. With this, the interlayer insulating film 200 is formed. The surface roughness (Ra) of the third magnetic layer 30b is controlled to be 0.1 nm, for example.

The interlayer insulating film 200 overlaps the third magnetic layer 30b, the second magnetic layer 20, and the first non-magnetic layer 31n in the X-axis direction. The interlayer insulating film 200 overlaps a portion of the substrate 95B in the Z-axis direction. The interlayer insulating film 200 includes the Insulating film 200a and the insulating film 200b. The insulating film 200a is provided between the third magnetic layer 30b and the insulating film 200b, between the second magnetic layer 20 and the insulating film 200b, and between the first non-magnetic layer 31n and the insulating film 200b.

Figure 15A:
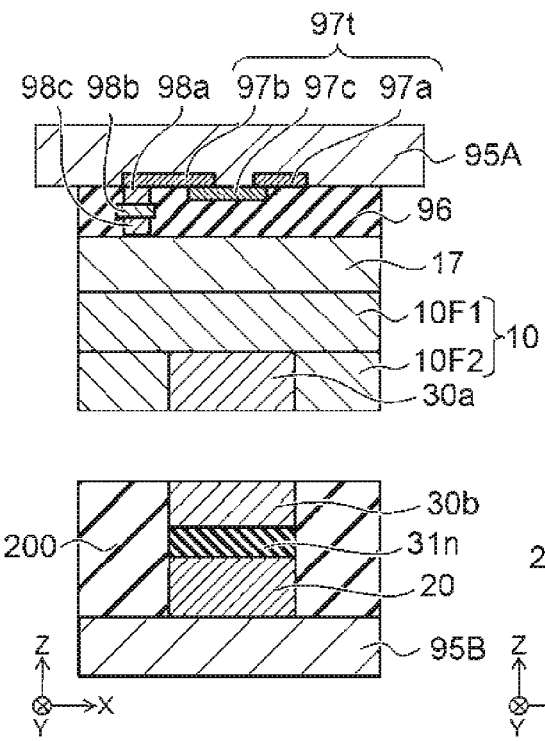
FIG. 15A to FIG. 15D are schematic sectional views illustrating another method of manufacturing the magnetic memory device according to the first embodiment.

As illustrated in FIG. 15A, the third magnetic layer 30a and the third magnetic layer 30b face each other. In the example, the interlayer insulating film 200 and the first magnetic layer 10 face each other. For example, an oxide or an adsorption layer which is attached to the third magnetic layer 30a and the third magnetic layer 30b is removed by an Ar ion beam or an Ar neutral atom beam in advance at $1 \times 10^{-6}$ Pa or less in the reduced-pressure atmosphere.

Figure 15B:
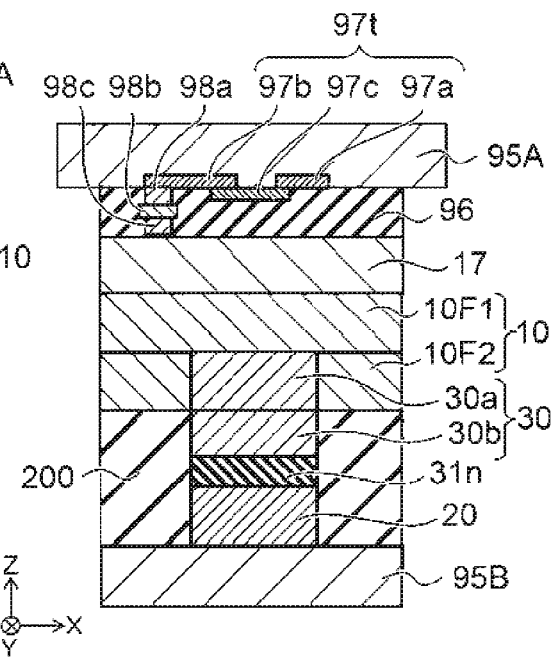

As illustrated in FIG. 15B, the third magnetic layer 30a and the third magnetic layer 30b are bonded to each other by using a surface activation room temperature bonding method. For example, the third magnetic layer 30a and the third magnetic layer 30b are bonded to each other by applying a load thereto at $1 \times 10.6$ Pa or less in the reduced-pressure atmosphere. With this, the third magnetic layer 30 is formed. The third magnetic layer 30 includes the third magnetic layer 30a and the third magnetic layer 30b.

A pressure load at the time of bonding is in a range of, for example, 0.1 tons to 10 tons. The bonding is performed at room temperature. A bonding strength of the third magnetic layer 30a and the third magnetic layer 30b is, for example, 10 MPa. With this, it is possible to obtain the sufficient strength as the bonding strength of the third magnetic layer 30a and the third magnetic layer 30b.

At the time of bonding, the third magnetic layer 30a and the third magnetic layer 30b may be heated at approximately 200° C., for example. The third magnetic layer 30a and the third magnetic layer 30b may be bonded at room temperature, and then may be heated at approximately 200° C., for example. With this, the bonding strength of the third magnetic layer 30a and the third magnetic layer 30b is enhanced.

Figure 15C:
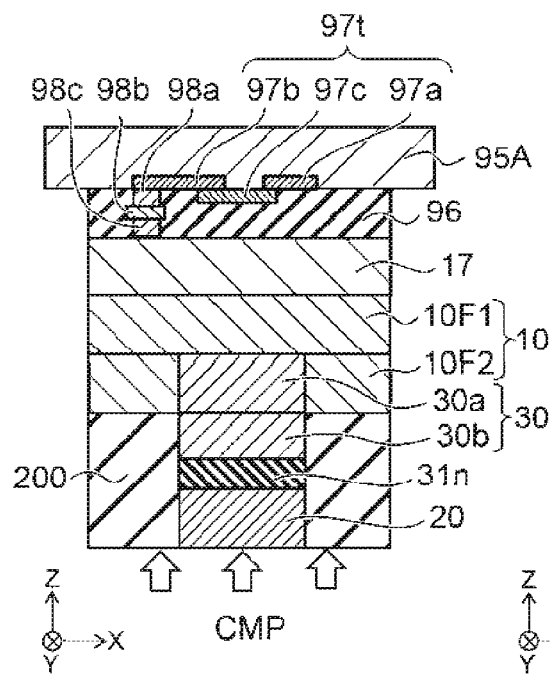

As illustrated in FIG. 15C, the substrate 95B is removed by a grinding method and the CMP method. The thickness of the substrate 95B before being ground is, for example, 775 μm. The substrate 95B is ground in advance until the thickness of the substrate 95B becomes 30 μm, for example. After that, as a finishing work, the thickness of the substrate 95B is ground until the substrate 95B becomes 4 μm, for example. Then, the substrate 95B is completely removed by the CMP treatment. In the CMP method, the silica-based slurry is used. In the CMP treatment, the second magnetic layer 20 serves as a stopper layer. In addition, the substrate 95B may be etched by a KOH aqueous solution instead of grinding the substrate 95B.

Figure 15D:
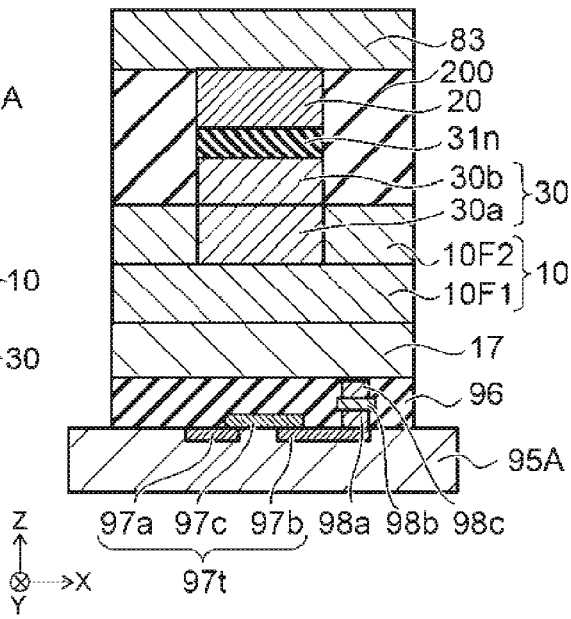

As illustrated in FIG. 15D, the third conductive layer 83 is formed on the interlayer insulating film 200 and the second magnetic layer 20. The third conductive layer 83 overlaps the interlayer insulating film 200 and the second magnetic layer 20 in the Z-axis direction. In the example, the third conductive layer 83 is connected to the second magnetic layer 20. The third conductive layer 83 is formed by the sputtering method in the reduced-pressure atmosphere.

FIG. 16A to FIG. 16D are schematic sectional views illustrating another method of manufacturing the magnetic memory device according to the first embodiment.

Figure 17A:
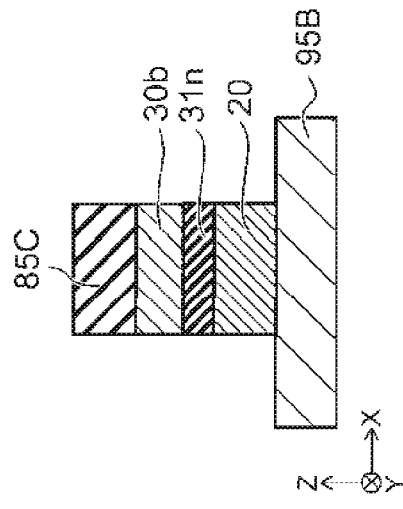
FIG. 17A and FIG. 17F are schematic sectional views illustrating another method of manufacturing the magnetic memory device according to the first embodiment.
Figure 17B:
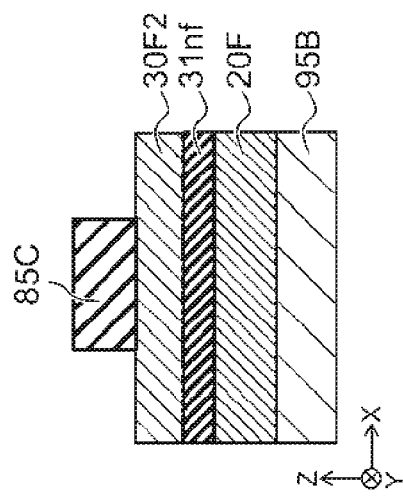
Figure 17C:
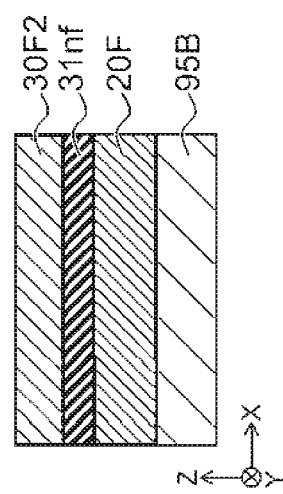
Figure 17D:
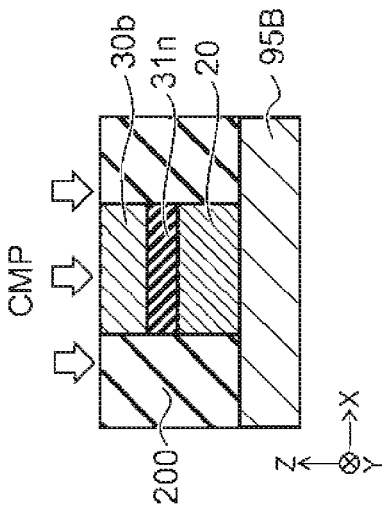
Figure 17E:
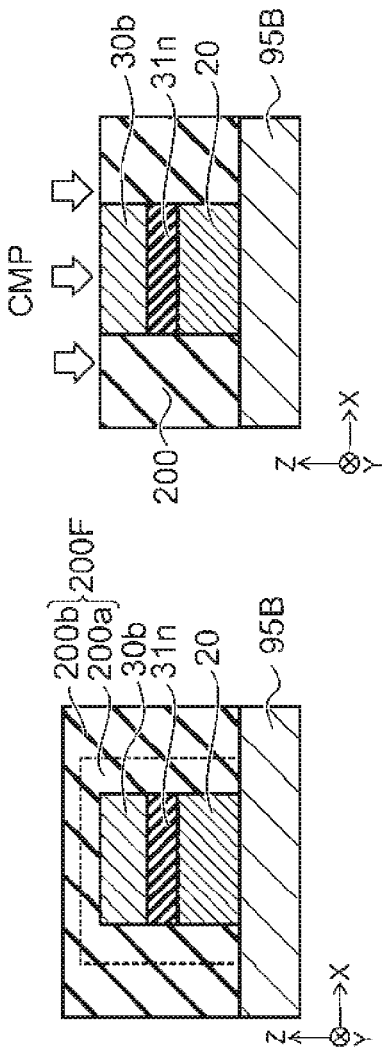
Figure 17F:
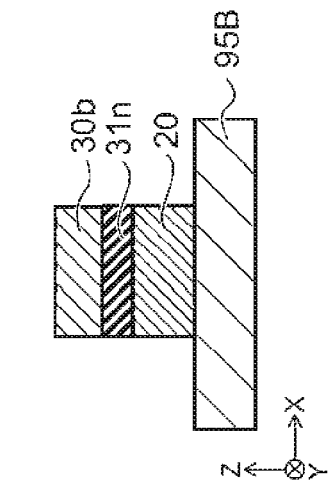

FIG. 17A and FIG. 17F are schematic sectional views illustrating another method of manufacturing the magnetic memory device according to the first embodiment.

FIG. 18A to FIG. 18D are schematic sectional views illustrating another method of manufacturing the magnetic memory device according to the first embodiment.

Figure 16A:
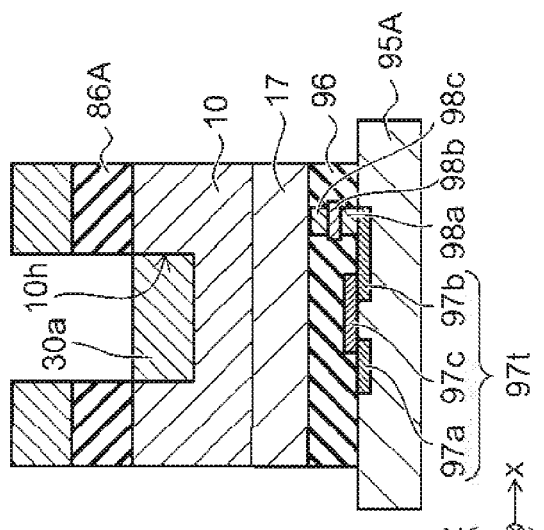
FIG. 16A to FIG. 16D are schematic sectional views illustrating another method of manufacturing the magnetic memory device according to the first embodiment.

As illustrated in FIG. 16A, the first magnetic film 10F3 is formed on the seventh magnetic layer 17. The first magnetic film 10F3 overlaps the seventh magnetic layer 17 in the Z-axis direction.

Figure 16B:
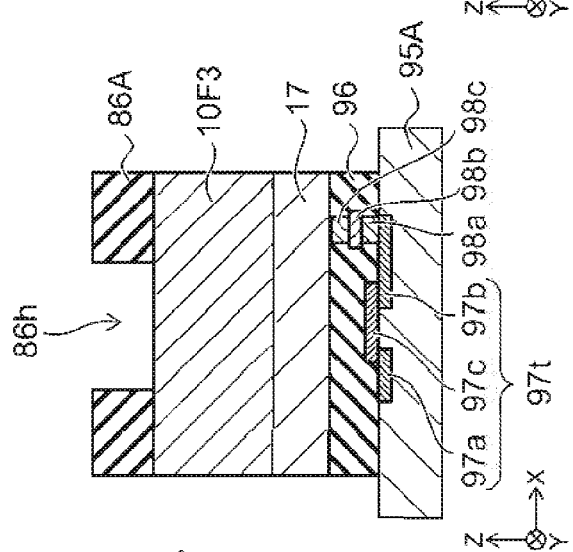

As illustrated in FIG. 16B, the mask 86A is formed on the first magnetic film 10F3. The mask 86A overlaps a portion of the first magnetic film 10F3 in the Z-axis direction. The mask 86A contains the resist. The mask 86A is patterned by the ArF immersion scanner method or the EB drawing method. The mask 86A has the opening portion 86h. In the opening portion 86h, the first magnetic film 10F3 is exposed. The width of the opening portion 86h in the X-axis direction is, for example, in a range of 20 nm to 30 nm.

Figure 16C:
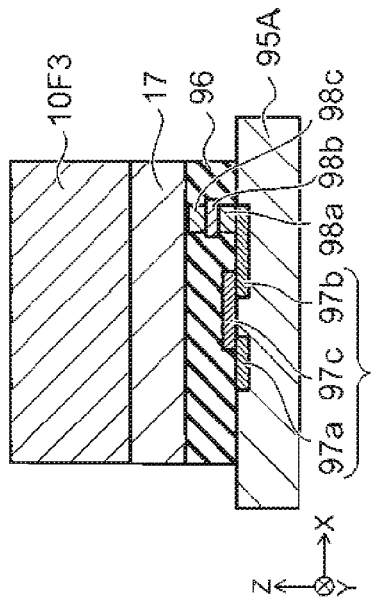

As illustrated in FIG. 16C, the first magnetic film 10F3 which is exposed by the mask 86A is etched. The etching is used by the ion milling method or the RIE method. With this, the first magnetic film 10F3 which is exposed by the mask 86A is removed. The concave portion 10h is formed on the first magnetic film 10F3. With this, the first magnetic layer 10 is formed on the seventh magnetic layer 17.

Next, the third magnetic layer 30 is formed in the concave portion 10h. The third magnetic layer 30 overlaps a portion of the first magnetic layer 10 in the Z-axis direction. The third magnetic layer 30 is formed by the sputtering method or the MBE method in the reduced-pressure atmosphere.

Figure 16D:
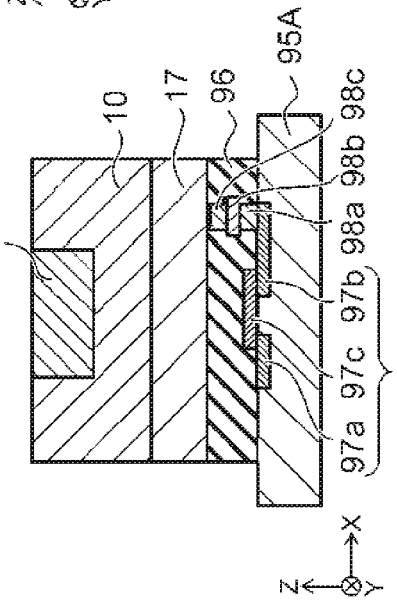

As illustrated in FIG. 16D, the mask 86A is removed by using the organic solvent or the oxygen ashing method.

As illustrated in FIG. 17A, the substrate 95B is prepared. The substrate 95B contains silicon. A diameter of the substrate 95B in the X-Y plane is, for example, 300 mm. The second magnetic film 20F is formed on the substrate 95B. The second magnetic film 20F overlaps the substrate 95B in the Z-axis direction. The first non-magnetic film 31nf is formed on the second magnetic film 20F. The first non-magnetic film 31nf overlaps the second magnetic film 20F in the Z-axis direction. The thickness of the first non-magnetic film 31nf is, for example, 1 nm. A third magnetic film 30F2 is formed on a first non-magnetic film 31nf. The third magnetic film 30F2 overlaps the first non-magnetic film 31nf in the Z-axis direction. The second magnetic film 20F, the first non-magnetic film 31nf, and the third magnetic film 30F2 are formed by the sputtering method or the MBE method in the reduced-pressure atmosphere.

As illustrated in FIG. 17B, the mask 85C is formed on the third magnetic film 30F2. The mask 85C overlaps a portion of the third magnetic film 30F2 in the Z-axis direction. The mask 85C contains the resist. The mask 85C is patterned by the ArF immersion scanner method or the EB drawing method. In the X-axis direction, the length of the mask 85C is in a range of, for example, 20 nm to 30 nm.

As illustrated in FIG. 17C, the third magnetic film 30F2 which is exposed by the mask 85C is etched. Next, the first non-magnetic film 31nf which is exposed by the mask 85C is etched. Next, the second magnetic film 20F which is exposed by the mask 85C is etched. The etching is used by the ion milling method or the RIE method.

With this, the third magnetic layer 30b, the first non-magnetic layer 31n, and the second magnetic layer 20 are formed on the substrate 95B. The first non-magnetic layer 31n and the third magnetic layer 30b are formed between the mask 85C and the second magnetic layer 20. In the Z-axis direction, the third magnetic layer 30b is provided between the mask 85C and the first non-magnetic layer 31n. In the Z-axis direction, the first non-magnetic layer 31n is provided between the third magnetic layer 30b and the second magnetic layer 20.

As illustrated in FIG. 17D, the mask 85C is removed by using the organic solvent or the oxygen ashing method.

As illustrated in FIG. 17E, the interlayer insulating film 200F is formed on the substrate 95B and the third magnetic layer 30b. The interlayer insulating film 200F is formed by the sputtering method or the ALD method in the reduced-pressure atmosphere. The interlayer insulating film 200F includes the insulating film 200a and the insulating film 200b. The insulating film 200a contains a silicon nitride. The thickness of the insulating film 200a is, for example, 20 nm. The insulating film 200b contains a silicon oxide. The thickness of the insulating film 200b is, for example, 10 nm.

As illustrated in FIG. 17F, the interlayer insulating film 200F is polished by using the CMP method. The silica-based slurry is used to polish the interlayer insulating film 200F. In the polishing of the interlayer insulating film 200F, the third magnetic layer 30b serves as a stopper layer. With this, the interlayer insulating film 200 is formed. The surface roughness (Ra) of the third magnetic layer 30b is controlled to be 0.1 nm, for example.

The interlayer insulating film 200 overlaps the third magnetic layer 30b, the second magnetic layer 20, and the first non-magnetic layer 31n in the X-axis direction. The interlayer insulating film 200 overlaps a portion of the substrate 95B in the Z-axis direction. The interlayer insulating film 200 includes the insulating film 200a and the insulating film 200b. The insulating film 200a is provided between the third magnetic layer 30b and the insulating film 200b, between the second magnetic layer 20 and the insulating film 200b, and between the first non-magnetic layer 31n and the insulating film 200b.

Figure 18A:
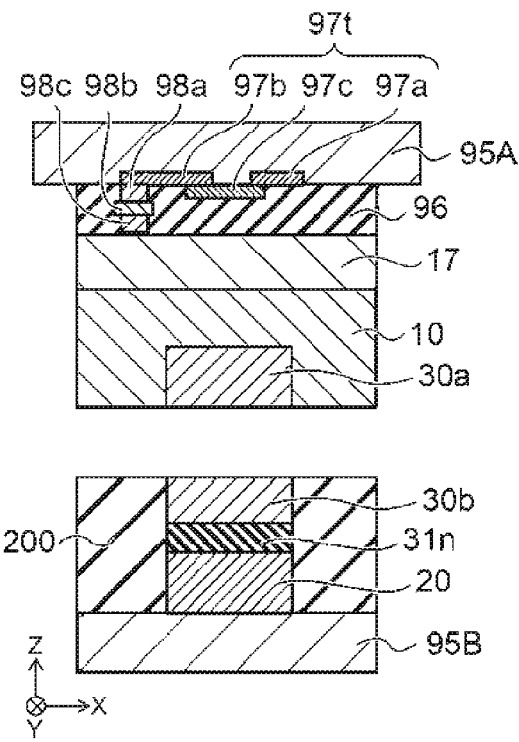
FIG. 18A to FIG. 18D are schematic sectional views illustrating another method of manufacturing the magnetic memory device according to the first embodiment.

As illustrated in FIG. 18A, the third magnetic layer 30a and the third magnetic layer 30b face each other. In the example, the interlayer insulating film 200 and the first magnetic layer 10 face each other. For example, an oxide or an adsorption layer which is attached to the third magnetic layer 30a and the third magnetic layer 30b is removed by an Ar ion beam or an Ar neutral atom beam in advance at $1 \times 10^{-6}$ Pa or less in the reduced-pressure atmosphere.

Figure 18B:
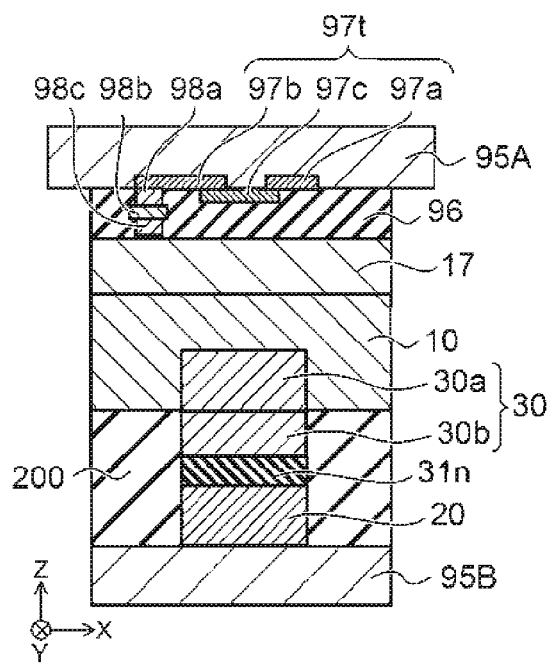

As illustrated in FIG. 18B, the third magnetic layer 30a and the third magnetic layer 30b are bonded to each other by using a surface activation room temperature bonding method. For example, the third magnetic layer 30a and the third magnetic layer 30b are bonded to each other by applying a load thereto at $1 \times 10^{-6}$ Pa or less in the reduced-pressure atmosphere. With this, the third magnetic layer 30 is formed. The third magnetic layer 30 includes the third magnetic layer 30a and the third magnetic layer 30b.

A pressure load at the time of bonding is in a range of, for example, 0.1 tons to 10 tons. The bonding is performed at room temperature. A bonding strength of the third magnetic layer 30a and the third magnetic layer 30b is, for example, 10 MPa. It is possible to obtain the sufficient strength as the bonding strength of the third magnetic layer 30a and the third magnetic layer 30b.

At the time of bonding, the third magnetic layer 30a and the third magnetic layer 30b may be heated at approximately 200° C., for example. The third magnetic layer 30a and the third magnetic layer 30b may be bonded at room temperature, and then may be heated at approximately 200° C., for example. With this, the bonding strength of the third magnetic layer 30a and the third magnetic layer 30b is enhanced.

Figure 18C:
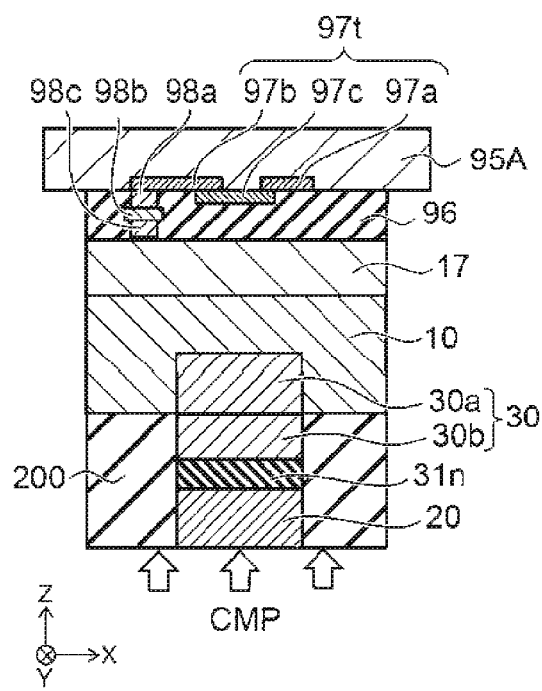

As illustrated in FIG. 18C, the substrate 95B is removed by a grinding method and the CMP method. The thickness of the substrate 95B before being ground is, for example, 775 μm. The substrate 95B is ground in advance until the thickness of the substrate 95B becomes 30 μm, for example. After that, as a finishing work, the thickness of the substrate 95B is ground until the substrate 95B becomes 4 μm, for example. Then, the substrate 95B is completely removed by the CMP treatment. In the CMP method, the silica-based slurry is used. In the CMP treatment, the second magnetic layer 20 serves as a stopper layer. In addition, the substrate 95B may be etched by a KOH aqueous solution instead of grinding the substrate 95B.

Figure 18D:
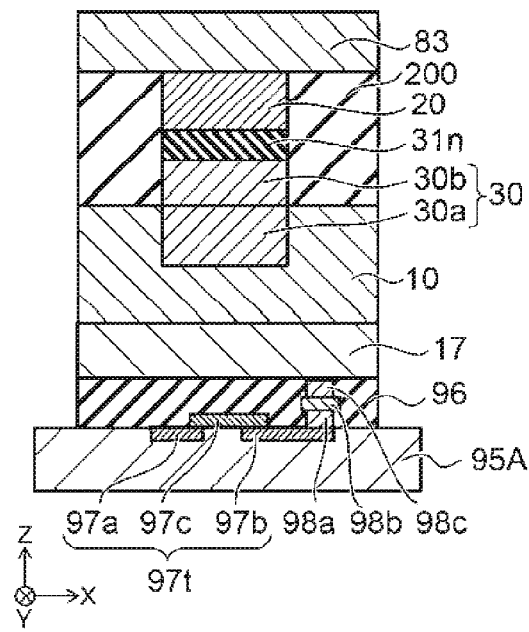

As illustrated in FIG. 18D, the third conductive layer 83 is formed on the interlayer insulating film 200 and the second magnetic layer 20. The third conductive layer 83 overlaps the interlayer insulating film 200 and the second magnetic layer 20 in the Z-axis direction. In the example, the third conductive layer 83 is connected to the second magnetic layer 20. The third conductive layer 83 is formed by the sputtering method in the reduced-pressure atmosphere.

FIG. 19A to FIG. 19F are schematic sectional views illustrating another method of manufacturing the magnetic memory device according to the first embodiment.

FIG. 20A to FIG. 20D are schematic sectional views illustrating another method of manufacturing the magnetic memory device according to the first embodiment.

As illustrated in FIG. 19A, the first magnetic film 10F3 is formed on the seventh magnetic layer 17. The first magnetic film 10F3 is formed by the sputtering method or the MBE method in the reduced-pressure atmosphere. The third magnetic film 30F1 is formed on the first magnetic film 10F3. The third magnetic film 30F1 is formed by the sputtering method or the MBE method in the reduced-pressure atmosphere.

As illustrated in FIG. 19B, the mask 85A is formed on the third magnetic film 30F1. The mask 85A overlaps a portion of the third magnetic film 30F1 in the Z-axis direction. The mask 85A contains the resist. The mask 85A is patterned by the ArF immersion scanner method or the EB drawing method. The length of the mask 85A in the X-axis direction is in a range of, for example, 20 nm to 30 nm.

As illustrated in FIG. 19C, the third magnetic film 30F1 which is exposed by the mask 85A is etched. The etching is used by the ion milling method or the RIE method. With this, the third magnetic film 30F1 which is exposed by the mask 85A is removed. A third magnetic layer 30 is formed between the mask 85A and the first magnetic film 10F3.

In the example, a portion of the first magnetic film 10F3 which is exposed by the mask 85A is etched by the ion milling method or the RIE method. With this, a portion of the first magnetic film 10F3 is redeposited on a side surface 85w of the mask 85A and a side surface 30w of the third magnetic layer 30. Accordingly, for example, a magnetic film 10d overlapping the third magnetic layer 30 is formed in the X-axis direction. The thickness of the magnetic film 10d in the X-axis direction is in a range of, for example, 2 nm to 3 nm. In the example, a layer including the magnetic film 10d and the first magnetic film 10F3 is set as the first magnetic layer 10.

As illustrated in FIG. 19D, the interlayer insulating film 200F is formed on the mask 85A and the first magnetic layer 10. The interlayer insulating film 200F is formed by a sputtering method in the reduced-pressure atmosphere. The Interlayer insulating film 200F includes the insulating film 200a and the insulating film 200b. The insulating film 200a contains a silicon nitride. The thickness of the insulating film 200a is, for example, 20 nm. The insulating film 200b contains a silicon oxide. The thickness of the insulating film 200b is, for example, 10 nm.

As illustrated in FIG. 19E, the interlayer insulating film 200F is polished by using the CMP method. The silica-based slurry is used to polish the interlayer insulating film 200F. In the polishing of the interlayer insulating film 200F, the third magnetic layer 30 serves as a stopper layer. With this, the interlayer insulating film 200 is formed. The interlayer insulating film 200 overlaps the third magnetic layer 30 via a portion of the first magnetic layer 10 in the X-axis direction. The interlayer insulating film 200 overlaps a portion of the first magnetic layer 10 in the Z-axis direction. The interlayer insulating film 200 includes the insulating film 200a and the insulating film 200b. The mask 85A may be removed by using the organic solvent or the oxygen ashing method.

As illustrated in FIG. 19F, the first non-magnetic film 31nf is formed on the interlayer insulating film 200, the first magnetic layer 10, and the third magnetic layer 30. The first non-magnetic film 31nf overlaps the interlayer insulating film 200, the first magnetic layer 10, and the third magnetic layer 30 in the Z-axis direction. The second magnetic film 20F is formed on the first non-magnetic film 31nf. The second magnetic film 20F overlaps the first non-magnetic film 31nf in the Z-axis direction. The first non-magnetic film 31nf and the second magnetic film 20F are formed by the sputtering method or the MBE method in the reduced-pressure atmosphere.

As illustrated in FIG. 20A, a mask 85B is formed on the second magnetic film 20F. The mask 85B overlaps a portion of the second magnetic film 20F in the Z-axis direction. The mask 85B contains the resist. The mask 85B is patterned by the ArF immersion scanner method or the EB drawing method. The mask 85B is positioned on the third magnetic layer 30. In the X-axis direction, the length of the mask 85B is, for example, in a range of 20 nm to 30 nm.

As illustrated in FIG. 20B, the second magnetic film 20F which is exposed by the mask 85B is etched. Next, the first non-magnetic film 31nf which is exposed by the mask 85B is etched. The etching is used by the ion milling method or the RIE method. With this, the third magnetic layer 30 and the first non-magnetic layer 31n are formed. The first non-magnetic layer 31n and the second magnetic layer 20 are formed between the mask 85B and the third magnetic layer 30. In the Z-axis direction, the second magnetic layer 20 is provided between the mask 85B and the first non-magnetic layer 31n. The mask 85B is removed by using the organic solvent or the oxygen ashing method.

As illustrated in FIG. 20C, an interlayer insulating film 201 is formed on a side surface 20w of the second magnetic layer 20 and a side surface 31w of the first non-magnetic layer 31n. The interlayer insulating film 201 is formed by the sputtering method or the ALD method in the reduced-pressure atmosphere. The interlayer insulating film 201 includes the insulating film 201a and the insulating film 201b. The insulating film 201a contains a silicon nitride. The thickness of the insulating film 201a is, for example, 20 nm. The insulating film 201b contains a silicon oxide. The thickness of the Insulating film 201b is, for example, 10 nm.

The interlayer insulating film 201 is polished by the CMP method. The silica-based slurry is used to polish the interlayer insulating film 201. In the polishing of the interlayer insulating film 201, the second magnetic layer 20 serves as a stopper layer. The interlayer insulating film 201 overlaps the second magnetic layer 20 and the first non-magnetic layer 31n in the X-axis direction. The interlayer insulating film 201 overlaps a portion of the first magnetic layer 10 and the interlayer insulating film 200 in the Z-axis direction.

As illustrated in FIG. 20D, the third conductive layer 83 is formed on the interlayer insulating film 201 and the second magnetic layer 20. The third conductive layer 83 overlaps the interlayer insulating film 201 and the second magnetic layer 20 in the Z-axis direction. In the example, the third conductive layer 83 is connected to the second magnetic layer 20. The third conductive layer 83 is formed by the sputtering method in the reduced-pressure atmosphere.

FIG. 21A to FIG. 21E are schematic sectional views illustrating another method of manufacturing the magnetic memory device according to the first embodiment.

FIG. 22A to FIG. 22F are schematic sectional views illustrating another method of manufacturing the magnetic memory device according to the first embodiment.

FIG. 23A to FIG. 23D are schematic sectional views illustrating another method of manufacturing the magnetic memory device according to the first embodiment.

As illustrated in FIG. 21A, the first magnetic film 10F3 is formed on the seventh magnetic layer 17. The third magnetic film 30F1 is formed on the first magnetic film 10F3. The first magnetic film 10F3 and the third magnetic film 30F1 are formed by the sputtering method or the MBE method in the reduced-pressure atmosphere.

As illustrated in FIG. 21B, the mask 85A is formed on the third magnetic film 30F1. The mask 85A overlaps a portion of the third magnetic film 30F1 in the Z-axis direction. The mask 85A contains the resist. The mask 85A is patterned by the ArF immersion scanner method or the EB drawing method. The length of the mask 85A in the X-axis direction is in a range of, for example, 20 nm to 30 nm.

As illustrated in FIG. 21C, the third magnetic film 30F1 which is exposed by the mask 85A is etched. The etching is used by the ion milling method or the RIE method. With this, the third magnetic film 30F1 which is exposed by the mask 85A is removed. A third magnetic layer 30a is formed between the mask 85A and the first magnetic film 10F3.

In the example, a portion of the first magnetic film 10F3 which is exposed by the mask 85A is etched by the ion milling method or the RIE method. With this, a portion of the first magnetic film 10F3 is redeposited on the side surface 85w of the mask 85A and the side surface 30w of the third magnetic layer 30a. For example, the magnetic film 10d overlapping the third magnetic layer 30a is formed in the X-axis direction. The thickness of the magnetic film 10d in the X-axis direction is in a range of, for example, 2 nm to 3 nm. In the example, a layer including the magnetic film 10d and the first magnetic film 10F3 is set as the first magnetic layer 10.

As illustrated in FIG. 21D, the interlayer insulating film 200F is formed on the mask 85A and the first magnetic layer 10. The interlayer insulating film 200F is formed by the sputtering method or the ALD method in the reduced-pressure atmosphere. The interlayer insulating film 200F includes the insulating film 200a and the insulating film 200b. The insulating film 200a is a silicon nitride. The thickness of the insulating film 200a is, for example, 20 nm. The insulating film 200b contains a silicon oxide. The thickness of the insulating film 200b is, for example, 10 nm.

As illustrated in FIG. 21E, the interlayer insulating film 200F is polished by using the CMP method. The silica-based slurry is used to polish the interlayer insulating film 200F. In the polishing of the interlayer insulating film 200F, the third magnetic layer 30a serves as a stopper layer. With this, the interlayer insulating film 200 is formed. The Interlayer insulating film 200 overlaps the third magnetic layer 30a via a portion of the first magnetic layer 10 in the X-axis direction. The interlayer insulating film 200 overlaps a portion of the first magnetic layer 10 in the Z-axis direction. The interlayer insulating film 200 includes the insulating film 200a and the insulating film 200b. The mask 85A may be removed by using the organic solvent or the oxygen ashing method.

As illustrated in FIG. 22A, a substrate 95B is prepared. The substrate 95B contains silicon. A diameter of the substrate 95B in the X-Y plane is, for example, 300 mm. The second magnetic film 20F is formed on the substrate 95B. The second magnetic film 20F overlaps the substrate 95B in the Z-axis direction. The first non-magnetic film 31nf is formed on the second magnetic film 20F. The first non-magnetic film 31nf overlaps the second magnetic film 20F in the Z-axis direction. The thickness of the first non-magnetic film 31nf is, for example, 1 nm. A third magnetic film 30F2 is formed on a first non-magnetic film 31nf. The third magnetic film 30F2 overlaps the first non-magnetic film 31nf in the Z-axis direction. The second magnetic film 20F, the first non-magnetic film 31nf, and the third magnetic film 30F2 are formed by the sputtering method or the MBE method in the reduced-pressure atmosphere.

As illustrated in FIG. 22B, a mask 85C is formed on the third magnetic film 30F2. The mask 85C overlaps a portion of the third magnetic film 30F2 in the Z-axis direction. The mask 85C contains the resist. The mask 85C is patterned by the ArF immersion scanner method or the EB drawing method. In the X-axis direction, the length of the mask 85C is in a range of, for example, 20 nm to 30 nm.

As illustrated in FIG. 22C, the third magnetic film 30F2 which is exposed by the mask 85C is etched. Next, the first non-magnetic film 31nf which is exposed by the mask 85C is etched. Next, the second magnetic film 20F which is exposed by the mask 85C is etched. The etching is used by the ion milling method or the RIE method.

With this, the third magnetic layer 30b, the first non-magnetic layer 31n, and the second magnetic layer 20 are formed on the substrate 95B. The first non-magnetic layer 31n and the third magnetic layer 30b are formed between the mask 85C and the second magnetic layer 20. In the Z-axis direction, the third magnetic layer 30b is provided between the mask 85C and the first non-magnetic layer 31n. In the Z-axis direction, the first non-magnetic layer 31n is provided between the third magnetic layer 30b and the second magnetic layer 20.

As illustrated in FIG. 22D, the mask 85C is removed by using the organic solvent or the oxygen ashing method.

As illustrated in FIG. 22E, the interlayer insulating film 201F is formed on the substrate 95B and the third magnetic layer 30b. The interlayer insulating film 201F is formed by the sputtering method or the ALD method in the reduced-pressure atmosphere. The interlayer insulating film 201F includes the insulating film 200a and the insulating film 200b. The insulating film 200a contains a silicon nitride. The thickness of the insulating film 200a is, for example, 20 nm. The insulating film 200b contains a silicon oxide. The thickness of the insulating film 200b is, for example, 10 nm.

As illustrated in FIG. 22F, the interlayer insulating film 201F is polished by using the CMP method. The silica-based slurry is used to polish the interlayer insulating film 201F. In the polishing of the interlayer insulating film 201F, the third magnetic layer 30b serves as a stopper layer. With this, the interlayer insulating film 201 is formed. The surface roughness (Ra) of the third magnetic layer 30b is controlled to be 0.1 nm, for example.

The interlayer insulating film 201 overlaps the third magnetic layer 30b, the second magnetic layer 20, and the first non-magnetic layer 31n in the X-axis direction. The interlayer insulating film 201 overlaps a portion of the substrate 95B in the Z-axis direction. The interlayer insulating film 201 includes the insulating film 200a and the insulating film 200b. The Insulating film 200a is provided between the third magnetic layer 30b and the insulating film 200b, between the second magnetic layer 20 and the insulating film 200b, and between the first non-magnetic layer 31n and the insulating film 200b.

Figure 23A:
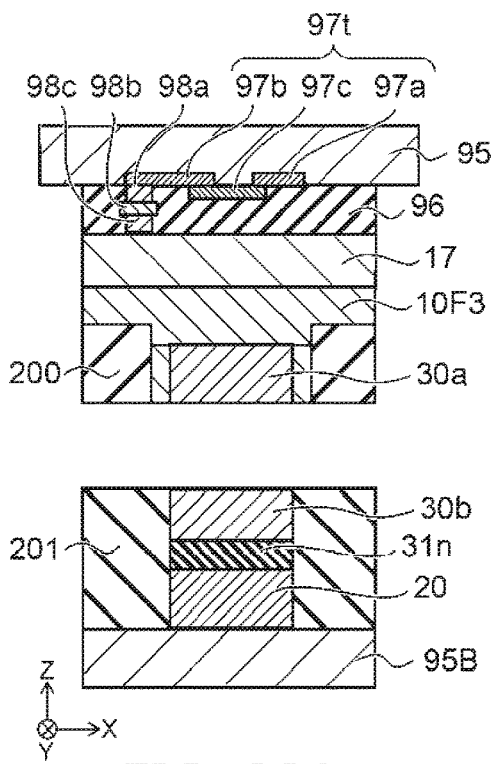
FIG. 23A to FIG. 23D are schematic sectional views illustrating another method of manufacturing the magnetic memory device according to the first embodiment.

As illustrated in FIG. 23A, the third magnetic layer 30a and the third magnetic layer 30b face each other. In the example, the interlayer insulating film 200 and the interlayer insulating film 201 face each other. For example, an oxide or an adsorption layer which is attached to the third magnetic layer 30a and the third magnetic layer 30b is removed by an Ar ion beam or an Ar neutral atom beam in advance at $1 \times 10^{-6}$ Pa or less in the reduced-pressure atmosphere.

Figure 23B:
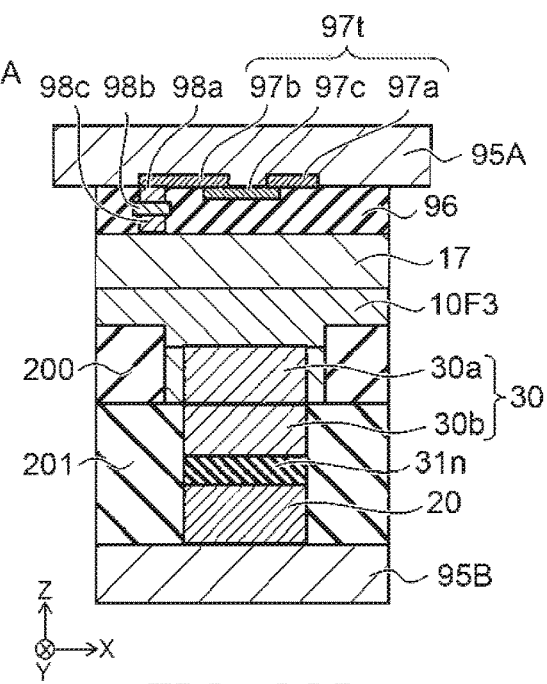

As illustrated in FIG. 23B, the third magnetic layer 30a and the third magnetic layer 30b are bonded to each other by using a surface activation room temperature bonding method. For example, the third magnetic layer 30a and the third magnetic layer 30b are bonded to each other by applying a load thereto at $1 \times 10^{-6}$ Pa or less in the reduced-pressure atmosphere. With this, the third magnetic layer 30 is formed. The third magnetic layer 30 includes the third magnetic layer 30a and the third magnetic layer 30b.

A pressure load at the time of bonding is in a range of, for example, 0.1 tons to 10 tons. The bonding is performed at room temperature. A bonding strength of the third magnetic layer 30a and the third magnetic layer 30b is, for example, 10 MPa. It is possible to obtain the sufficient strength as the bonding strength of the third magnetic layer 30a and the third magnetic layer 30b.

At the time of bonding, the third magnetic layer 30a and the third magnetic layer 30b may be heated at approximately 200° C., for example. The third magnetic layer 30a and the third magnetic layer 30b may be bonded at room temperature, and then may be heated at approximately 200° C., for example. With this, the bonding strength of the third magnetic layer 30a and the third magnetic layer 30b is enhanced.

Figure 23C:
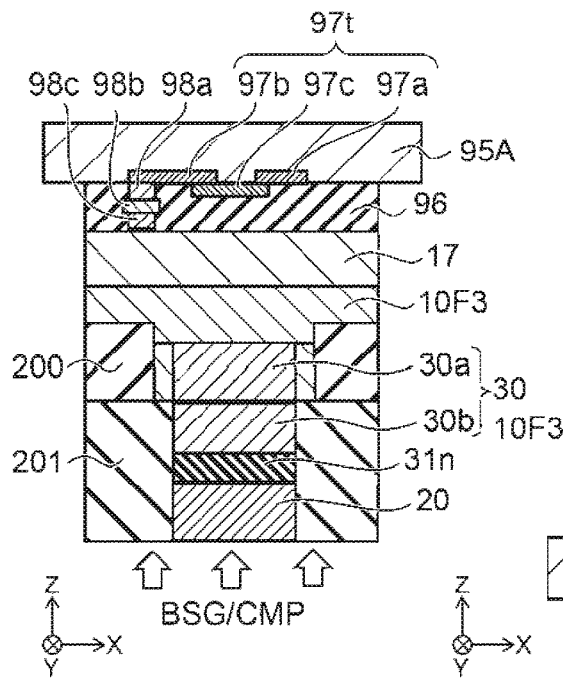

As illustrated in FIG. 23C, the substrate 95B is removed by a grinding method and the CMP method. The thickness of the substrate 95B before being ground is, for example, 775 μm. The substrate 95B is ground in advance until the thickness of the substrate 95B becomes 30 μm, for example. After that, as a finishing work, the thickness of the substrate 95B is ground until the substrate 95B becomes 4 μm, for example. Then, the substrate 95B is completely removed by the CMP treatment. In the CMP method, the silica-based slurry is used. In the CMP treatment, the second magnetic layer 20 serves as a stopper layer. In addition, the substrate 95B may be etched by a KOH aqueous solution instead of grinding the substrate 95B.

Figure 23D:
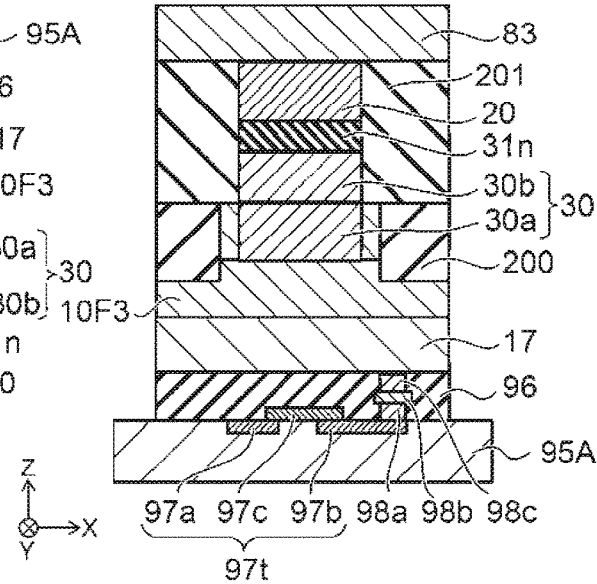

As illustrated in FIG. 23D, the third conductive layer 83 is formed on the interlayer insulating film 201 and the second magnetic layer 20. The third conductive layer 83 overlaps the interlayer insulating film 201 and the second magnetic layer 20 in the Z-axis direction. In the example, the third conductive layer 83 is connected to the second magnetic layer 20. The third conductive layer 83 is formed by the sputtering method in the reduced-pressure atmosphere.

Figure 24:
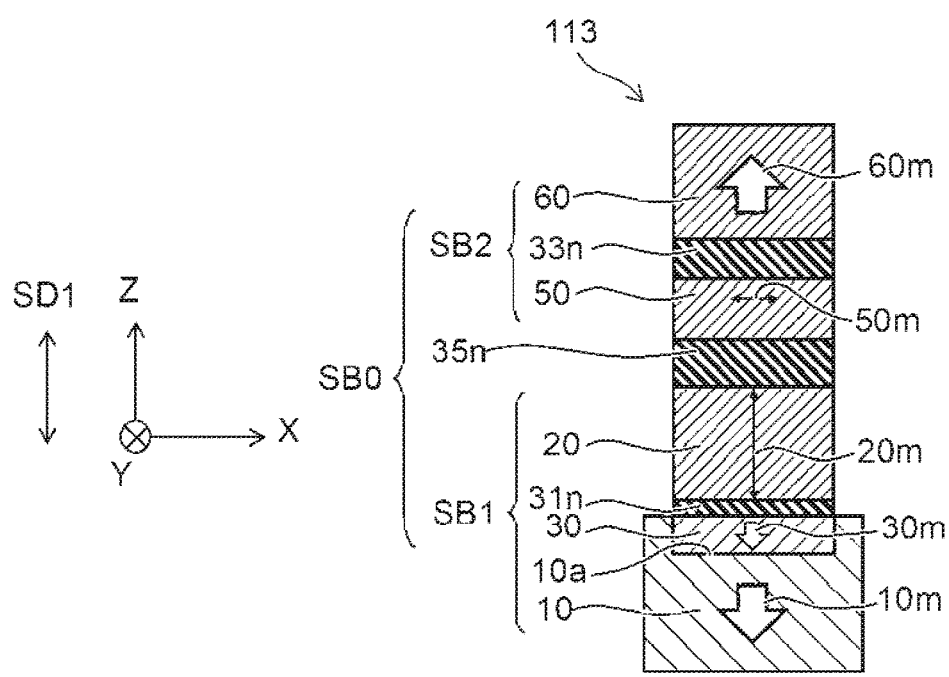
FIG. 24 is a sectional view schematically illustrating the magnetic memory device according to the first embodiment.

FIG. 24 is a sectional view schematically illustrating the magnetic memory device according to the first embodiment.

As illustrated in FIG. 24, in a magnetic memory device 113, the direction of the magnetization 10m of the first magnetic layer 10 is downward, the direction of the magnetization 30m of the third magnetic layer 30 is downward, and the direction of the magnetization 60m of the sixth magnetic layer 60 is upward. As such, each of the direction of the magnetization 10m, the direction of the magnetization 30m, and the direction of the magnetization 60m may be opposite to each of the direction of the magnetization 10m, the direction of the magnetization 30m, and the direction of the magnetization 60m in the magnetic memory device 112.

In the magnetic memory devices 112 and 113, when spin information is held in the fifth non-magnetic layer 35n, the fifth magnetic layer 50 is affected by the spin transfer torque from the second magnetic layer 20. With this, the control properties of the magnetization rotation of the fifth magnetic layer 50 are deteriorated in some cases.

At this time, as the fifth non-magnetic layer 35n, for example, a film (a material having a function of the spin disappearance) having a short spin diffusion length such as ruthenium (Ru) is desirably used. As the fifth non-magnetic layer 35n, for example, a layer which has a structure having a short spin diffusion length such as ruthenium (Ru) is desirably used. With this, it is possible to prevent control properties of the magnetization rotation of the fifth magnetic layer 50 from being deteriorated.

The size of the spin transfer torque for performing the precession of the magnetization 50m of the fifth magnetic layer 50 is determined by the spin polarization in the sixth magnetic layer 60. With such a configuration, it is possible to independently control the magnetization 50m of the fifth magnetic layer 50 without being affected by the spin of another electron (spin transfer torque).

Examples of the material which can obtain such a spin disappearance effect for the fifth non-magnetic layer 35n include metal selected from the group consisting of ruthenium (Ru), tantalum (Ta), tungsten (W), platinum (Pt), palladium (Pd), molybdenum (Mo), niobium (Nb), zirconium (Zr), titanium (Ti) and vanadium (V), or an alloy containing two or more elements selected from the above-described group.

The thickness of the fifth non-magnetic layer 35n is desirably set to be 1.4 nm or greater.

When the thickness of the fifth non-magnetic layer 35n is 1.4 nm or greater, in the fifth non-magnetic layer 35n, it is possible to cause the spin polarization to disappear when the conductive electrons pass through an internal portion and an interface of the fifth non-magnetic layer 35n. Further, with the fifth non-magnetic layer 35n, it is possible to prevent the precession of the fifth magnetic layer 50 from being changed due to the direction of the magnetization 20m of the second magnetic layer 20.

On the other hand, when the thickness of the fifth non-magnetic layer 35n is greater than 20 nm, it is difficult to form a pillar of a multilayer film. Further, the intensity of the rotating magnetic field generated from the fifth magnetic layer 50 is deteriorated in the position of the second magnetic layer 20. For this reason, the thickness of the fifth non-magnetic layer 35n is desirably set to be 20 nm or smaller.

As the fifth non-magnetic layer 35n, the stacked film can be used in addition to the single-layered film described above. The stacked film has a stacking structure which has a layer including metal selected from the group consisting of ruthenium (Ru), tantalum (Ta), tungsten (W), platinum (Pt), palladium (Pd), molybdenum (Mo), niobium (Nb), zirconium (Zr), titanium (Ti) and vanadium (V), or an alloy containing two or more elements selected from the above-described group, and a copper (Cu) layer which is stacked on at least one side of the aforementioned layer.

Further, the stacked film used for the fifth non-magnetic layer 35n can have a stacking structure which has a first layer including metal selected from the group consisting of ruthenium (Ru), tantalum (Ta), tungsten (W), platinum (pt), palladium (Pd), molybdenum (Mo), niobium (Nb), zirconium (Zr), titanium (Ti) and vanadium (V), or an alloy containing two or more elements selected from the above-described group, and a second layer which is stacked on at least one side of the first layer, and contains an oxide containing at least any one element selected from the group consisting of aluminum (Al), magnesium (Mg), titanium (Ti), iron (Fe), cobalt (Co), nickel (Ni), vanadium (V), chromium (Cr), tantalum (Ta), tungsten (W), and ruthenium (Ru).

FIG. 25A to FIG. 25J are sectional views schematically illustrating the magnetic memory device according to the first embodiment.

As illustrated in FIG. 25A to FIG. 25F, in a magnetic memory device 121 to a magnetic memory device 126, the second magnetic layer 20, the first non-magnetic layer 31n, the third magnetic layer 30, the first magnetic layer 10, the fifth non-magnetic layer 35n, the sixth magnetic layer 60, the third non-magnetic layer 33n, and the fifth magnetic layer 50 are stacked in this order. As such, the components for the stacked body SB0 may be stacked in order as described in FIG. 25A to FIG. 25F.

In the magnetic memory device 121 and the magnetic memory device 122, the direction of the component of the stacking direction SD1 of the magnetization 10m of the first magnetic layer 10 is opposite to the direction of the component of the stacking direction SD1 of the magnetization 60m of the sixth magnetic layer 60. With this, for example, in the position of the second magnetic layer 20, it is possible to suppress the occurrence of the leakage magnetic field caused by the magnetization 10m of the first magnetic layer 10 and the magnetization 60m of the sixth magnetic layer 60.

In the magnetic memory device 121 and the magnetic memory device 122, the first magnetic layer 10 and the sixth magnetic layer 60 may be antiferromagnetically coupled via the fifth non-magnetic layer 35n. As such, a structure in which magnetic layers are antiferromagnetically coupled via the non-magnetic layer such that the directions of the magnetizations become anti-parallel with each other is called a synthetic anti-ferromagnetic (SAF) structure. In the example, a stacking structure of "first magnetic layer (for example, the first magnetic layer 10)/non-magnetic layer (for example, the fifth non-magnetic layer 35n)/second magnetic layer (for example, the sixth magnetic layer 60)" corresponds to the SAF structure.

With the SAF structure, the magnetization fixing force between the magnetic layers is enhanced, and thus resistance with respect to the external magnetic field and thermal stability can be improved. In such a structure, in a position of the magnetic memory layer (for example, the second magnetic layer 20), the leakage magnetic field in the direction perpendicular to the film surface can be set to be substantially zero.

As the non-magnetic layer (intermediate layer) in the SAF structure, a metallic material such as ruthenium (Ru), iridium (Ir), or osmium (Os) is used. The thickness of the non-magnetic layer is set to be 3 nm or smaller, for example.

With this, it is possible to obtain sufficient strong antiferromagnetic coupling via the non-magnetic layer.

The fifth non-magnetic layer 35n includes, for example, any metal selected from the group consisting of ruthenium (Ru), osmium (Os), and iridium (Ir), or an alloy containing at least two or more metals selected from the above-described group. The thickness of the fifth non-magnetic layer 35n is 3 nm or smaller, for example.

In the magnetic memory device 123 and the magnetic memory device 124, the direction of the component of the stacking direction SD1 of the magnetization 10m of the first magnetic layer 10 is the same as the direction of the component of the stacking direction SD1 of the magnetization 60m of the sixth magnetic layer 60. As such, the direction of the magnetization 10m may be parallel with the direction of the magnetization 60m.

In the magnetic memory device 125 and the magnetic memory device 126, the direction of the magnetization 10m and the direction of the magnetization 60m are inclined with respect to the stacking direction SD1. The direction of the magnetization 10m and the direction of the magnetization 60m may not be parallel with the stacking direction SD1. The direction of the magnetization 10m and the direction of the magnetization 60m have at least the component of the stacking direction SD1.

As illustrated in FIG. 25G and FIG. 25H, in a magnetic memory device 127 and a magnetic memory device 128, the first magnetic layer 10, the third magnetic layer 30, the first non-magnetic layer 31n, the second magnetic layer 20, the fifth non-magnetic layer 35n, the sixth magnetic layer 60, the third non-magnetic layer 33n, and the fifth magnetic layer 50 are stacked in this order. As such, the components for the stacked body SB0 may be stacked in order as described in FIG. 25G and FIG. 25H.

As illustrated in FIG. 25I and FIG. 25J, in a magnetic memory device 129 and a magnetic memory device 130, the second magnetic layer 20, the first non-magnetic layer 31n, the third magnetic layer 30, the first magnetic layer 10, the fifth non-magnetic layer 35n, the fifth magnetic layer 50, the third non-magnetic layer 33n, and the sixth magnetic layer 60 are stacked in this order. As such, the components for the stacked body SB0 may be stacked in order as described in FIG. 25I and FIG. 25J.

In the magnetic memory device 123, 124, 127, 128, 129, or 130, writing current $I_w$ flows into the stacked body SB0 via the first conductive layer 81 and the second conductive layer 82. The direction of the writing current $I_w$ is optionally determined. By applying the magnetic field in the direction which is opposite to the direction of the magnetization 60m of the sixth magnetic layer 60, the direction of the rotating magnetic field generated in the fifth magnetic layer 50 and the direction in which the precession of the magnetization 20m of the second magnetic layer 20 can be matched with each other.

For example, in the stacking order of the magnetic memory device 112, the distance between the second magnetic layer 20 and the fifth magnetic layer 50 is close, as compared with a configuration in which the sixth magnetic layer 60 is disposed between the second magnetic layer 20 and the fifth magnetic layer 50. With this, the rotating magnetic field generated in the fifth magnetic layer 50 can further properly act on the second magnetic layer 20. It is possible to further efficiently assist for the magnetization inversion in the second magnetic layer 20.

Figure 26:
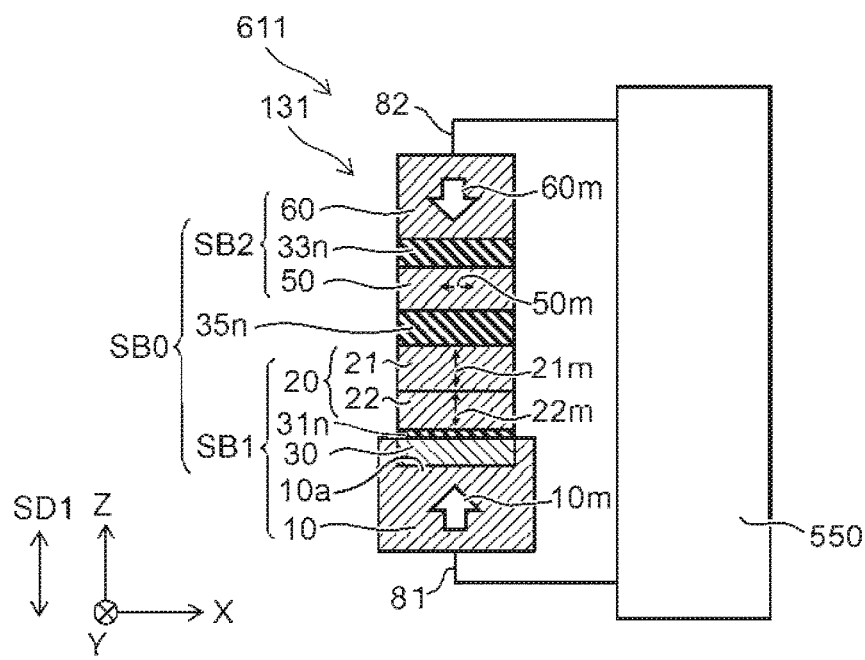
FIG. 26 is a schematic view illustrating a nonvolatile memory apparatus according to the first embodiment.

FIG. 26 is a schematic view illustrating a nonvolatile memory apparatus according to the first embodiment.

As illustrated in FIG. 26, a nonvolatile memory apparatus 611 includes a magnetic memory device 131 and a control unit 550. In the magnetic memory device 131, the second magnetic layer 20 includes a first part 21 and a second part 22. In addition to the aforementioned configuration, the configuration described for the magnetic memory device 112 can be also applied to the magnetic memory device 131.

The direction of the magnetization 21m of the first part 21 is variable. The second part 22 overlaps the first part 21 in the stacking direction SD1 of the first magnetic layer 10 and the second magnetic layer 20. For example, the second part 22 is stacked on the first part 21 in the stacking direction SD1. In the example, the second part 22 is provided between the first magnetic layer 10 and the first part 21. The first part 21 may be provided between the first magnetic layer 10 and the second part 22. The direction of the magnetization 22m of the second part 22 is variable. The magnetization 21m of the first part 21 and the magnetization 22m of the second part 22 are ferromagnetically coupled, antiferromagnetically coupled, or magnetostatically coupled to each other. The magnetic resonance frequency of the second part 22 is lower than the magnetic resonance frequency of the first part 21. The magnetic resonance frequency of the first part 21 is 20 GHz or greater, for example. The magnetic resonance frequency of the second part 22 is lower than 20 GHz, for example.

For example, an alloy is used as the first part 21 and the second part 22. A concentration of at least one element contained in the second part 22 is different from that of the same element contained in the first part 21. The composition ration of the alloy contained in the second part 22 is different from the composition rate of the alloy contained in the first part 21. The second part 22 is a part obtained by changing the composition rate of the alloy of the first part 21 in the second magnetic layer 20, for example.

The material of the second part 22 may be different from the material of the first part 21. In this case, it is possible to regard each of the first part 21 and the second part 22 as one layer included in the second magnetic layer 20. The second magnetic layer 20 may be a stacked body including a first layer and a second layer.

In the magnetic memory device 131, the magnetization 21m of the first part 21 and the magnetization 22m of the second part 22 are ferromagnetically coupled, antiferromagnetically coupled, or magnetostatically coupled to each other. With this, for example, it is possible to increase Δ value of the second magnetic layer 20 in a magnetostatic state. For example, it is possible to increase thermal disturbance resistance. It is possible to suppress a malfunction of the magnetic memory device 131. For example, it is possible to increase a memory holding time of the magnetic memory device 131.

The aforementioned Δ value represents the ratio of magnetic anisotropy energy and thermal energy of the second magnetic layer 20, for example. The A value can be expressed by the following expression, for example.

$$\Delta = Ku \cdot V/K_B \cdot T$$

In the above expression, Ku represents an effective magnetic anisotropy constant, V represents a volume of the second magnetic layer 20, $K_B$ represents Boltzmann's constant, and T represents absolute temperature of the magnetic memory device 131.

In the magnetic memory device 131, when the current flows into the first stacking layer portion SB1 and the second stacking layer portion SB2 in the stacking direction SD1, the spin-polarized electrons act on the second magnetic layer 20.

In the magnetic memory device 131, the rotating magnetic field which is generated when the precession of the magnetization of the fifth magnetic layer 50 is performed acts on the second magnetic layer 20. With this, the direction of the magnetization 21m of the first part 21 and the direction of the magnetization 22m of the second part 22 of the second magnetic layer 20 are determined to the direction in accordance with the current direction.

In the first part 21 of the second magnetic layer 20, for example, the direction of the magnetization 21m of the first part 21 is the direction which is substantially perpendicular to the film surface, and is substantially parallel with the stacking direction SD1. The magnetization 21m of the first part 21 can be inverted. The first part 21 has a function of storing data. The first part 21 serves as a magnetic memory layer, for example.

In the second part 22 of the second magnetic layer 20, for example, the direction of the magnetization 22m of the second part 22 is the direction which is substantially perpendicular to the film surface, and is substantially parallel with the stacking direction SD1. The magnetization 22m of the second part 22 can be inverted. For example, when the current flows into the stacked body SB0 in the stacking direction SD1, the magnetization 22m of the second part 22 is magnetization-inverted faster than the magnetization 21m of the first part 21 so as to assist for the magnetization inversion of the magnetization 21m of the first part 21. The second part 22 serves as a trigger for the magnetization inversion of the first part 21, for example. The second part 22 is called as a trigger layer, for example.

The second part 22 also contributes to data memory holding. The second magnetic layer 20 may be set as the magnetic memory layer, the first part 21 may be set as a main part for the memory holding, and the second part 22 may be set as a trigger part of the magnetization inversion.

For example, a width (a diameter) of the magnetic memory device 131 is set to be 30 nm or smaller. With this, it is possible to increase an integration degree in a MRAM. At this time, if the aforementioned Δ value (thermal stability constant) is small, data into which the magnetic memory device 131 is written cannot be constantly held in some cases. For example, the effective magnetic anisotropy constant Ku is increased so as to make the Δ value larger. When the effective magnetic anisotropy constant Ku becomes larger, for example, effective magnetic anisotropy magnetic field Hk also becomes larger. With this, the writing current is increased, and thus the resonance frequency becomes higher in some cases.

In contrast, in the magnetic memory device 131, the magnetic resonance frequency of the second magnetic layer 20 is lowered by the second part 22. With this, the magnetization 21m of the first part 21 and the magnetization 22m of the second part 22 can be inverted by applying the magnetic field having the frequency in accordance with the lowered magnetic resonance frequency of the second magnetic layer 20. In this case, the magnetization 21m of the first part 21 and the magnetization 22m of the second part 22 can be inverted with a small current as compared with a case where only the first part 21 is used or a case where the magnetic field in accordance with the magnetic resonance frequency is not applied. The magnetic resonance frequency of the second part 22 is less than 20 GHz, and more preferably 15 GHz or lower, for example. The frequency of the rotating magnetic field generated from the fifth magnetic layer 50 can be set to be lower than 20 GHz, for example. With this, for example, the frequency of the rotating magnetic field generated from the fifth magnetic layer 50 and the magnetic resonance frequency of the magnetization 21m and the magnetization 22m are easily matched with each other. For example, in the magnetic memory device 131, it is possible to increase the degree of freedom in designing the first stacking layer portion SB1 and the second stacking layer portion SB2.

As the second part 22, it is possible to use a metallic material containing at least any one of elements selected from the group consisting of iron (Fe), cobalt (Co), nickel (Ni), manganese (Mn), and chromium (Cr). Further, it is possible to use an alloy containing at least any one selected from the aforementioned group, and at least any metal selected from the group consisting of platinum (Pt), palladium (Pd), iridium (Ir), ruthenium (Ru), and rhodium (Rh).

Regarding the second part 22, the composition of magnetic materials contained in the aforementioned second part, conditions for a heat treatment thereof, and the like are adjusted. For example, it is possible to adjust the properties such as an amount of the magnetization and magnetic anisotropy. In the second part 22, for example, it is possible to use such an amorphous alloy of rare earth—transition metal such as TbFeCo and GdFeCo. For example, a stacking structure such as Co/Pt, Co/Pd, and Co/Ni may be used. In the second part 22, an alloy such as Fe/Pt and Fe/Pd, or a stacking structure may be used. Co/Ru, Fe/Au, Ni/Cu, and the like are combined with a foundation layer so as to form a vertical magnetization film. In the second part 22, it is possible to use Co/Ru, Fe/Au, Ni/Cu, or the like by controlling the crystalline orientation of the film. In addition, in the second part 22, an additive such as gallium (Ga), aluminum (Al), germanium (Ge), nitrogen (N), phosphorus (P), arsenic (As), boron B, and silicon (Si) may be added. For example, CoFe, CoFeB, MnGa, MnGe, and the like may be used. The composition rates of the aforementioned materials may be changed.

When any one of the above-described materials is used as the second part 22, it is possible to increase saturation magnetization Ms of the second part 22. On the basis of the LLG calculation, it was found that in a case where the intensity of the magnetization Ms is in a range of 1000 to 1600 (emu/cc), when each of the second part 22 and the second magnetic layer 20 is ferromagnetically coupled, antiferromagnetically coupled, or magnetostatically coupled to each of the second part 22 and the fourth magnetic layer 40, it is possible to lower the magnetic resonance frequency, and thus the magnetic resonance effect is easily obtained.

As the second part 22, for example, Heusler alloy may be used. The Heusler alloy is an alloy having, for example, $L2_1$ structure and a composition such as $X_2YZ$. The second part 22 includes the Heusler alloy containing at least any one of Co, Mn, Fe, Ni, Cu, Rh, Ru, and Pd.

For example, the second part 22 includes a first Heusler alloy. The first Heusler alloy contains at least one of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

When the aforementioned first Heusler alloy is used as the second part 22, it is possible to increase the saturation magnetization Ms of the second part 22. With this, for example, when each of the second part 22 and the second magnetic layer 20 is ferromagnetically coupled, antiferromagnetically coupled, or magnetostatically coupled to each of the second part 22 and the fourth magnetic layer 40, it is possible to lower the magnetic resonance frequency, and thus the magnetic resonance effect is easily obtained.

For example, the second part 22 may include a second Heusler alloy. The second Heusler alloy contains at least any one of $Co_2HfSn$, $Co_2ZrSn$, $Co_2HfAl$, $Co_2ZrAl$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$.

The aforementioned second Heusler alloy has relatively small saturation magnetization Ms. In the second Heusler alloy, it is possible to satisfy the expression of Ms<400 (emu/cc), for example. With this, it is possible to reduce the occurrence of leakage magnetic field in the adjacent magnetic memory device, for example.

Figure 27:
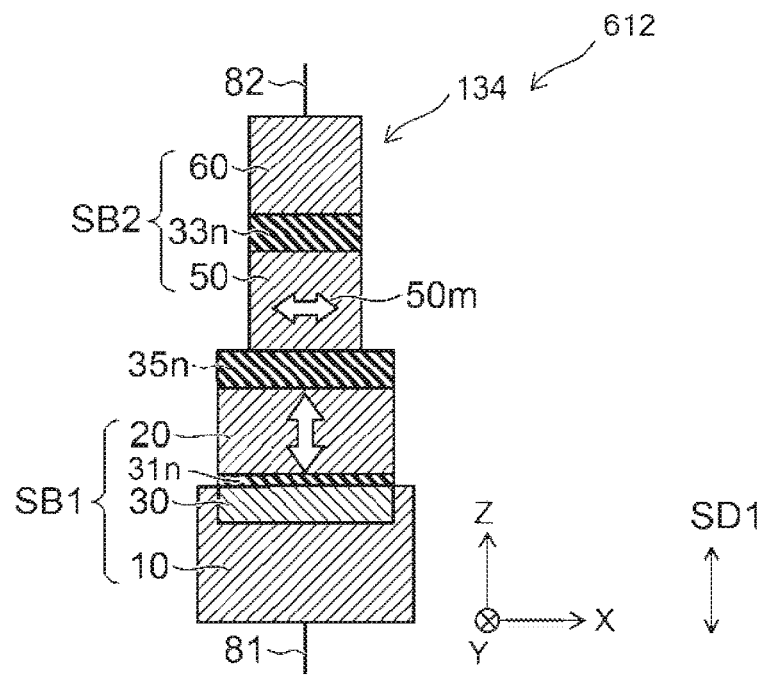
FIG. 27 is a sectional view schematically illustrating a nonvolatile memory apparatus according to the first embodiment.

FIG. 27 is a sectional view schematically illustrating a nonvolatile memory apparatus according to the first embodiment.

As illustrated in FIG. 27, a nonvolatile memory apparatus 612 includes a magnetic memory device 134. The nonvolatile memory apparatus 612 may include the control unit 550 (not shown in FIG. 27). In the magnetic memory device 134, a width of the first stacking layer portion SB1 (sectional shape of the layer when being cut in the direction along a plane perpendicular to the stacking direction SD1) and a width of the second stacking layer portion SB2 are different from each other. In addition to the aforementioned configuration, the same configuration as that of the magnetic memory device 112 can be also applied to the magnetic memory device 134.

For example, a sectional area of the first stacking layer portion SB1 (a first area S1) when being cut in the direction along a plane crossing (for example, perpendicular to) the stacking direction SD1 is larger than a sectional area of the second stacking layer portion SB2 (a second area S2) when being cut in the direction along a plane crossing (for example, perpendicular to) the stacking direction SD1.

With this, for example, when the current flows into the stacked body SB0 via the first conductive layer 81 and the second conductive layer 82, it is possible to make a current density in the second stacking layer portion SB2 larger than a current density in the first stacking layer portion SB1. It is possible to make a current density in an oscillation layer (the fifth magnetic layer 50) larger.

When the current density in the oscillation layer is made larger, it is possible to oscillate (perform the precession of) the magnetization 50m of the fifth magnetic layer 50 with a smaller current, for example. With the smaller current, it is possible to oscillate the magnetization 50m. With this, for example, it is possible to make the current flowing into the MT) in the writing operation.

For example, the width (the length along the X-axis direction) of the second stacking layer portion SB2 is desirably 25 nm or smaller. For example, it is desired that the first area S1 of the first stacking layer portion SB1 is not less than 2.0 times the second area S2 of the second stacking layer portion SB2.

Figure 28:
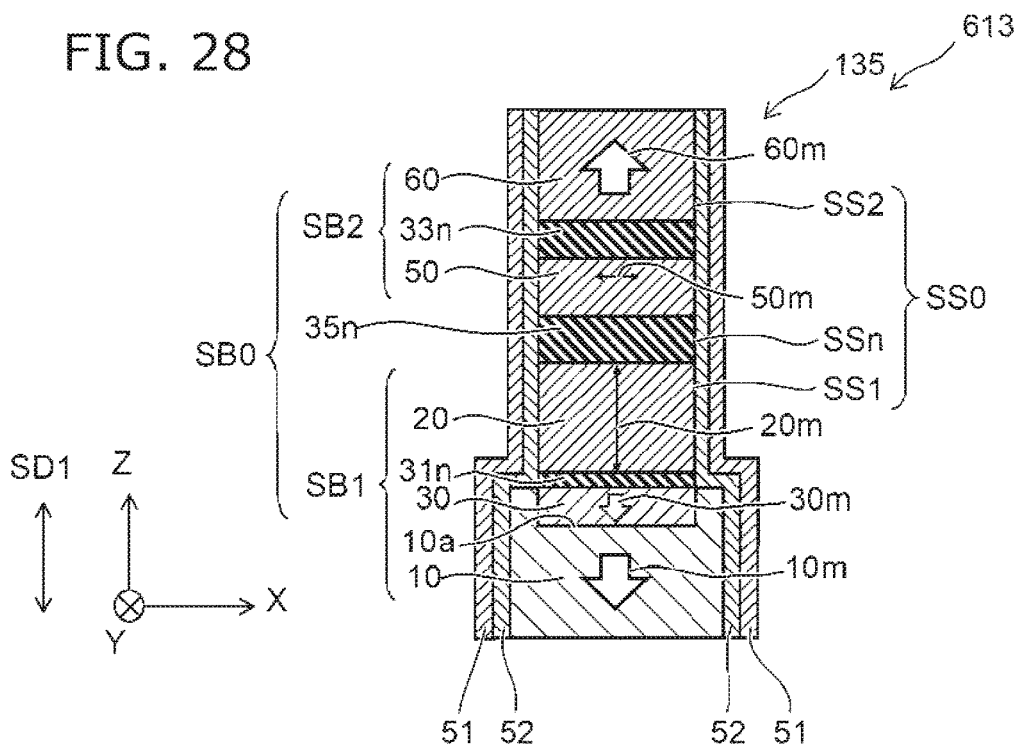
FIG. 28 is a sectional view schematically illustrating the nonvolatile memory apparatus according to the first embodiment.

FIG. 28 is a sectional view schematically illustrating the nonvolatile memory apparatus according to the first embodiment.

As illustrated in FIG. 28, a nonvolatile memory apparatus 613 includes a magnetic memory device 135. The nonvolatile memory apparatus 613 may include the control unit 550 (not shown in FIG. 28). The magnetic memory device 135 includes the magnetic shield 51. The stacked body SB0 includes a side surface SS0 extending in the stacking direction SD1. The first stacking layer portion SB1 includes a side surface SS1 (a first side surface) extending in the stacking direction SD1. The second stacking layer portion SB2 includes a side surface SS2 (a second side surface) extending in the stacking direction SD1. The fifth non-magnetic layer 35n includes a side surface SSn extending in the stacking direction SD1. Here, a phrase "extending in the stacking direction SD1" implies a state in which the surface is not parallel with the stacking direction SD1. The phrase "extending in the stacking direction SD1" Implies at least a component extending in the stacking direction SD1. The "surface extending in the stacking direction SD1" is not orthogonal to the stacking direction SD1.

The stacked body SB0 (the first stacking layer portion SB1 and the second stacking layer portion SB2) includes the side surface SS1 (the first side surface) extending in the stacking direction SD1. The magnetic shield 51 overlaps at least a portion of the side surface SS0 of the second stacking layer portion SB2. In other words, the magnetic shield 51 faces at least a portion of the side surface SS0 of the stacked body SB0. For example, the magnetic shield 51 is in contact with at least a portion of the side surface SS0 of the stacked body SB0. The side surface SS0 of the stacked body SB0 includes, for example, the side surface SS1 (the first side surface) of the first stacking layer portion SB1, the side surface SS2 (the second side surface) of the second stacking layer portion SB2, and the side surface SSn of the fifth non-magnetic layer 35n. In the example, the magnetic shield 51 covers the side surface SS1, the side surface SS2, and the side surface SSn. The shape of the magnetic shield 51 projected on the X-Y plane is, for example, a ring shape surrounding the stacked body SB0.

The magnetic memory device 135 further includes a protective layer 52. The protective layer 52 is provided between the side surface SS0 of the stacked body SB0 and the magnetic shield 51. It is desired that the thickness of the protective layer 52 is substantially the same as or longer than the length of the center in the Z-axis direction, that is, the distance from the center of the second magnetic layer 20 in the Z-axis direction to the center of the fifth magnetic layer 50 in the Z-axis direction. For example, the distance in the Z-axis direction between the center of the second magnetic layer 20 in the Z-axis direction and the center of the fifth magnetic layer 50 in the Z-axis direction is short in the configuration of the magnetic memory device 135, and is long in the configurations of the magnetic memory device 121 to the magnetic memory device 126. It is desired that the thickness of the protective layer 52 is in a range of 2 nm to 30 nm, for example. The magnetic shield 51 and the protective layer 52 may be provided in any magnetic memory device according to the embodiment.

For example, the side surface SS1 of the first stacking layer portion SB1 and the side surface SS2 of the second stacking layer portion SB2 are covered with the magnetic shield 51 such as permalloy (Py) via the protective layer 52 such as SiN and $Al_2O_3$. With this, for example, in a case where a plurality of magnetic memory devices 135 are arranged in a line, it is possible to prevent the operations of the first stacking layer portion SB1 and the second stacking layer portion SB2 from being adversely affected by the leakage magnetic field from the adjacent magnetic memory device 135. For example, in each memory cell (the stacked body SB0), effective magnetic fields acting on the first stacking layer portion SB1 are substantially the same as each other, and thus a variation of inversion currents between bits is suppressed. A variation of oscillation currents in the second stacking layer portion SB2 is also suppressed in the same way as described above. It is possible to prevent the leakage magnetic field from the first stacking layer portion SB1 and the second stacking layer portion SB2 from acting on the adjacent magnetic memory device. As a result, it is possible to dispose the plurality of magnetic memory devices so as to be close to each other, and thereby it is possible to increase an integration degree. For example, it is possible to improve a memory density of the nonvolatile memory apparatus.

Examples of the magnetic shield 51 include any metal selected from the group consisting of iron (Fe), cobalt (Co), nickel (Ni), manganese (Mn), and chromium (Cr), or an alloy containing two or more metals selected from the above-described group. The magnetic shield 51 may be an alloy including, for example, at least any one of metal selected from the group consisting of iron (Fe), cobalt (Co), nickel (Ni), manganese (Mn), and chromium (Cr), and at least any one of metal selected from the group consisting of platinum (Pt), palladium (Pd), iridium (Ir), ruthenium (Ru), and rhodium (Rh).

It is possible to adjust the properties of the magnetic shield 51 by adjusting the composition of the magnetic material contained in the magnetic shield 51 and conditions for a heat treatment thereof. The magnetic shield 51 may be an amorphous alloy of rare earth—transition metal such as TbFeCo and GdFeCo. As the magnetic shield 51, stacking structures of Co/Pt, Co/Pd, Co/Ni, and the like may be used.

As the protective layer 52, for example, it is possible to use an oxide, a nitride, or a fluoride containing at least any one of elements selected from the group consisting of aluminum (Al) titanium (Ti), zinc (Zn), zirconium (Zr), tantalum (Ta), cobalt (Co), nickel (Ni), silicon (Si), magnesium (Mg), and iron (Fe). As the protective layer 52, SiN is used, for example.

Hereinafter, an example of the method of manufacturing the magnetic memory device 135 illustrated in FIG. 28 will be described.

After a lower electrode (not shown) is formed on a wafer, the wafer is disposed in an ultra-high vacuum sputtering apparatus. On the lower electrode, Ru/Ta (a contact layer and a stopper layer of the lower electrode), a FePt layer (the first magnetic layer 10), CoFeB (the third magnetic layer 30), MgO (the first non-magnetic layer 31n), a CoFeB layer (the memory layer), and a Ru layer (the fifth non-magnetic layer 35n) are stacked in this order. Here, when annealing is performed in the magnetic field, the intensity of the magnetic anisotropy of CoFeB and FePt layer/CoFeB in the direction perpendicular to the film surface also can be adjusted. Subsequently, Py layer/Cu/CoFeB/FePt layer (a magnetic field generation unit), and Ru/Ta layer (an upper contact layer) are stacked in this order. With this, a processed body is formed.

Next, an EB exposure process is performed by coating with an EB resist so as to form a resist mask having a diameter of 30 nm. A portion which is not coated with the resist through an ion milling method is scraped until the Ta layer of the lower electrode as the stopper layer is exposed.

Subsequently, a SiN layer is formed as the protective layer 52, and then a Py layer serving as the magnetic shield 51 is formed. When etch back is performed, the Py layer remains on the side walls of the magnetic memory device.

Next, a $SiO_2$ film is formed so as to insulate and embed the magnetic memory device. With this, the magnetic memory device is insulated and embedded. After that, the contact layer of the electrode is exposed by etching the entire surface thereof by the RIE method after flattening the surface by the CMP or the like Further, the entire surface is coated with the resist, and the resist is patterned by using a stepper exposure apparatus such that a portion of the upper electrode is not coated with the resist. An opening corresponding to the upper electrode is embedded by Cu so as to form a film, and then the resist is removed. The upper electrode is provided with a wire (not shown) such that electrical input and output can be performed.

In this way, the magnetic memory device 135 is formed.

Figure 29:
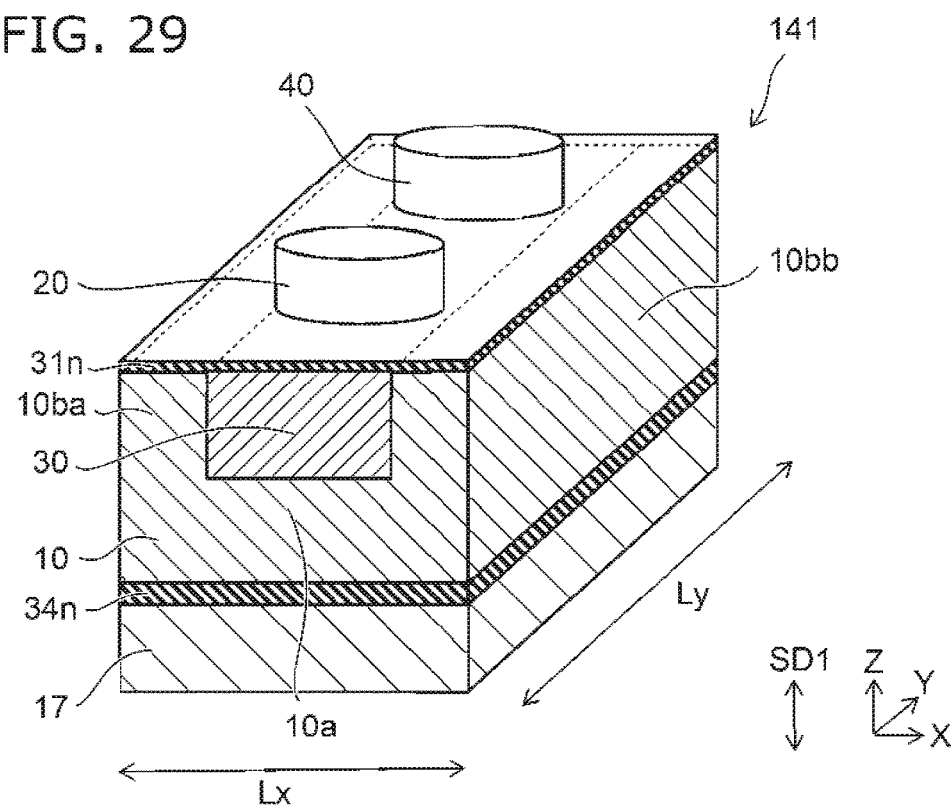
FIG. 29 is a perspective view schematically illustrating the magnetic memory device according to the first embodiment.

FIG. 29 is a perspective view schematically illustrating the magnetic memory device according to the first embodiment.

As illustrated in FIG. 29, a magnetic memory device 141 includes a region in which the first non-magnetic layer 31n is provided between the fourth magnetic layer 40 and the third magnetic layer 30. The first non-magnetic layer 31n Includes a region overlapping the third magnetic layer 30 in the Z-axis direction. The first non-magnetic layer 31n overlaps the third magnetic layer 30 and the first magnetic layer 10 in the Z-axis direction. For example, the first non-magnetic layer 31n is stacked on the third magnetic layer 30 and the first magnetic layer 10 in the Z-axis direction.

Second Embodiment

Figure 30:
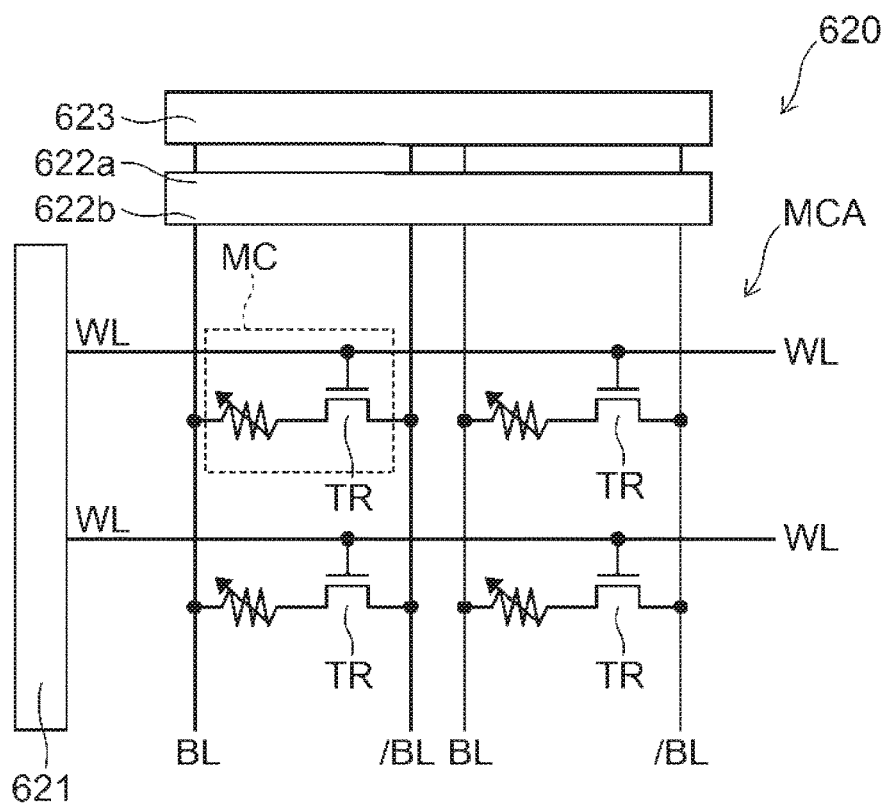
FIG. 30 is a schematic view illustrating a nonvolatile memory apparatus according to the second embodiment.

FIG. 30 is a schematic view illustrating a nonvolatile memory apparatus according to the second embodiment.

As illustrated in FIG. 30, a nonvolatile memory apparatus 620 according to the embodiment is provided with a memory cell array MCA. The memory cell array MCA includes a plurality of memory cells MC which are arranged in a matrix. Each of the memory cells MC includes any one of the magnetic memory devices according to the first embodiment as a MTJ device (stacked body SB0).

In the memory cell array MCA, a plurality of bit line pairs (a bit line BL and a bit line/BL), and a plurality of word lines WL are disposed. Each of the plurality of bit line pairs extends in a column direction. Each of the plurality of word lines WL extends in a row direction.

In a portion in which the bit line BL and the word line WL cross each other, memory cells MC are disposed. Each of the memory cells MC includes the MTJ device and the selecting transistor TR. One end of the MTJ device is connected to the bit line BL. The other end of the MT) device is connected to a drain terminal of the selecting transistor TR. A gate terminal of the selecting transistor TR is connected to the word line WL. A source terminal of the selecting transistor TR is connected to the bit line/BL.

A row decoder 621 is connected to the word line WL. A writing circuit 622a and a reading circuit 622b are connected to the bit line pair (bit line BL and bit line/BL). A column decoder 623 is connected to the writing circuit 622a and the reading circuit 622b.

Each of the memory cells MC is selected by the row decoder 621 and the column decoder 623. An example of data writing into the memory cell MC is as described below. First, in order to select the memory cell MC for performing the data writing, the word line WL which is connected to the memory cell MC is activated. With this, the selecting transistor TR is turned on.

In the example, the control unit 550 is configured to include, for example, the row decoder 621, the writing circuit 622a, the reading circuit 622b, and the column decoder 623. The control unit 550 is connected to each of the plurality of memory cells MC (the plurality of magnetic memory devices) via the bit line BL, the word line WL, the selecting transistor TR, and the like. The control unit 550 performs the writing of data and the reading of data in each of the plurality of memory cells MC.

For example, bidirectional wiring currents are supplied to the MTJ device. Specifically, in a case where the writing current is supplied to the MTJ device from the left to the right, the writing circuit 622a applies a positive potential to the bit line BL, and applies a ground potential to the bit line/BL. In a case where the writing current is supplied to the MTJ device from the left to the right, the writing circuit 622a applies a positive potential to the bit line/BL, and applies the ground potential to the bit line BL. In this way, it is possible to write data "0" or data "1" into the memory cell MC.

An example of the data reading from the memory cell MC is as described below. First, the memory cell MC is selected. The reading circuit 622b supplies a reading current which flows into the MTJ device from the selecting transistor TR to the MTJ device. Then, the reading circuit 622b detects a resistance value of the MTJ device based on the aforementioned reading current. In this way, it is possible to read the information stored in the MTJ device.

FIG. 31 is a schematic view illustrating the nonvolatile memory apparatus according to the second embodiment.

FIG. 31 illustrates a portion of one memory cell MC. In the example, the magnetic memory device 110 and the magnetic memory device 112 are used; however, any magnetic memory device according to the embodiment can be used.

As illustrated in FIG. 31, the nonvolatile memory apparatus 620 is provided with a magnetic memory device (for example, the magnetic memory device 110 and the magnetic memory device 112) according to the embodiment, a first wire 91, and a second wire 92. The first wire 91 is directly or indirectly connected to one end (for example, an end of the first stacking layer portion SB1) of the magnetic memory device 110. The second wire 92 is directly or indirectly connected to one end (for example, an end of the second stacking layer portion SB2) of the magnetic memory device 112.

The magnetic memory device included in the nonvolatile memory apparatus 620 is not limited to the magnetic memory device 110 and the magnetic memory device 112, and may be any one of the magnetic memory devices described in the first embodiment.

Here, a phrase "directly connected" implies a state in which the wire and the magnetic memory device are electrically connected to each other without interposing other conductive members (for example, a via electrode and a wire) therebetween. A phrase "indirectly connected" implies a state in which the wire and the magnetic memory device are electrically connected to each other with other conductive members (for example, the via electrode and the wire) interposed therebetween, and a state in which the wire and the magnetic memory device are connected to each other with a switch (for example, a transistor) interposed therebetween so as to variably switch between a conduction state and a non-conduction state.

Any one of the first wire 91 and the second wire 92 corresponds to the bit line BL, for example. The other one of the first wire 91 and the second wire 92 corresponds to the bit line/BL, for example.

As illustrated in FIG. 31, the nonvolatile memory apparatus 620 is further provided with the selecting transistor TR. The selecting transistor TR is provided at least (a first position) between the magnetic memory device 110 and the first wire 91, and (a second position) between the magnetic memory device 110 and the second wire 92.

With such a configuration, it is possible to write data into any memory cell MC (for example, magnetic memory device 110) of the memory cell array MCA, and to read the data written into the magnetic memory device 110. Also in the nonvolatile memory apparatus 620 configured as described above, it is possible to decrease the writing currents by causing the second magnetic layer 20 and the fifth magnetic layer 50 to be magnetostatically coupled to each other. With this, it is possible to suppress failure due to insulation breakdown, and thus the reliability is improved.

Third Embodiment

Figure 32:
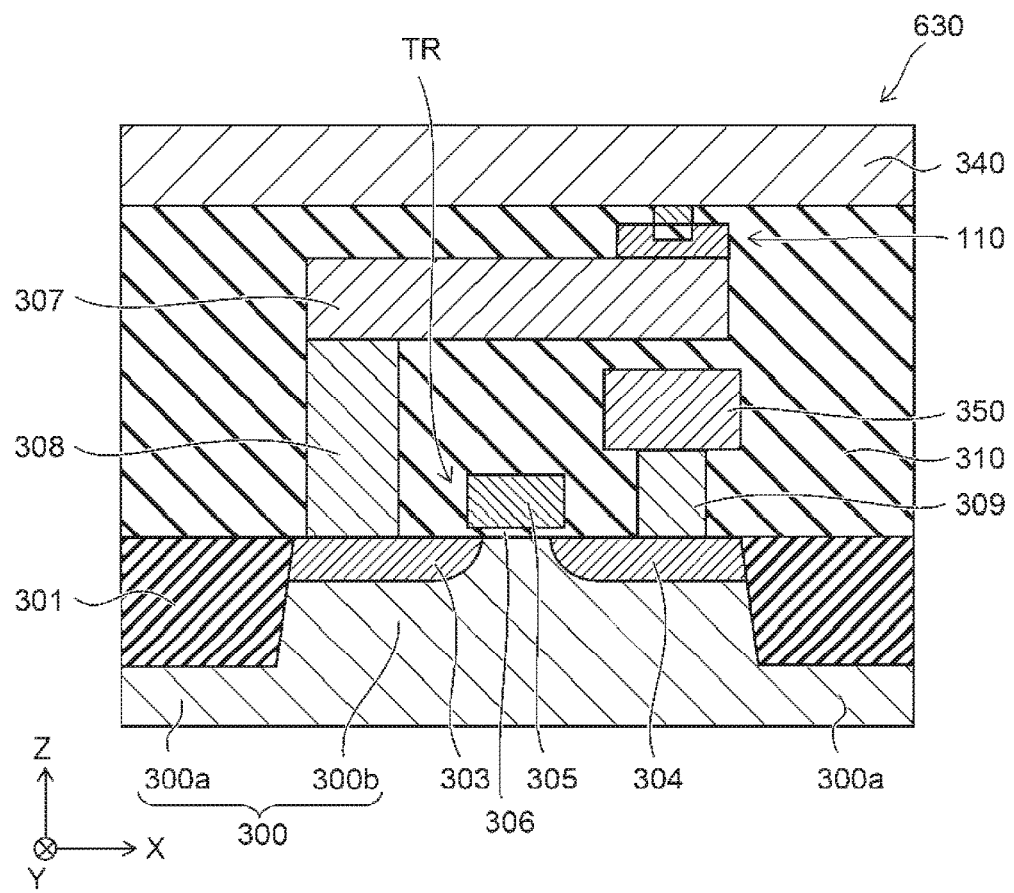
FIG. 32 is a schematic view illustrating the nonvolatile memory apparatus according to the third embodiment.

FIG. 32 is a schematic view illustrating the nonvolatile memory apparatus according to the third embodiment.

The nonvolatile semiconductor apparatus 630 illustrated in FIG. 32 includes the magnetic memory device (for example, the magnetic memory device 110) according to the embodiment, a substrate 300, a separation region 301, a third semiconductor region 303, a fourth semiconductor region 304, a gate electrode 305, a gate insulating film 306, a fourth conductive layer 340, a fifth conductive layer 350, a wire 307, a contact 308, a contact 309, and an interlayer insulating film 310.

The substrate 300 includes a p-type silicon. The separation region 301 is provided between a portion 300a of the substrate 300 and the interlayer insulating film 310. The interlayer insulating film 310 includes at least any one of a silicon oxide, a silicon nitride, an aluminum oxide, and an aluminum nitride. The interlayer insulating film 310 is provided between the fourth conductive layer 340 and the substrate 300.

The third semiconductor region 303 and the fourth semiconductor region 304 are provided between another portion 300b of the substrate 300 and the interlayer insulating film 310. The third semiconductor region 303 is separated from the fourth semiconductor region 304 in the X-axis direction. The third semiconductor region 303 is, for example, a drain region of a metal oxide semiconductor field effect transistor (MOSFET). The fourth semiconductor region 304 is, for example, a source region of the MOSFET. The third semiconductor region 303 and the fourth semiconductor region 304 include an n-type impurity. The third semiconductor region 303 and the fourth semiconductor region 304 are $n^+$-type semiconductor regions.

The gate electrode 305 is separated from the substrate 300 between the third semiconductor region 303 and the fourth semiconductor region 304 in the Z-axis direction. The gate electrode 305 is, for example, a word line of the nonvolatile memory apparatus. The gate insulating film 306 is provided between the gate electrode 305 and the third semiconductor region 303, between the gate electrode 305 and the substrate 300, and between the gate electrode 305 and the fourth semiconductor region 304.

The nonvolatile semiconductor apparatus 630 is provided with a selecting transistor TR. The selecting transistor TR includes the substrate 300, the third semiconductor region 303, the fourth semiconductor region 304, the gate electrode 305, and the gate insulating film 306.

The fourth semiconductor region 304 is electrically connected to the contact 309. The contact 309 is electrically connected to the fifth conductive layer 350. The fourth semiconductor region 304 is electrically connected to the fifth conductive layer 350 via the contact 309. The fifth conductive layer 350 is a bit line of the nonvolatile semiconductor apparatus 630.

The third semiconductor region 303 is electrically connected to the contact 308. The contact 308 is electrically connected to the wire 307. The third semiconductor region 303 is electrically connected to the wire 307 via the contact 308.

A magnetic memory device (for example, the magnetic memory device 110) is provided between the wire 307 and the fourth conductive layer 340. The fourth conductive layer 340 is a bit line of the nonvolatile semiconductor apparatus 630.

Fourth Embodiment

Figures 33A, 33B, 33C:
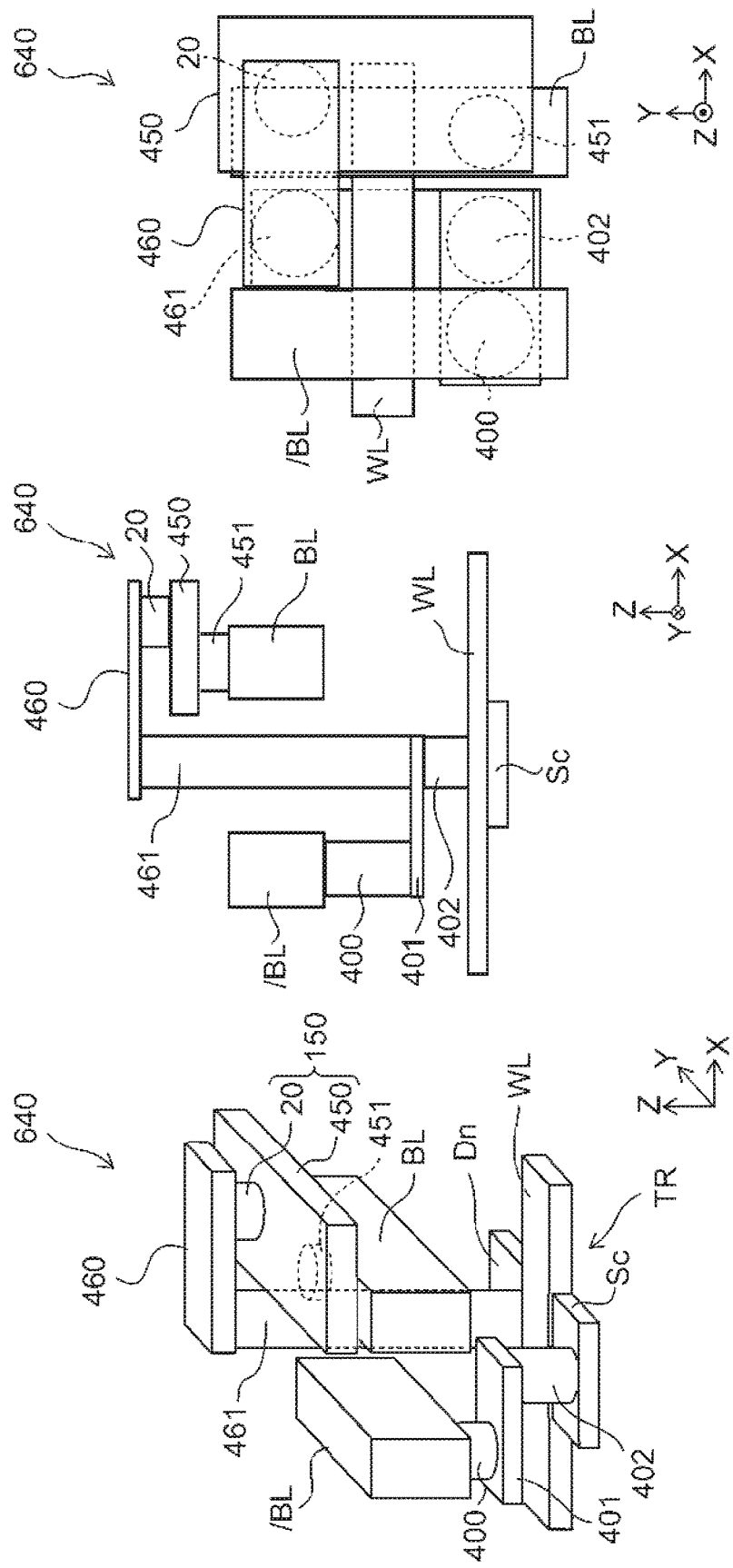
FIG. 33A to FIG. 33C are schematic views illustrating a nonvolatile memory apparatus according to the fourth embodiment.

FIG. 33A to FIG. 33C are schematic views illustrating a nonvolatile memory apparatus according to the fourth embodiment.

FIG. 33A is a perspective view. FIG. 33B is a side view of FIG. 33A. FIG. 33C is a top view of FIG. 33A.

The nonvolatile semiconductor apparatus 640 includes a selecting transistor TR, a bit line/BL, a bit line BL, and a MTJ device 150.

As illustrated in FIG. 33A to FIG. 33C, the selecting transistor TR includes a portion of the word line WL, a source region Sc, and a drain region Dn. The word line WL extends in the X-axis direction, for example.

The bit line/BL crosses the word line WL. The bit line/BL extends in the Y-axis direction, for example. A portion of the bit line/BL is electrically connected to a contact 400. The contact 400 extends in the Z-axis direction. The contact 400 is electrically connected to a portion of a wire 401. The wire 401 extends in the X-axis direction. A portion of the wire 401 is electrically connected to a contact 402. The contact 402 extends in the Z-axis direction. The contact 402 is electrically connected to the source region Sc.

The bit line BL crosses the word line WL. The bit line BL extends in the Y-axis direction, for example. The bit line BL is adjacent to the bit line/BL in the X-axis direction.

Any one of the magnetic memory devices according to the first embodiment is set as a MTJ device 150. For example, the MTJ device 150 includes the second magnetic layer 20 and a wire 450. The wire 450 includes the first magnetic layer 10, the third magnetic layer 30, the third non-magnetic layer 33n, and the seventh magnetic layer 17. The wire 450 extends in the Y-axis direction, for example. The wire 450 is electrically connected to the bit line BL. The wire 450 overlaps a portion of the bit line BL in the Z-axis direction, for example. The wire 450 may be electrically connected to the bit line BL via a contact 451, for example. The contact 451 extends in the Z-axis direction.

The second magnetic layer 20 is provided between a portion of the wire 450 and a portion of a wire 460 in the Z-axis direction. The second magnetic layer 20 is connected to the wire 450 via the first non-magnetic layer 31n (not shown), for example. The second magnetic layer 20 is electrically connected to the wire 460, for example.

The wire 460 crosses the bit line/BL and the bit line BL. The wire 460 extends in the X-axis direction. The wire 460 is adjacent to the word line WL in the Z-axis direction. A portion of the wire 460 is electrically connected to the contact 461. The contact 461 extends in the Z-axis direction. The contact 461 is adjacent to the contact 402 in the Y-axis direction, for example. The contact 461 is electrically connected to a portion of the drain region Dn.

According to the embodiments, there are provided a magnetic memory device and a nonvolatile memory apparatus which have high reliability.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nonvolatile memory apparatuses such as memory portions, magnetic memory devices, control units, stacked bodies, magnetization rotating layers, first to fourth magnetic layer, first to third non-magnetic layers etc., from known art. Such practice is included in the scope of the Invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices and nonvolatile memory apparatuses practicable by an appropriate design modification by one skilled in the art based on the magnetic memory devices and nonvolatile memory apparatuses described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a first magnetic layer including a first part and a second part;
a second magnetic layer;
a third magnetic layer provided between the first part and the second magnetic layer;
a first non-magnetic layer provided between the second magnetic layer and the third magnetic layer; and
a fourth magnetic layer,
at least a portion of the second part overlapping at least a portion of the third magnetic layer in a second direction orthogonal to a first direction from the first part toward the second magnetic layer,
wherein the second part of the first magnetic layer includes a first region and a second region,
at least a portion of the third magnetic layer is provided between the first region and the second region in the second direction,
a length of the first magnetic layer in a third direction is longer than a length of the first magnetic layer in the second direction, the third direction crosses a plane including the first direction and the second direction, the first region and the second region extend in the third direction, the fourth magnetic layer is separated from the second magnetic layer in the third direction, the fourth magnetic layer is separated from the third magnetic layer in the first direction, and magnetization of the second magnetic layer and magnetization of the fourth magnetic layer are variable.

2. The device according to claim 1, wherein magnetization of the first magnetic layer and magnetization of the third magnetic layer are substantially fixed.

3. The device according to claim 1, wherein a magnetization component of the first magnetic layer along the first direction is larger than a magnetization component of the first magnetic layer in the second direction, and a magnetization component of the third magnetic layer along the first direction is larger than a magnetization component of the third magnetic layer in the second direction.

4. The device according to claim 1, wherein the second part of the first magnetic layer does not overlap the second magnetic layer in the second direction.

5. The device according to claim 1, wherein the second part is in contact with the third magnetic layer.

6. A magnetic memory device, comprising:

a first magnetic layer including a first part and a second part;

a second magnetic layer;

a third magnetic layer provided between the first part and the second magnetic layer;

a first non-magnetic layer provided between the second magnetic layer and the third magnetic layer; and a fourth magnetic layer, wherein the second part of the first magnetic layer includes a first region and a second region, and at least a portion of the third magnetic layer is provided between the first region and the second region in a second direction orthogonal to a first direction from the first part toward the second magnetic layer, a length of the first magnetic layer in a third direction is longer than a length of the first magnetic layer in the second direction, the third direction crosses a plane including the first direction and the second direction, the first region and the second region extend in the third direction, the fourth magnetic layer is separated from the second magnetic layer in the third direction, the fourth magnetic layer is separated from the third magnetic layer in the first direction, and magnetization of the second magnetic layer and magnetization of the fourth magnetic layer are variable.

7. A nonvolatile memory apparatus, comprising:

a magnetic memory device including a first magnetic layer including a first part and a second part;

a second magnetic layer;

a third magnetic layer provided between the first part and the second magnetic layer;

a first non-magnetic layer provided between the second magnetic layer and the third magnetic layer; and a fourth magnetic layer;

and a control unit electrically connected with the magnetic memory device, wherein the second part of the first magnetic layer includes a first region and a second region, at least a portion of the third magnetic layer is provided between the first region and the second region in a second direction orthogonal to a first direction from the first part toward the second magnetic layer, a length of the first magnetic layer in a third direction is longer than a length of the first magnetic layer in the second direction, the third direction crosses a plane including the first direction and the second direction, the first region and the second region extend in the third direction, the fourth magnetic layer is separated from the second magnetic layer in the third direction, the fourth magnetic layer is separated from the third magnetic layer in the first direction, and magnetization of the second magnetic layer and magnetization of the fourth magnetic layer are variable.

8. The apparatus according to claim 7, wherein magnetization of the first magnetic layer and magnetization of the third magnetic layer are substantially fixed.

9. The apparatus according to claim 7, wherein a magnetization component of the first magnetic layer along the first direction is larger than a magnetization component of the first magnetic layer in the second direction, and a magnetization component of the third magnetic layer along the first direction is larger than a magnetization component of the third magnetic layer in the second direction.

10. The apparatus according to claim 7, wherein the second part of the first magnetic layer does not overlap the second magnetic layer in the second direction.

11. The apparatus according to claim 7, wherein the second part is in contact with the third magnetic layer.

* * * * *